(12) United States Patent
Silverbrook

(10) Patent No.: US 7,022,250 B2
(45) Date of Patent: *Apr. 4, 2006

(54) METHOD OF FABRICATING AN INK JET PRINTHEAD CHIP WITH DIFFERENTIAL EXPANSION ACTUATORS

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 24 days.

This patent is subject to a terminal disclaimer.

(21) Appl. No.: 10/882,773

(22) Filed: Jul. 2, 2004

(65) Prior Publication Data

US 2004/0252165 A1 Dec. 16, 2004

Related U.S. Application Data

(63) Continuation of application No. 10/693,948, filed on Oct. 28, 2003, now Pat. No. 6,776,476, which is a continuation of application No. 10/183,174, filed on Jun. 28, 2002, now Pat. No. 6,648,453, which is a continuation of application No. 09/112,767, filed on Jul. 10, 1998, now Pat. No. 6,416,167.

(30) Foreign Application Priority Data

Jul. 15, 1997 (AU) .................... PO7991
Mar. 25, 1998 (AU) .................... PO2592

(51) Int. Cl.
*G01D 15/00* (2006.01)
*G11B 5/127* (2006.01)

(52) U.S. Cl. ....................... 216/27
(58) Field of Classification Search .......... 216/27; 29/890.1; 438/21; 347/20, 44, 47, 54, 56, 347/67, 75, 77

See application file for complete search history.

(56) References Cited

U.S. PATENT DOCUMENTS

| 4,423,401 A | 12/1983 | Mueller |
| 4,553,393 A | 11/1985 | Ruoff |
| 4,672,398 A | 6/1987 | Kuwabara et al. |
| 4,737,802 A | 4/1988 | Mielke |
| 4,864,824 A | 9/1989 | Gabriel et al. |
| 5,029,805 A | 7/1991 | Albarda et al. |
| 5,255,016 A | 10/1993 | Usui et al. |

(Continued)

FOREIGN PATENT DOCUMENTS

DE    1 648 322    3/1971

(Continued)

OTHER PUBLICATIONS

Derwent Abstract Accession No. 2000-405730/35, JP 2000141656 A (Ricoh KK) May 23, 2000.

(Continued)

*Primary Examiner*—Parviz Hassanzadeh
*Assistant Examiner*—Roberts Culbert

(57) ABSTRACT

A method of fabricating an inkjet printhead chip includes the step of forming a layer of sacrificial material on a substrate, such that the layer is between three and ten microns thick. A first layer of thermal expansion material is formed on the sacrificial material. A heater circuit is formed on the first layer of thermal expansion material. The sacrificial material and the first layer of thermal expansion material are formed to permit the electrical circuit to make electrical contact with the drive circuitry. A second layer of the thermal expansion material is formed on the heater circuit. A suitable process is applied on the second layer of thermal expansion material to render a surface of the second layer hydrophilic. The sacrificial material is removed.

5 Claims, 42 Drawing Sheets

U.S. PATENT DOCUMENTS

| | | | |
|---|---|---|---|
| 5,258,774 A | 11/1993 | Rogers | |
| 5,666,141 A | 9/1997 | Matoba et al. | |
| 5,697,144 A | 12/1997 | Mitani et al. | |
| 5,719,604 A | 2/1998 | Inui et al. | |
| 5,812,159 A | 9/1998 | Anagnostopoulos et al. | |
| 5,828,394 A | 10/1998 | Khuri-Yakub et al. | |
| 5,838,351 A * | 11/1998 | Weber | 347/85 |
| 6,231,772 B1 * | 5/2001 | Silverbrook | 216/27 |
| 6,241,906 B1 * | 6/2001 | Silverbrook | 216/27 |
| 6,245,247 B1 * | 6/2001 | Silverbrook | 216/27 |
| 6,264,849 B1 * | 7/2001 | Silverbrook | 216/27 |
| 6,274,056 B1 * | 8/2001 | Silverbrook | 216/27 |
| 6,294,101 B1 * | 9/2001 | Silverbrook | 216/27 |
| 6,451,216 B1 * | 9/2002 | Silverbrook | 216/27 |

FOREIGN PATENT DOCUMENTS

| | | |
|---|---|---|
| DE | 29 05 063 | 8/1980 |
| DE | 32 45 283 | 6/1984 |
| DE | 34 30 155 | 2/1986 |
| DE | 37 16 996 | 12/1988 |
| DE | 39 34 280 | 4/1990 |
| DE | 43 28 433 | 3/1995 |
| DE | 195 16 997 | 11/1995 |
| DE | 195 17 969 | 11/1995 |
| DE | 195 32 913 | 3/1996 |
| DE | 196 23 620 A1 | 12/1996 |
| DE | 196 39 717 | 4/1997 |
| EP | 0 092 229 | 10/1983 |
| EP | 0 398 031 | 11/1990 |
| EP | 0 416 540 A2 | 3/1991 |
| EP | 0 427 291 | 5/1991 |
| EP | 0 431 338 | 6/1991 |
| EP | 0 478 956 | 4/1992 |
| EP | 0 506 232 | 9/1992 |
| EP | 0 510 648 | 10/1992 |
| EP | 0 627 314 | 12/1994 |
| EP | 0 634 273 | 1/1995 |
| EP | 0 713 774 A2 | 5/1996 |
| EP | 0 737 580 | 10/1996 |
| EP | 0 750 993 | 1/1997 |
| EP | 0 882 590 | 12/1998 |
| EP | 1 057 637 | 6/2000 |
| EP | 1 057 639 | 6/2000 |
| FR | 2 231 076 | 12/1974 |
| GB | 792 145 | 3/1958 |
| GB | 1 428 239 | 3/1976 |
| GB | 2 262 152 | 6/1993 |
| JP | 58 112747 | 7/1983 |
| JP | 58 116165 | 7/1983 |
| JP | 61 025849 | 2/1986 |
| JP | 61 268453 | 11/1986 |
| JP | 01 105746 | 4/1989 |
| JP | 01 115639 | 5/1989 |
| JP | 01 128839 | 5/1989 |
| JP | 01 257058 | 10/1989 |
| JP | 01 306254 | 12/1989 |
| JP | 02 050841 | 2/1990 |
| JP | 2 92643 | 4/1990 |
| JP | 2 108544 | 4/1990 |
| JP | 02 158348 | 6/1990 |
| JP | 02 162049 | 6/1990 |
| JP | 2 265752 | 10/1990 |
| JP | 03 653348 | 3/1991 |
| JP | 03 112662 | 5/1991 |
| JP | 03 180350 | 8/1991 |
| JP | 4 04001051 A | 1/1992 |
| JP | 04 118241 | 4/1992 |
| JP | 04 126255 | 4/1992 |
| JP | 04 141429 | 5/1992 |
| JP | 4 353458 | 12/1992 |
| JP | 04 368851 | 12/1992 |
| JP | 05 28765 | 10/1993 |
| JP | 05 318724 | 12/1993 |
| JP | 6 91865 | 4/1994 |
| JP | 6 91866 | 4/1994 |
| JP | 07 314665 | 12/1995 |
| WO | WO 94 18010 | 8/1994 |
| WO | WO 97 12689 | 4/1997 |
| WO | WO 00/48938 | 8/2000 |

OTHER PUBLICATIONS

Noworolski, J. Mark et al, "Process for in-plane and out-of-plane single-crystal-silicon thermal microactuators". Sensors and Actuators, A, CH, Elsevier Sequoia S.A., Lausanne, vol. 55, No. 1, Jul. 15, 1996, pp 65-69, XP004077979 ISSN:0924-4247.

Ataka, Manabu et al, "Fabrication and Operation of Polymide Bimorph Actuators for Ciliary Motion System". Journal of Microelectromechanical Systems, US, IEEE Inc. New York, vol. 2, No. 4, Dec. 1, 1993, pp 146-150, XP000443412, ISSN: 1057-7157.

Yamagata, Yutaka et al, " A Micro Mobile Mechanism Using Thermal Expansion and its Theoretical Analysis". Proceedeing of the workshop on micro electro mechanical systems (MEMS), US, New York, IEEE, vol. Workshop 7, Jan. 25, 1994, pp 142-147, XP000528408, ISBN: 0-7803-1834-X.

* cited by examiner

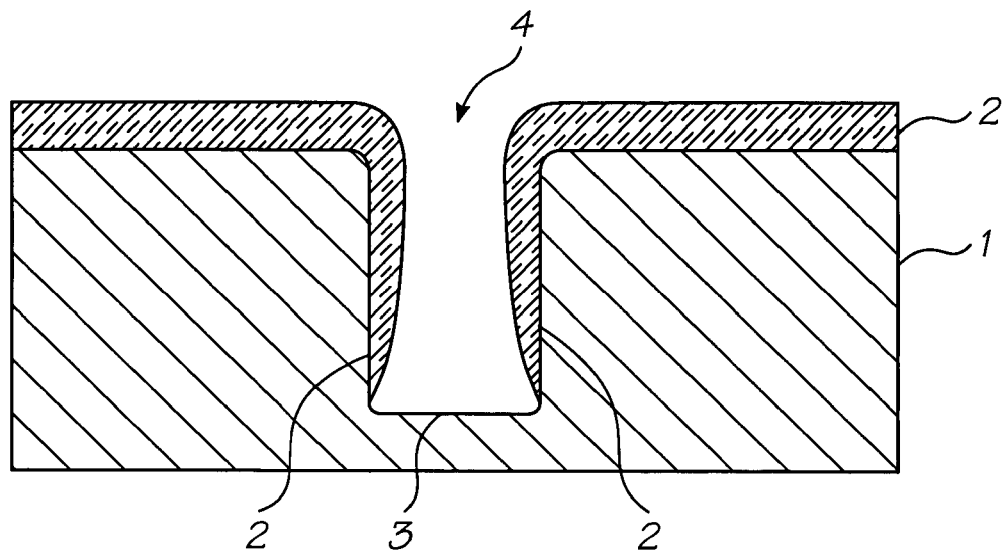
FIG. A
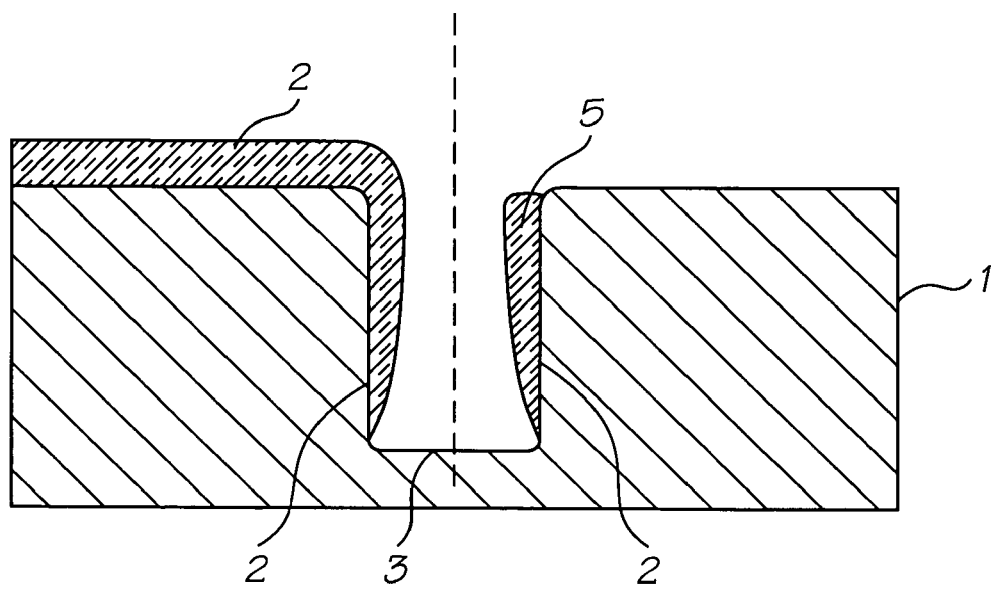
FIG. B

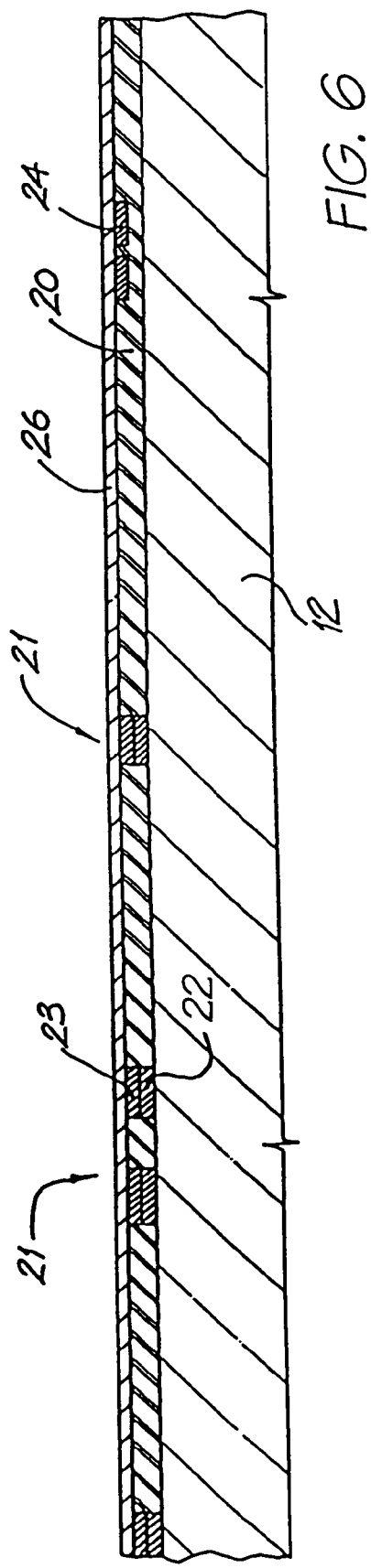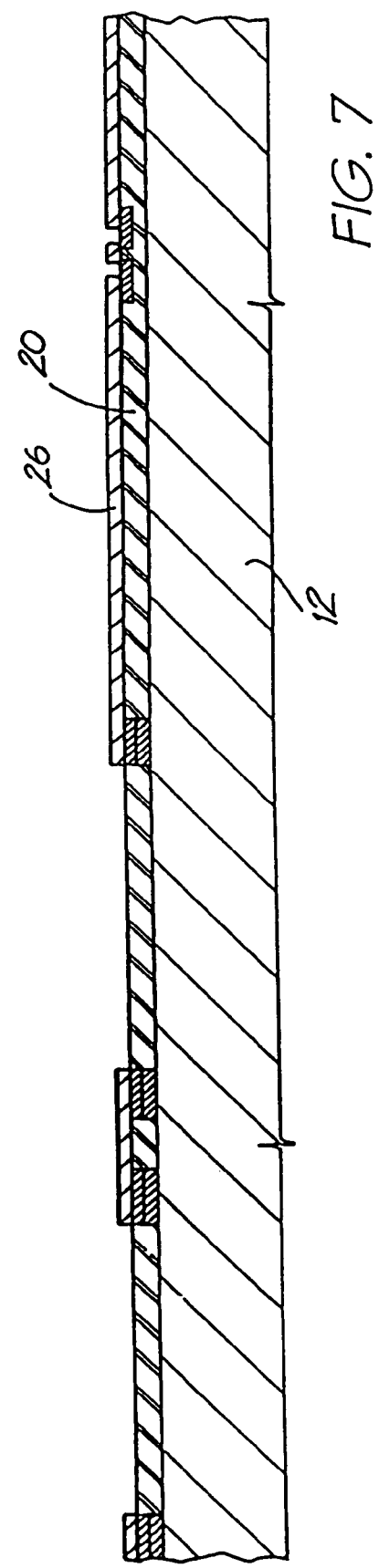

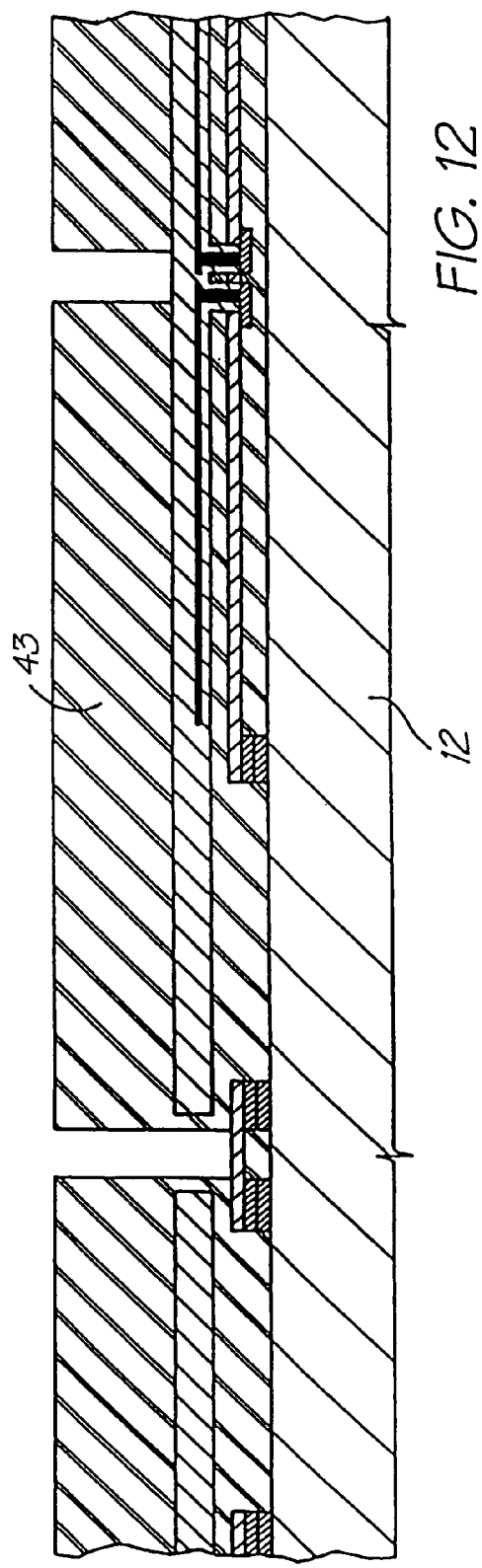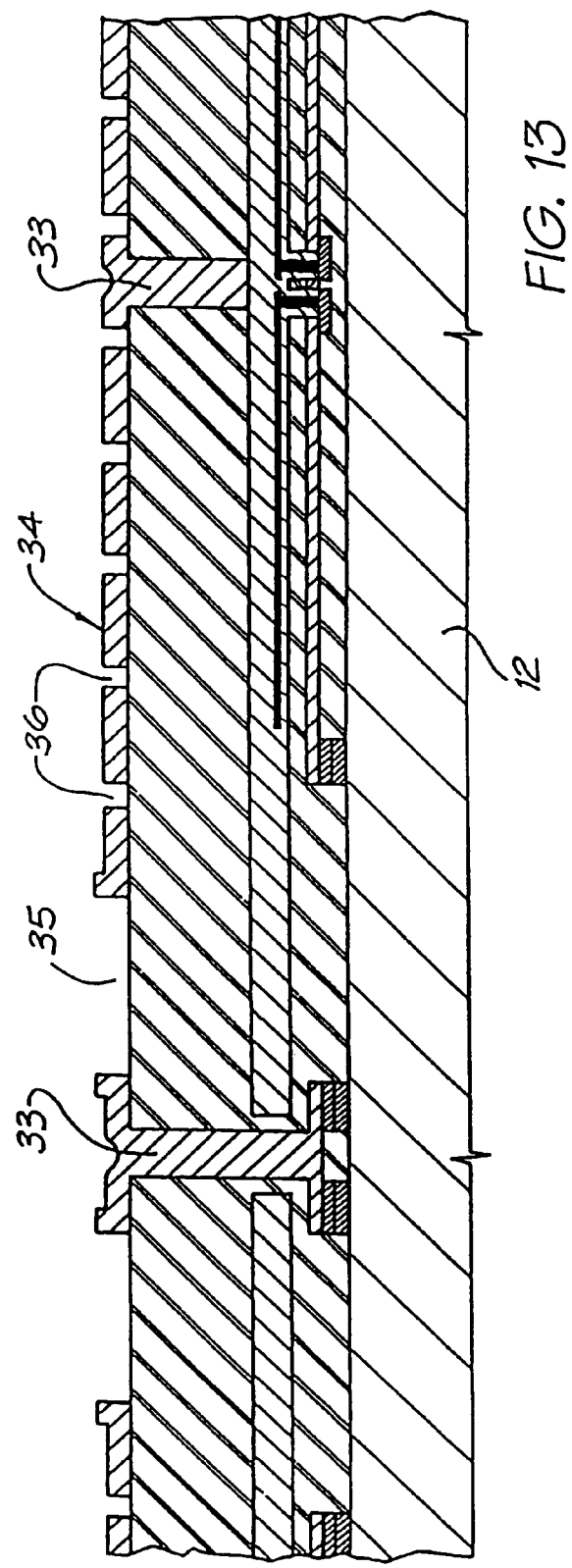

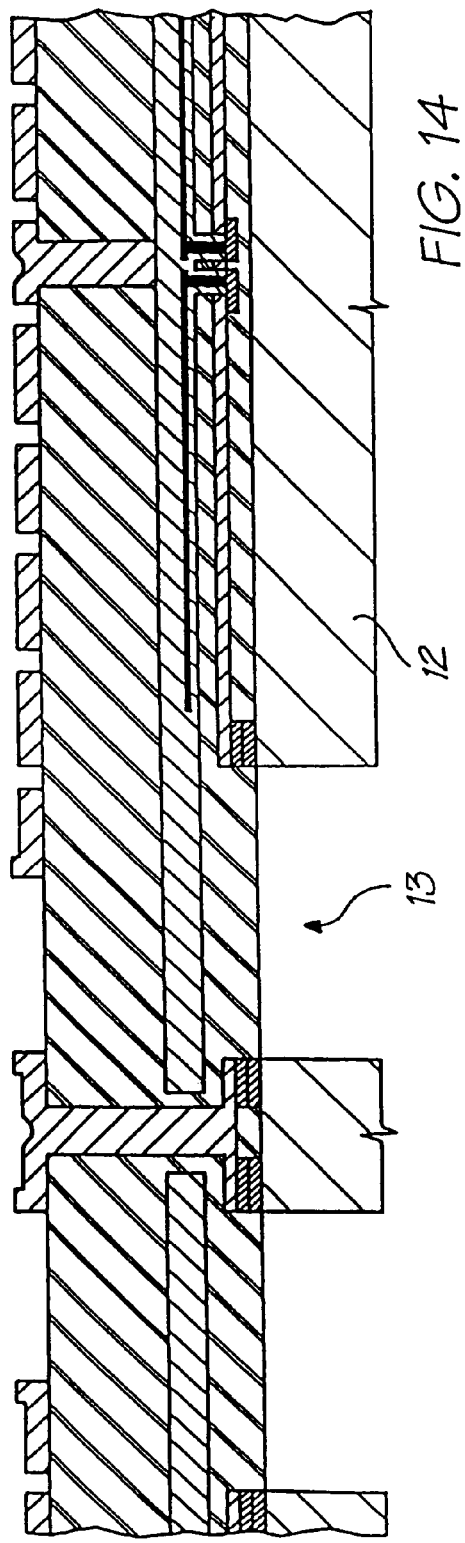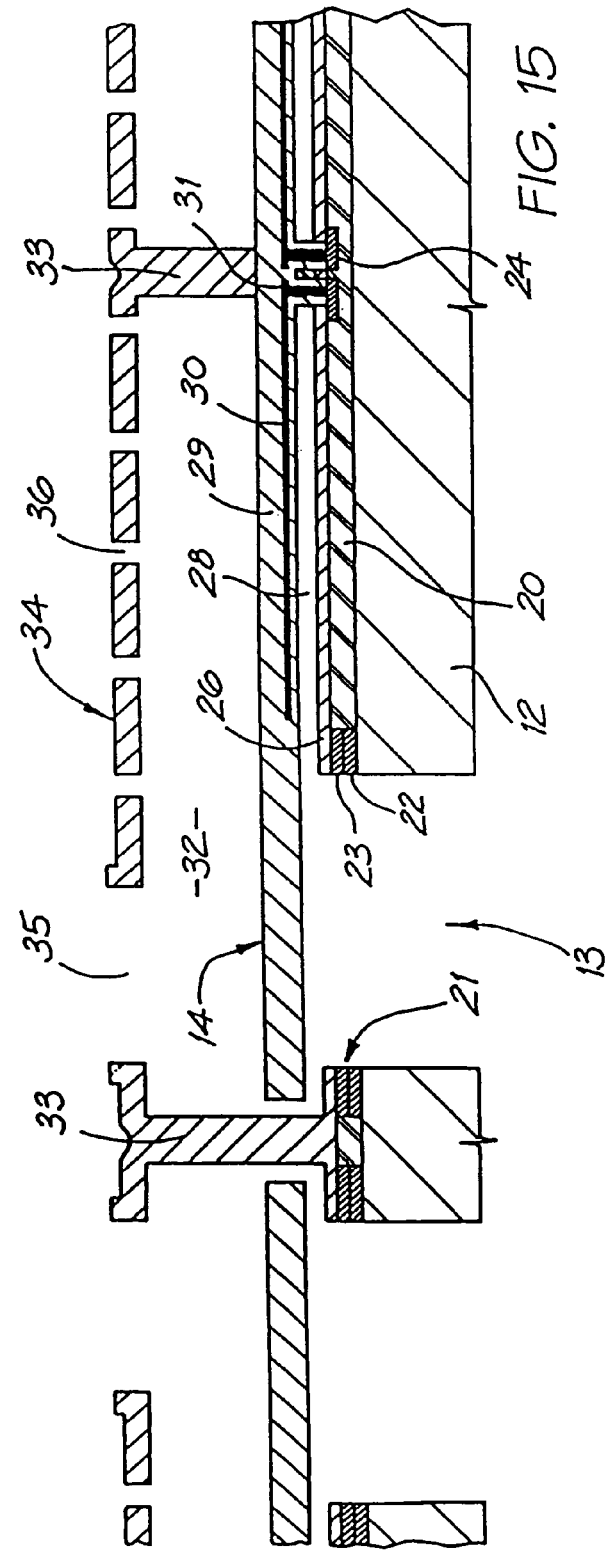

METHOD OF FABRICATING AN INK JET PRINTHEAD CHIP WITH DIFFERENTIAL EXPANSION ACTUATORS

CROSS REFERENCE TO RELATED APPLICATION

The present application is a Continuation of U.S. application Ser. No. 10/693,948 filed on Oct. 28, 2003, now issued as U.S. Pat. No. 6,776,476, which is a Continuation of U.S. application Ser. No. 10/183,174 filed on Jun. 28, 2002, now issued as U.S. Pat. No. 6,648,453, which is a Continuation of U.S. application Ser. No. 09/112,767 file on Jul. 10, 1998, now issued as U.S. Pat. No. 6,416,167, the entire contents of which are herein incorporated by reference.

FIELD OF THE INVENTION

The present invention relates to ink jet printing. In particular, the invention relates to an ink-jet printhead chip having a plurality of nozzle arrangements, each incorporating a substantially planar actuators and to a method of manufacturing such a printhead chip.

BACKGROUND OF THE INVENTION

Many different types of printing have been invented, a large number of which are presently in use. Known forms of printers have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles, has become increasingly popular primarily due to its inexpensive and versatile nature.

Many different techniques of ink jet printing have been invented. For a survey of the field, reference is made to an article by J Moore, "Non-Impact Printing: Introduction and Historical Perspective", Output Hard Copy Devices, Editors R Dubeck and S Sherr, pages 207–220 (1988).

Ink Jet printers themselves come in many different forms. The utilization of a continuous stream of ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous ink jet printing including the step wherein the ink jet stream is modulated by a high frequency electro-static field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal ink jet printing has become an extremely popular form of ink jet printing. The ink jet printing techniques include those disclosed by Endo et al in GB 2007162 (1979) and Vaught et al in U.S. Pat. No. 4,490,728. Both the aforementioned references disclose ink jet printing techniques that rely upon the activation of an electrothermal actuator which results in the creation of a bubble in a constricted space, such as a nozzle, which thereby causes the ejection of ink from an aperture connected to the confined space onto a relevant print media. Manufacturers such as Canon and Hewlett Packard manufacture printing devices utilizing the electro-thermal actuator.

As can be seen from the foregoing, many different types of printing technologies are available. Ideally, a printing technology should have a number of desirable attributes. These include inexpensive construction and operation, high-speed operation, safe and continuous long-term operation etc. Each technology may have its own advantages and disadvantages in the areas of cost, speed, quality, reliability, power usage, simplicity of construction operation, durability and consumables.

In the parent application, U.S. Pat. No. 6,416,167, there is disclosed a printing technology that is based on microelectromechanical systems (MEMS) devices. In particular there is disclosed a printing mechanism that incorporates a MEMS device. There is also disclosed a method of fabricating such a mechanism.

The fabrication of MEMS devices is based on integrated circuit fabrication techniques. Very generally, a sacrificial material is deposited on a wafer substrate. A functional layer is then deposited on the sacrificial material. The functional layer is patterned to form a MEMS component. The sacrificial layer is then removed to free the MEMS component.

Applicant has found that topography of a MEMS chip is very important. The components are required to move. It follows that the topography must be such that sufficient clearance is provided for movement of the components. This means that such features as nozzle chambers must be deep enough to provide for functional movement of an actuator positioned in the nozzle chamber.

There are, however, problems associated with deep topography. This problem is illustrated in FIGS. A and B of the drawings. In FIG. A there is shown a substrate 1 with a layer of sacrificial material 2 positioned on the substrate 1.

One problem is immediately apparent. It is extremely difficult to achieve a uniform deposition on side walls 2 and a floor 3 of the cavity 4. The fluid dynamics of the deposition process is the primary reason for this. As a result, a portion of the sacrificial material within the cavity 4 tends to taper in to the side walls 2.

Accurate etching of the sacrificial material relies on a high image focus on the layer 2. It will be appreciated that this focus could be lost in the cavity 4, due to the depth of the cavity 4. This results in poor etching within the cavity 4.

Etching is carried out using a device that etches in steps. These are usually 1 micron in depth. It follows that each stepping process removes 1 micron of sacrificial material at a time. As can be seen in FIG. B, once a required part of the layer 2 has been removed, a part is left behind in the cavity 4. This is called a stringer 5. It will be appreciated that the stringer 5 is difficult to remove and is therefore an undesirable result.

The Applicant has conceived the present invention to provide a printhead chip that incorporates MEMS components that are spaced a predetermined distance from a wafer substrate so that sufficient ink ejection can be achieved. The predetermined distance is such that the chip topography avoids the problems described above.

SUMMARY OF THE INVENTION

According to a first aspect of the invention, there is provided a method of fabricating a printhead chip for an inkjet printhead, the printhead chip including a wafer substrate that incorporates drive circuitry and defines a plurality of ink inlet channels, a plurality of nozzle arrangements positioned on the substrate, each nozzle arrangement including nozzle chamber walls that define a nozzle chamber and an ink ejection port in fluid communication with the nozzle chamber with an ink inlet channel opening into the nozzle chamber and an actuator that is positioned in the nozzle chamber, the actuator having an electrical circuit connected to the drive circuitry layer and positioned in thermal expansion material so that the expansion material experiences differential thermal expansion and contraction when the heating circuit receives an electrical signal from the drive circuitry layer and the actuator is displaced towards and away from the ink ejection port to eject a drop of ink from the nozzle chamber, the method comprising the steps of:

forming a layer of sacrificial material on the substrate, such that the layer is between three and ten microns thick;

forming a first layer of the thermal expansion material on the sacrificial material;

forming the heater circuit on the first layer of thermal expansion material, the sacrificial material and the first layer of thermal expansion material being formed to permit the electrical circuit to make electrical contact with the drive circuitry;

forming a second layer of the thermal expansion material on the heater circuit;

applying a suitable process on the second layer of thermal expansion material to render a surface of the second layer hydrophilic; and removing the sacrificial material.

The layer of sacrificial material may be formed to be between three and six microns thick.

The thermal expansion material and the heater circuit may be formed so that each actuator overlies a respective ink inlet opening.

The expansion material may be polytetrafluoroethylene (PTFE) and the method may include the step of plasma processing the surface of the second layer of PTFE to render said surface hydrophilic.

The method may include the steps of forming a further layer of sacrificial material on the second layer of PTFE, forming the nozzle chamber walls on the second layer of sacrificial material such that the nozzle chamber walls define the nozzle chamber and the ink ejection port in fluid communication with the nozzle chamber and removing the second layer of sacrificial material.

The method may include the step of forming the first and second layers of expansion material and the heater circuit such that the actuator is a laminated structure with the heater circuit sandwiched between the first and second layers of expansion material.

According to a second aspect of the invention, there is provided a printhead chip for an ink-jet printhead, the printhead chip comprising a wafer substrate that incorporates drive circuitry, the wafer substrate defining a plurality of ink inlet channels; and nozzle arrangements positioned on the wafer substrate, each nozzle arrangement comprising a passive nozzle chamber structure that extends from the wafer substrate and bounds a respective ink inlet channel;

a dynamic nozzle chamber structure that, together with the passive structure, defines a nozzle chamber, and has a roof that defines the ink ejection port, the dynamic structure being displaceable towards the wafer substrate into an actuated position and away from the wafer substrate into a rest position such that a drop of ink can be ejected from the ink ejection port, and an elongate micro-electromechanical actuator connected between the wafer substrate and the dynamic structure, the actuator including a beam assembly that has an active beam of a conductive material, capable of thermal expansion, that defines a heating circuit and is connected to the drive circuitry and a passive beam that is interposed between the active beam and the wafer substrate such that, when the active beam receives an electrical signal from the drive circuitry, the active beam expands relative to the passive beam driving the dynamic structure into the actuated position to generate the drop of ink and when the signal is cut off subsequent cooling of the active beam causes the dynamic structure to move back to the rest position, facilitating a separation of the drop of ink.

Each dynamic structure may include a skirt portion that depends from the roof inwardly of the passive structure, such that an edge of the skirt portion is proximate an edge of the passive structure in the rest position. The edges of the skirt portion and the passive structure may be configured so that, when the nozzle chamber is filled with ink, a meniscus is defined between the edges. The meniscus may define a fluidic seal as the active structure is displaced between the actuated and rest positions.

The edge of each skirt portion may be positioned between three and six microns above the wafer substrate, when the dynamic structure is in the rest position.

Each beam assembly may have an arm that interconnects the beams and the dynamic structure, so that displacement of the active and passive beams is transferred to the dynamic structure via the arm.

Each passive beam may be fixed, at one end, to the substrate, but insulated from the drive circuitry and fixed at an opposed end to the arm. Each active beam may be fixed, at one end, to the substrate to be electrically connected to the drive circuitry layer and also fixed at an opposed end to the arm.

Each passive beam and each passive structure may be of the same material.

According to a second aspect of the invention, there is provided an ink jet printhead chip that comprises a wafer substrate, a CMOS drive circuitry layer positioned on the wafer substrate, and a plurality of nozzle arrangements positioned on the wafer substrate and the CMOS drive circuitry layer, each nozzle arrangement comprising nozzle chamber walls and a roof wall that define a nozzle chamber and an ink ejection port defined in the roof wall, and a micro-electromechanical actuator connected to the CMOS drive circuitry layer and that has at least one movable member that is positioned to act on ink in the nozzle chamber to eject the ink from the ink ejection port on receipt of a signal from the drive circuitry layer, the, or each, movable member being spaced between 2 microns and 15 microns from the CMOS drive circuitry layer.

The at least one movable member of each nozzle arrangement may be spaced between 5 microns and 12 microns from the CMOS drive circuitry layer. More particularly, the at least one movable member of each nozzle arrangement may be spaced between 6 microns and 10 microns from the CMOS drive circuitry layer.

The nozzle chamber walls and roof walls of each nozzle arrangement may be configured so that the nozzle chambers are generally rectangular in plan and transverse cross section. Each movable member may be planar and rectangular to extend across a length of its respective nozzle chamber. A free end of the movable member may be positioned between the CMOS drive circuitry layer and the ink ejection port. An opposed end of the movable member may be anchored to the CMOS drive circuitry layer. The movable member may incorporate heating circuitry that is electrically connected to the CMOS drive circuitry layer. The movable member may be configured so that, when the heating circuitry receives a signal from the CMOS drive circuitry layer, the movable member is displaced towards the ink ejection port as a result of differential expansion and, when the signal is terminated, the movable member is displaced away from the ink ejection port as a result of differential contraction.

Instead, the movable member may include an actuator arm of a conductive material that is configured to define a heating circuit that is connected to the CMOS drive circuitry layer and is configured to deflect towards the wafer substrate as a result of differential expansion when an electrical signal is received from the CMOS drive circuitry layer. The roof wall of the nozzle chamber and at least part of the nozzle chamber walls may be connected to the actuator arm, so that, when the actuator arm is deflected towards the wafer substrate, ink is ejected from the ink ejection port defined in the roof wall.

The invention extends to an ink jet printhead chip that includes a plurality of printhead chips as described above.

According to a third aspect of the invention, there is provided a method of fabricating an ink jet printhead chip having a wafer substrate, a CMOS drive circuitry layer positioned on the wafer substrate and a plurality of nozzle arrangements positioned on the wafer substrate and the CMOS drive circuitry layer, each nozzle arrangement having nozzle chamber walls and a roof wall that define a nozzle chamber and an ink ejection port in the roof wall and a micro-electromechanical actuator connected to the CMOS drive circuitry layer the actuator having at least one movable member that is positioned to act on ink in the nozzle chamber to eject the ink from the ink ejection port on receipt of a signal from the drive circuitry layer, the method comprising the steps of:

depositing between 2 microns and 15 microns of a first sacrificial material on the CMOS drive circuitry layer to define a deposition area for a layer of actuator material, depositing said layer of actuator material on said deposition area, etching the layer of actuator material to form at least part of each micro-electromechanical actuator, and forming the nozzle chamber walls and roof wall by at least one of a deposition and an etching process.

The method may include the step of depositing between 5 microns and 12 microns of the first sacrificial material on the CMOS drive circuitry layer. In particular, the method may include the step of depositing between 6 and 10 microns of the first sacrificial material on the CMOS drive circuitry layer.

The step of forming the nozzle chamber walls and roof wall of each nozzle arrangement may include the steps of:

depositing a second sacrificial material on the layer of actuator material to define a deposit area for at least part of the nozzle chamber walls and the roof wall, depositing a structural material on the deposit area, and etching the structural material to form the at least part of the nozzle chamber walls and the roof wall.

BRIEF DESCRIPTION OF THE DRAWINGS

Notwithstanding any other forms, which may fall within the scope of the present invention, preferred forms of the invention will now be described, by way of example only, with reference to the accompanying drawings in which:

FIG. A is a schematic diagram indicating problems associated with deep topography in a printhead chip, as set out in the background of the invention.

FIG. B is a schematic diagram indicating problems associated with deep topography in a printhead chip, as set out in the background of the invention.

Figure 1:
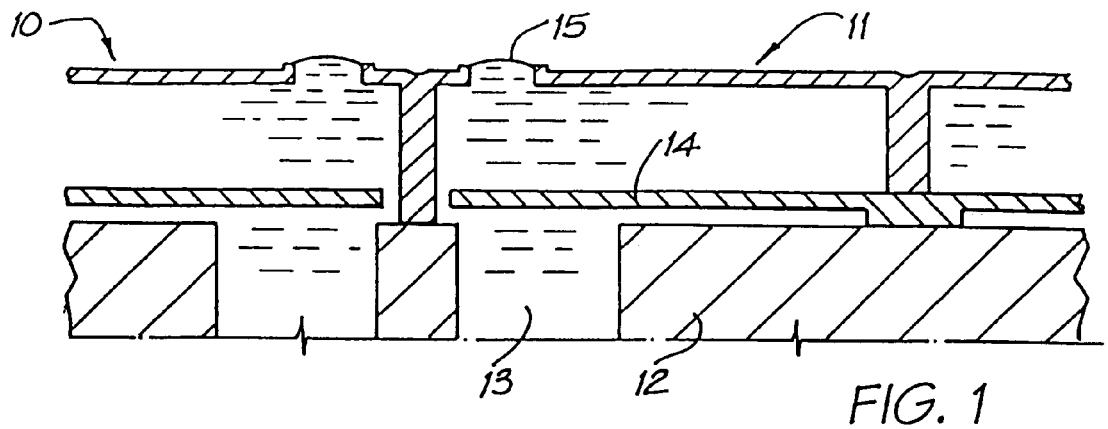
Figure 2:
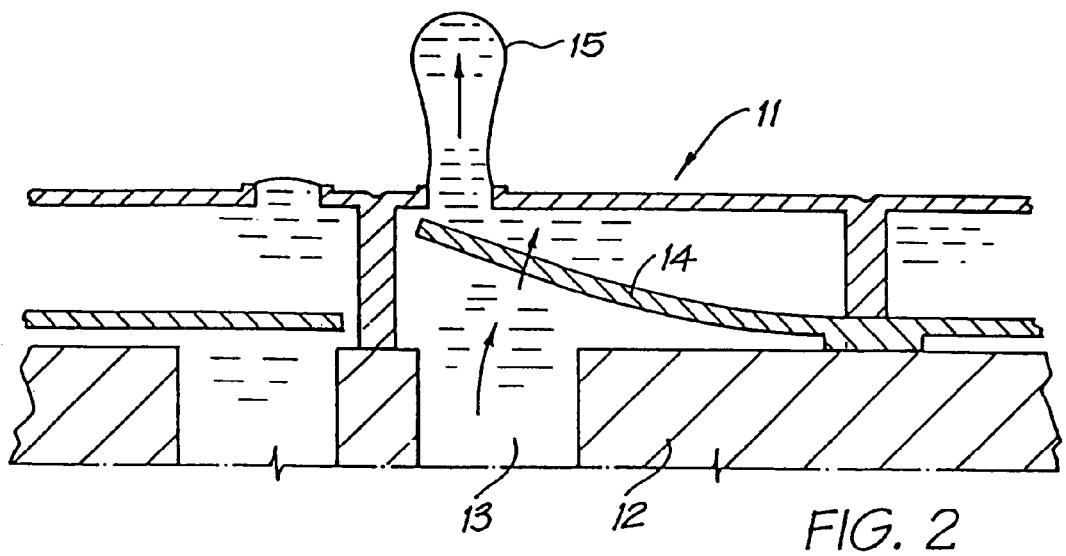
Figure 3:
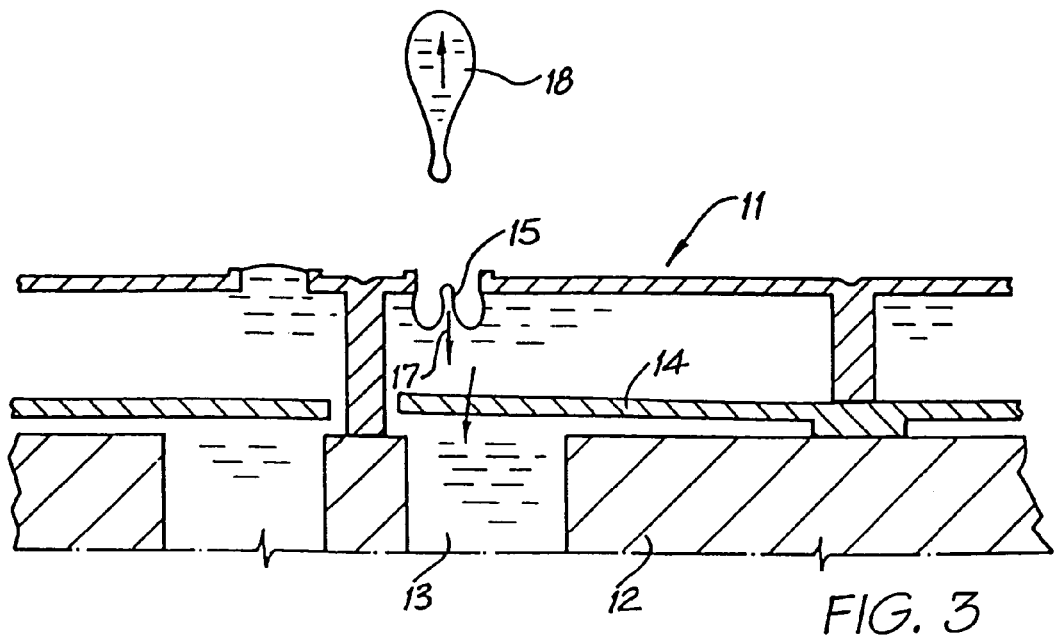

FIGS. 1–3 illustrate basic operation of the preferred embodiments of nozzle arrangements of a printhead chip of the invention.

Figure 4:
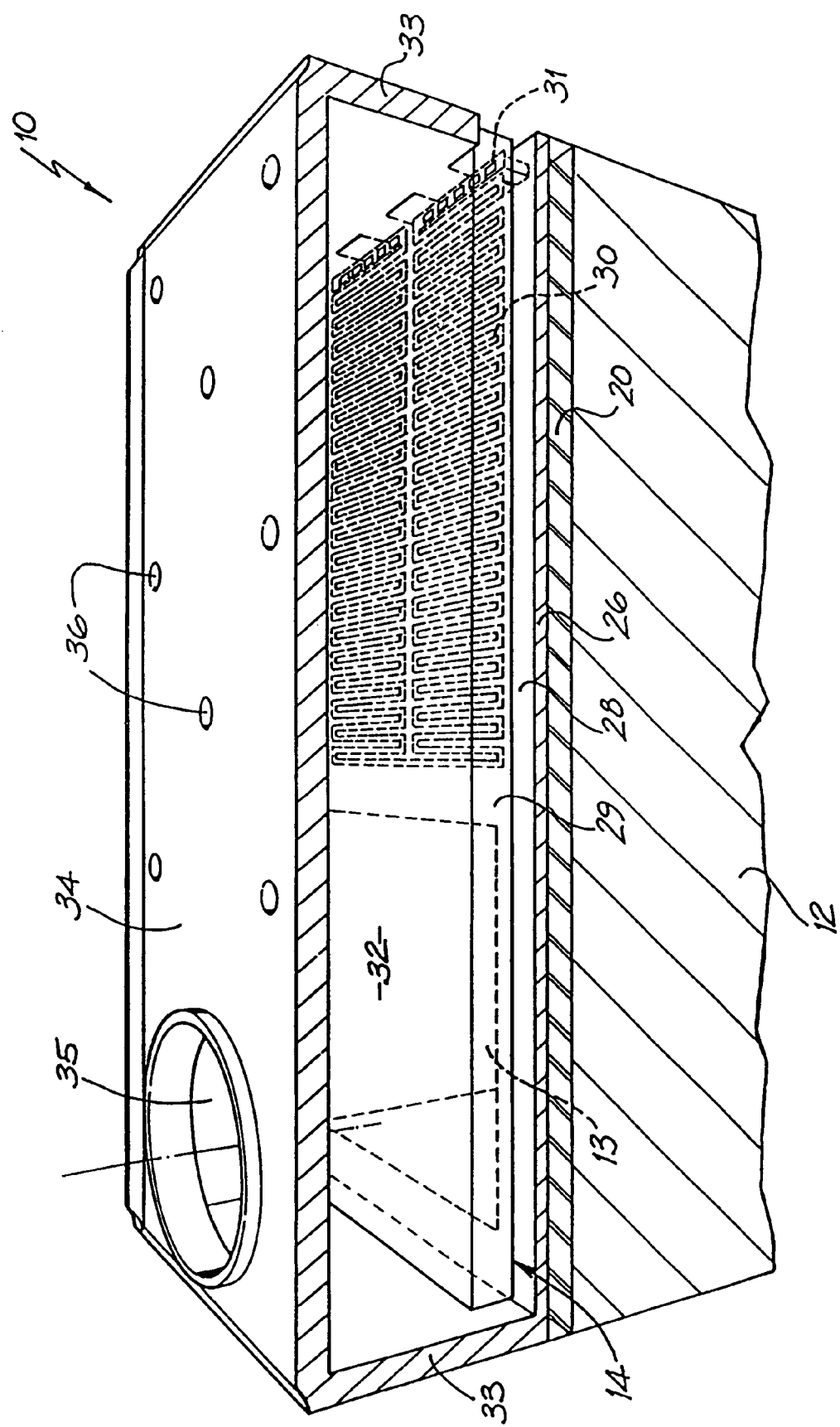

FIG. 4 is a sectional view of one embodiment of a nozzle arrangement of a printhead chip of the invention.

Figure 5:
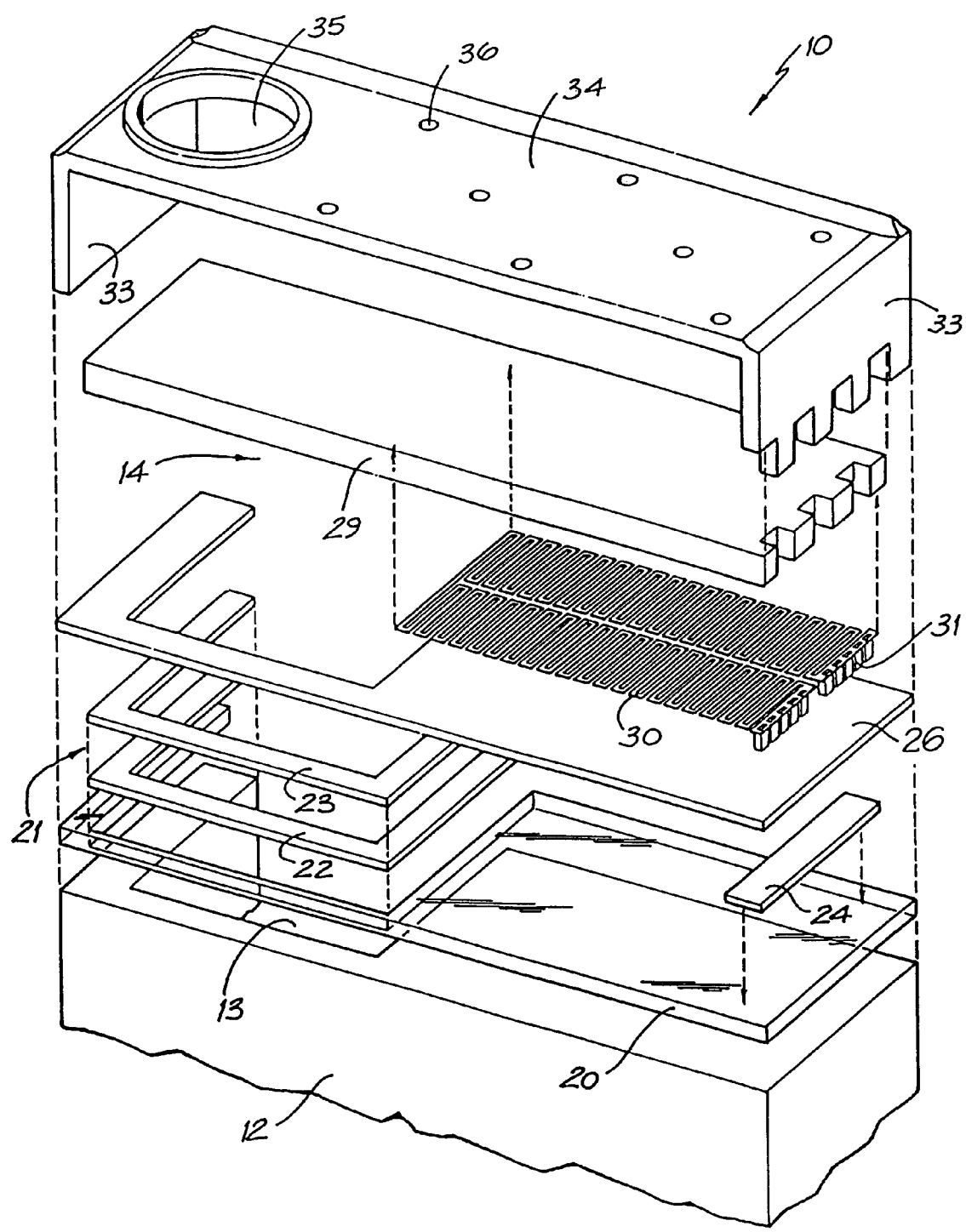

FIG. 5 is an exploded perspective view of the nozzle arrangement of FIG. 4.

FIGS. 6–15 are cross-sectional views of the printhead chip of the invention illustrating successive steps in the fabrication of the printhead chip according to a method of the invention.

Figure 16:
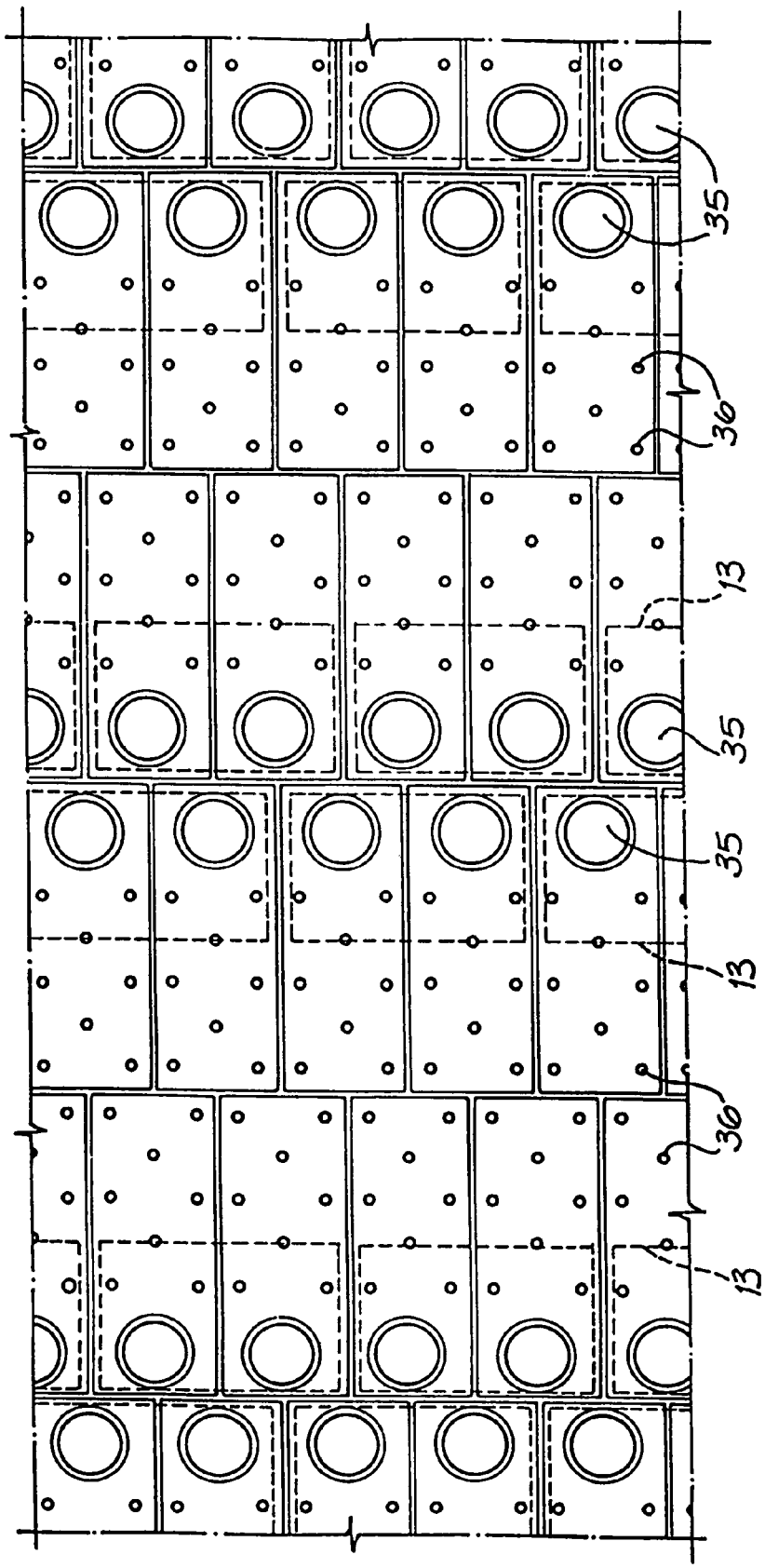

FIG. 16 illustrates a top view of the printhead chip of the invention.

Figure 17:
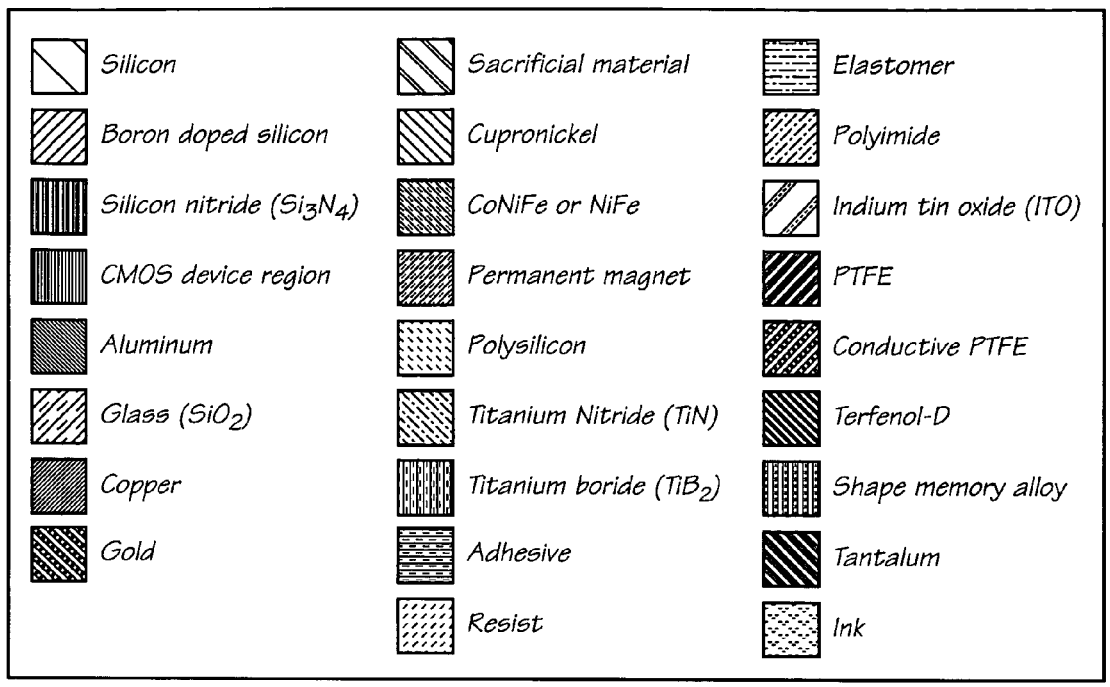

FIG. 17 is a legend of the materials used in a method of the invention described with reference to FIGS. 18 to 29.

FIG. 18 to FIG. 29 illustrate sectional views of the manufacturing steps in one form of construction of an ink jet printhead having nozzle arrangements of the invention.

Figure 30:
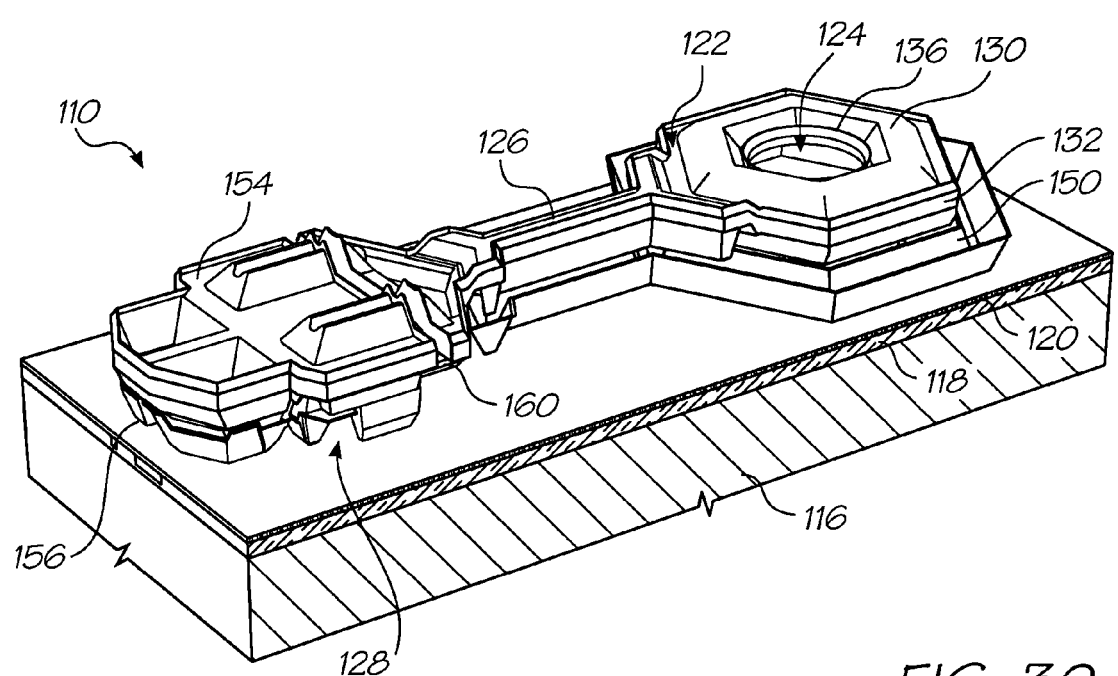

FIG. 30 shows a three dimensional, schematic view of a nozzle arrangement for an ink jet printhead in accordance with another embodiment of the invention.

Figure 31:
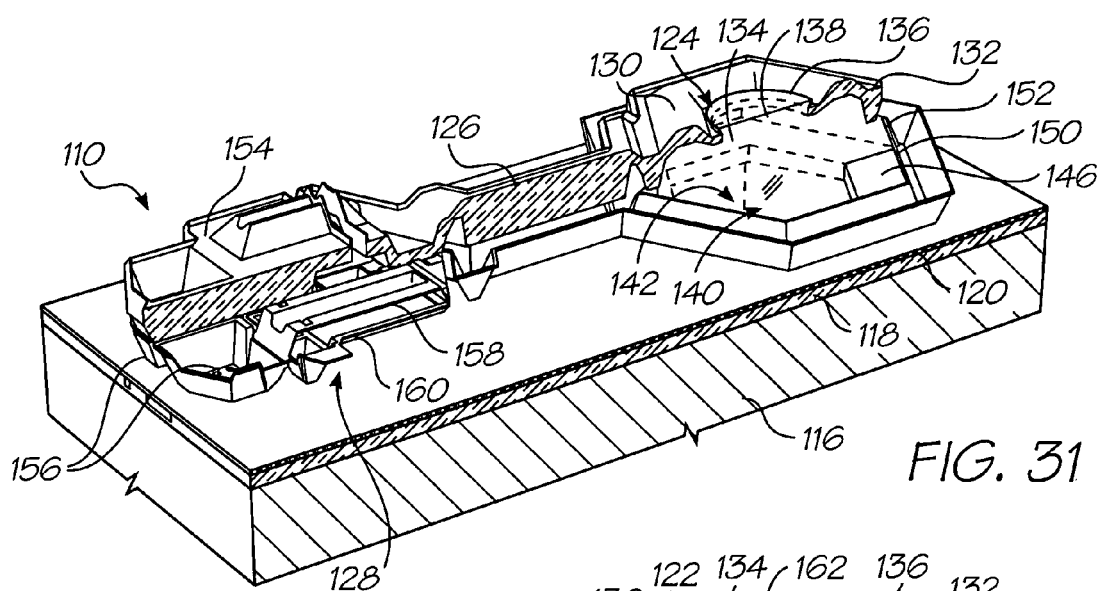
Figure 32:
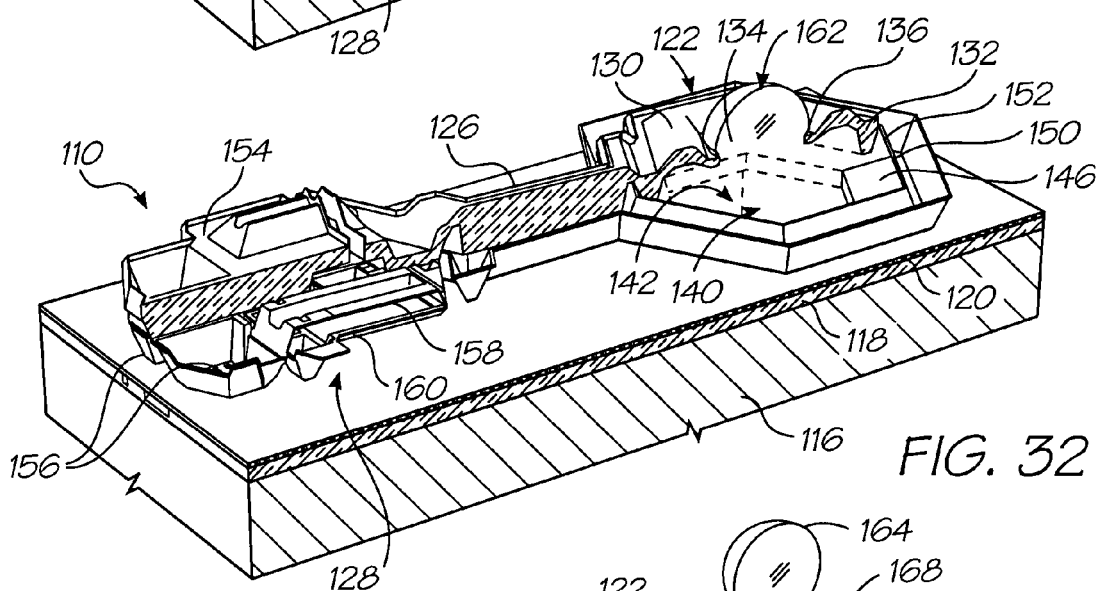
Figure 33:
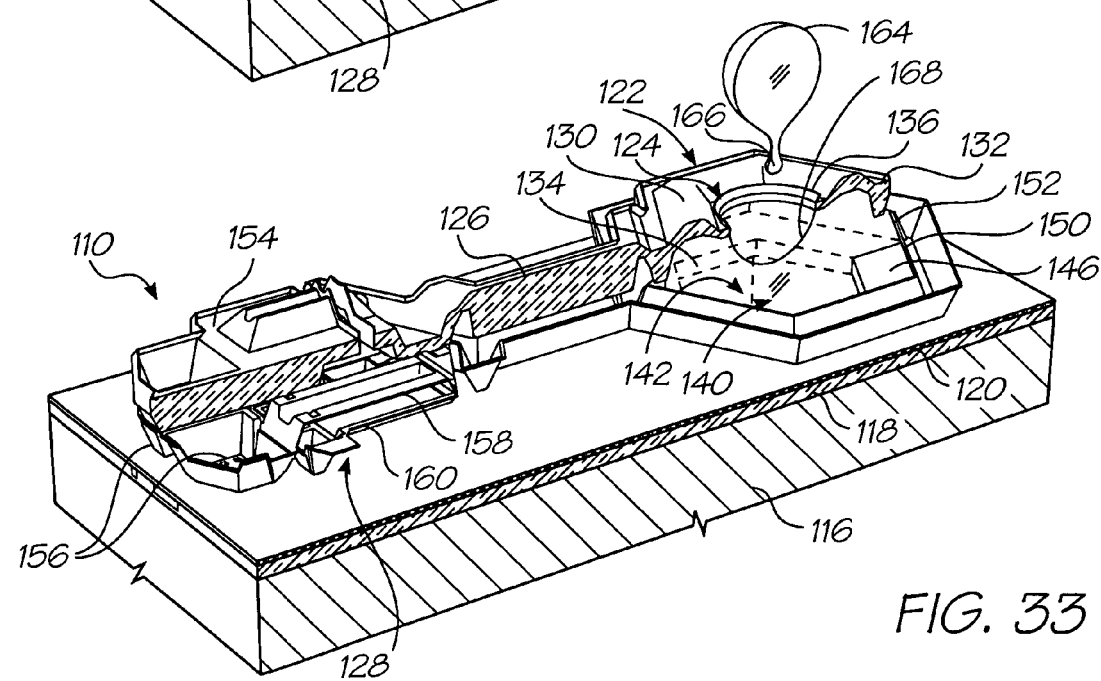

FIGS. 31 to 33 show a three dimensional, schematic illustration of an operation of the nozzle arrangement of FIG. 30.

Figure 34:
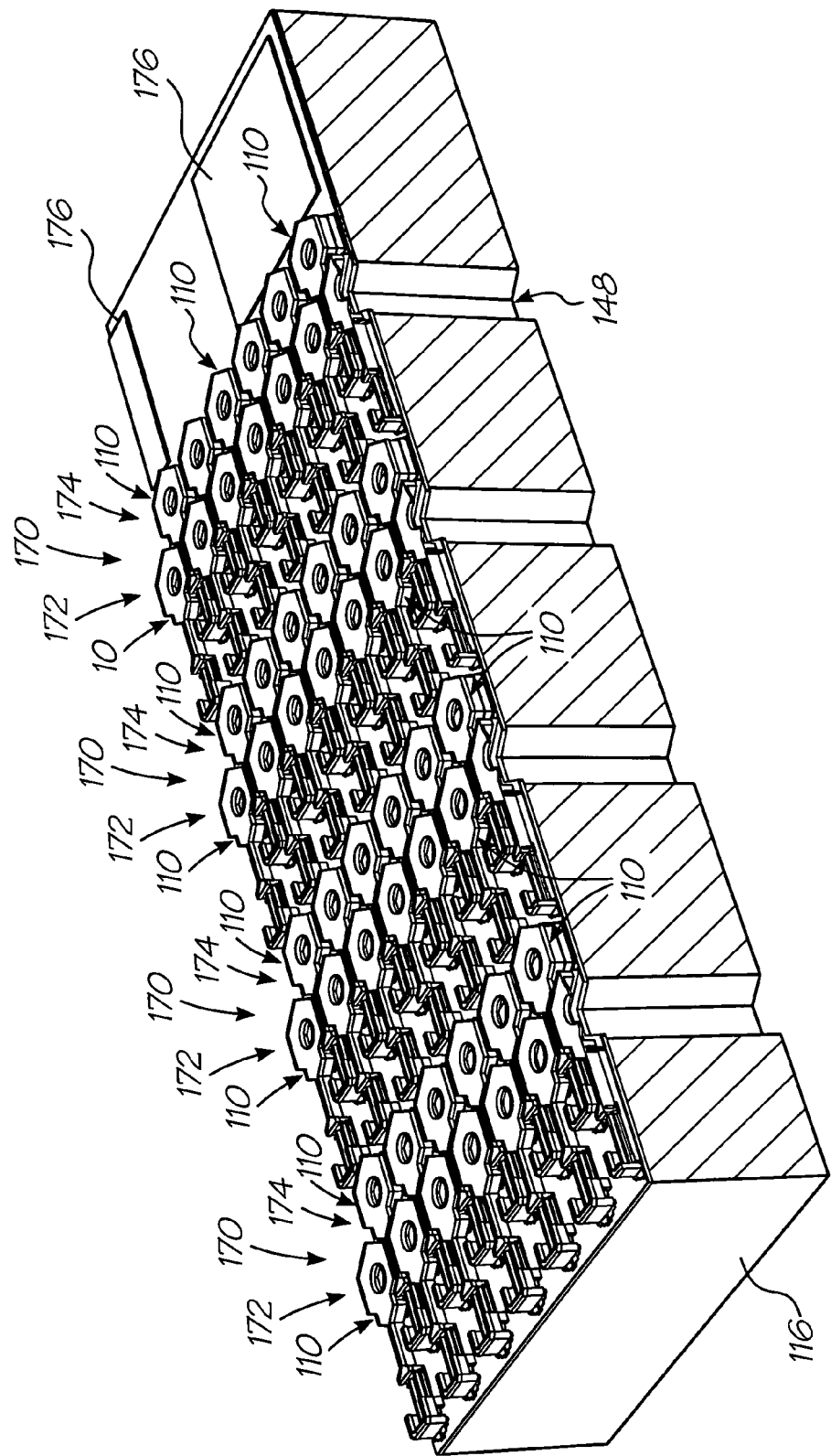

FIG. 34 shows a three dimensional view of another ink jet printhead chip according to the invention.

Figure 35:
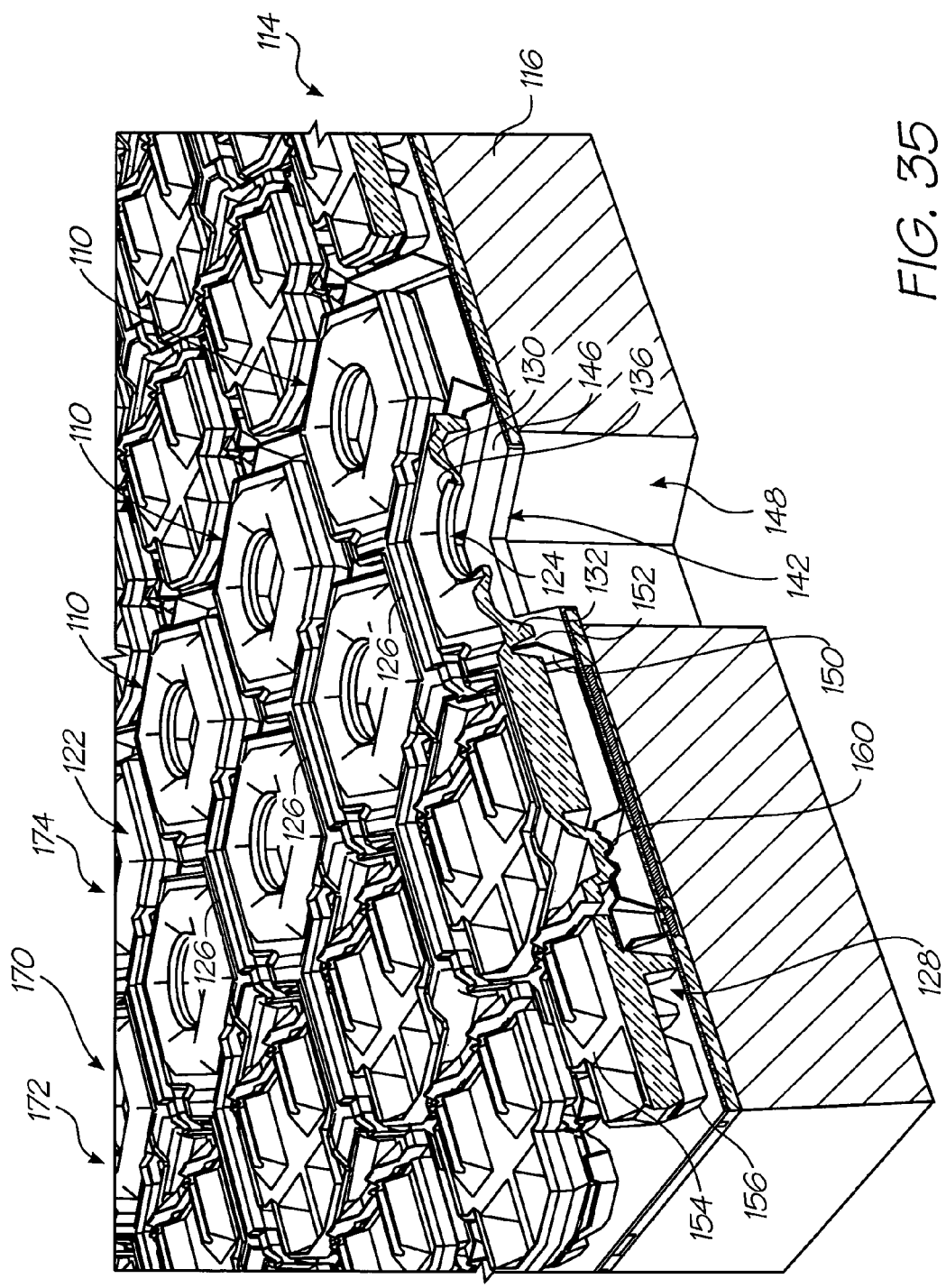

FIG. 35 shows, on an enlarged scale, part of the ink jet printhead chip of FIG. 34.

Figure 36:
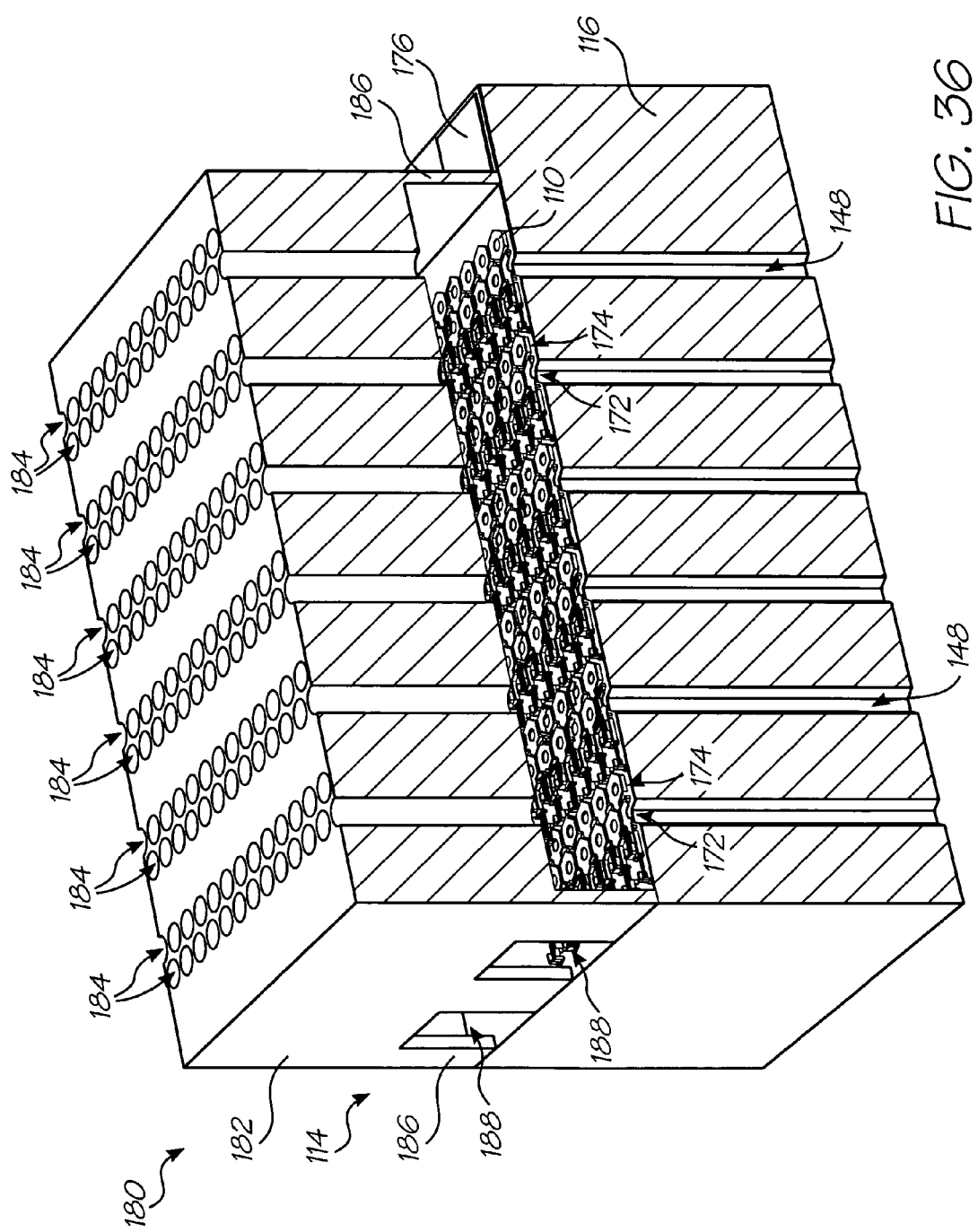

FIG. 36 shows a three dimensional view of the ink jet printhead chip with a nozzle guard.

Figure 37A:
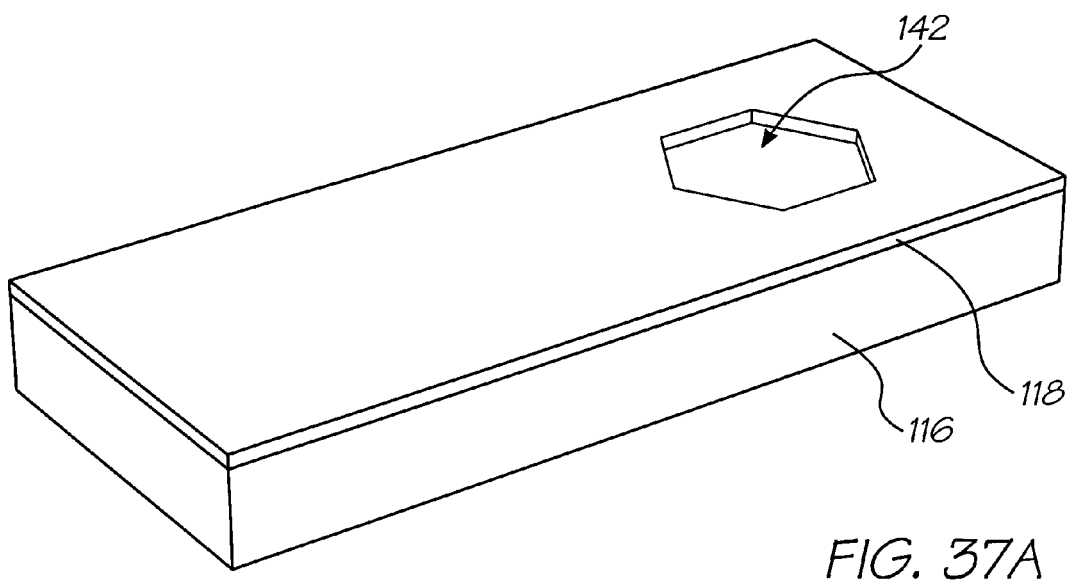
Figure 37B:
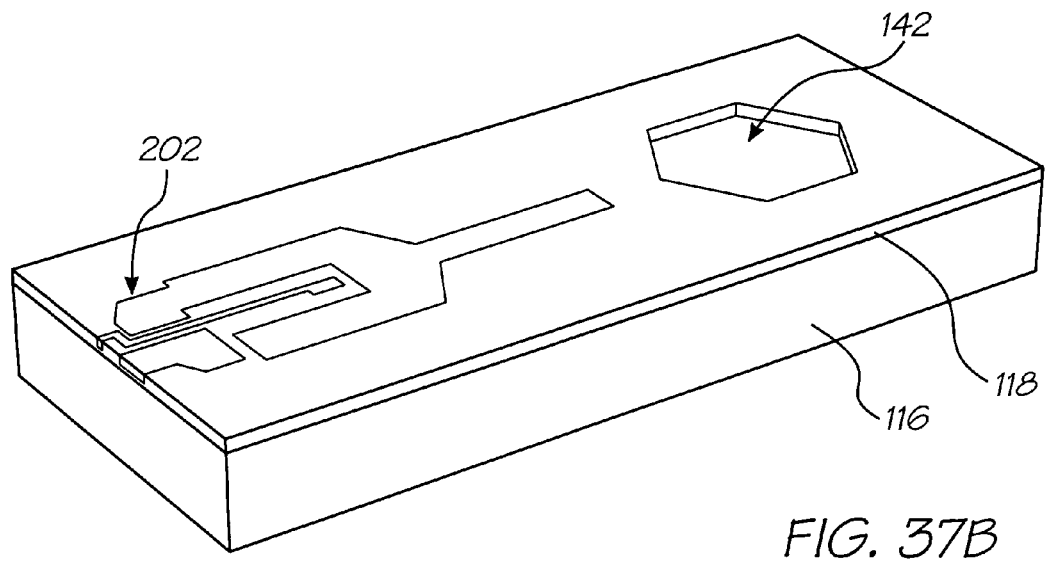
Figure 38B:
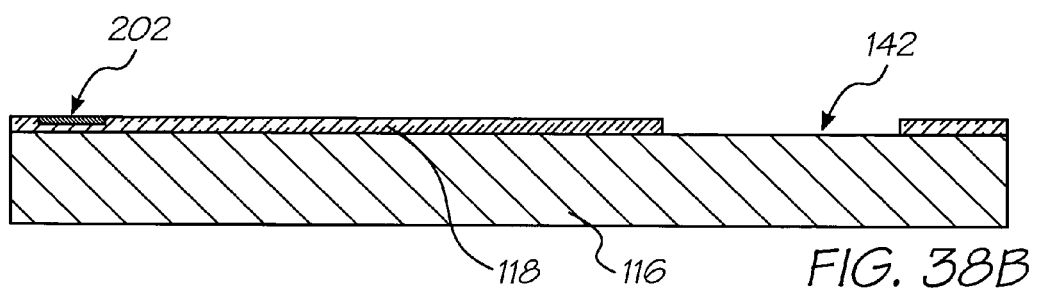
Figure 39B:
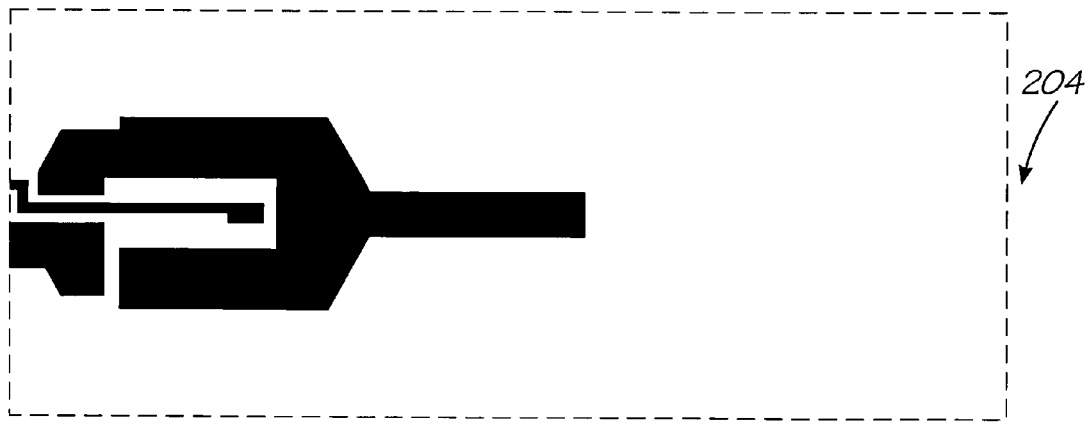
Figure 37C:
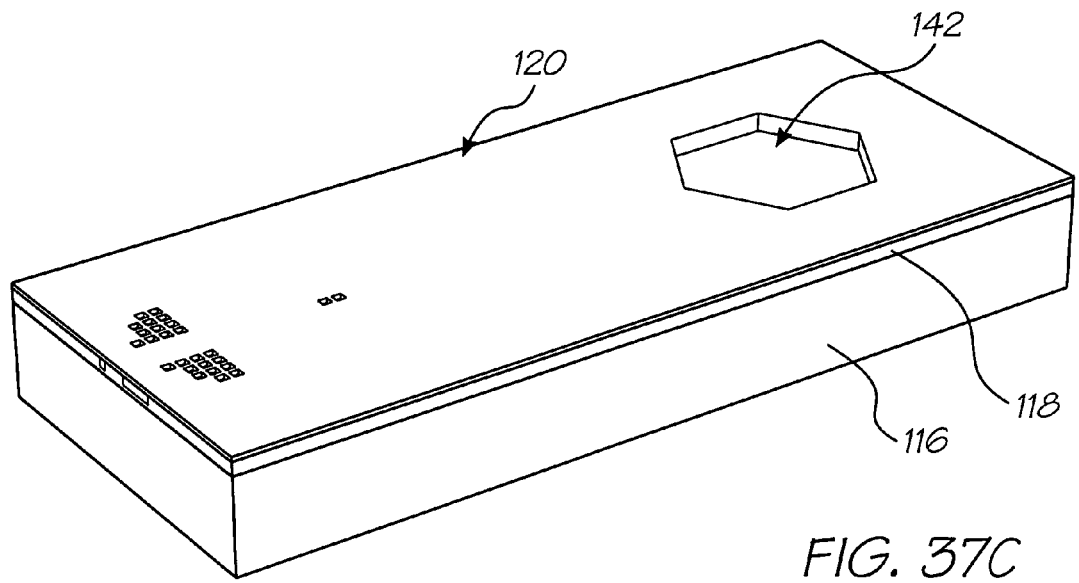
Figure 38C:
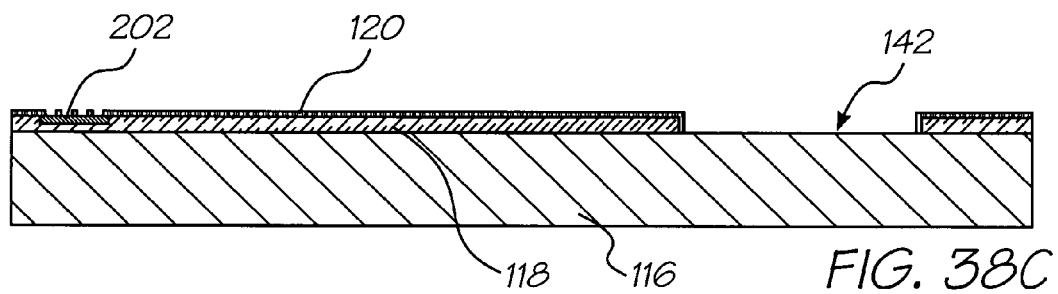
Figure 39C:
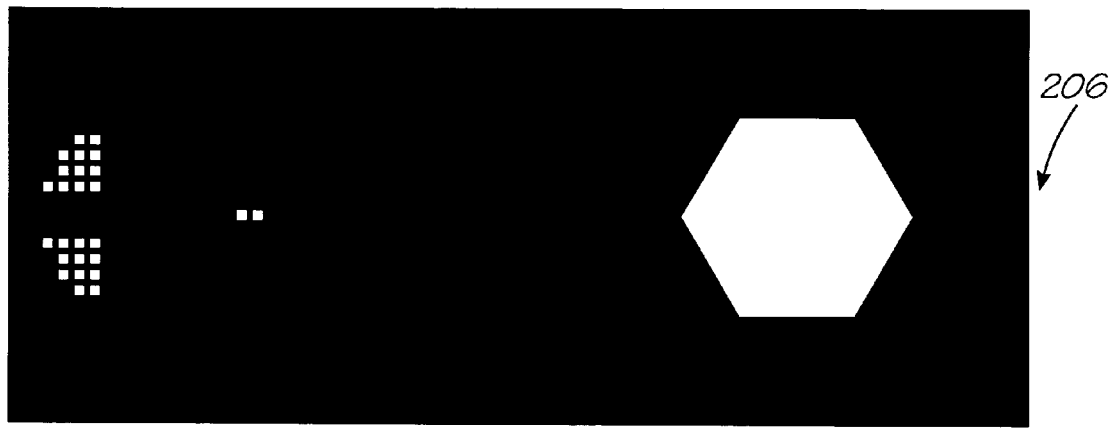
Figure 37D:
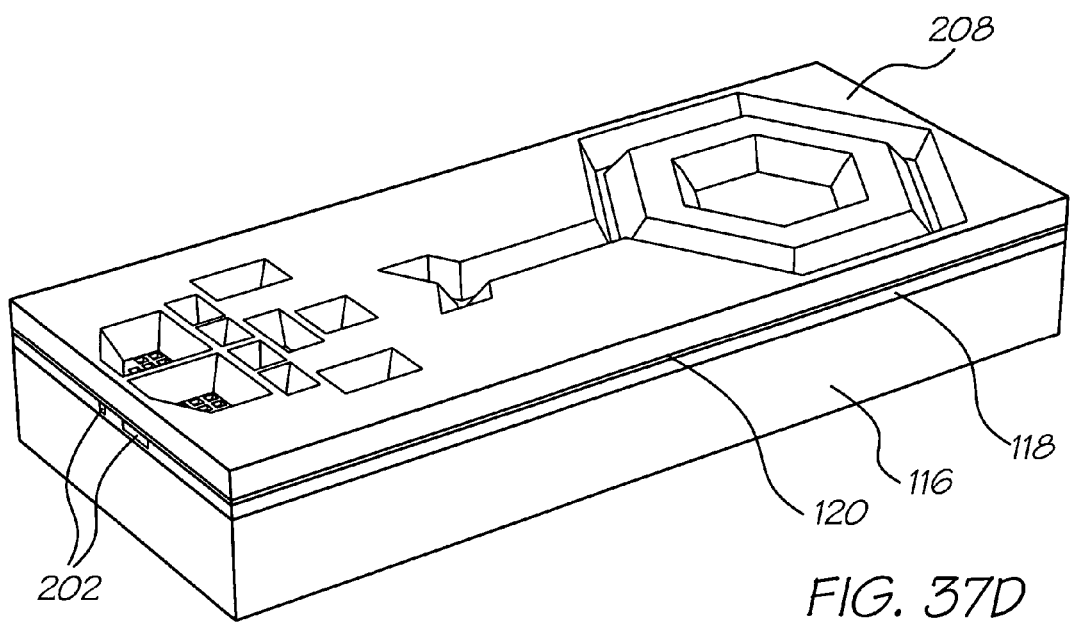
Figure 38D:
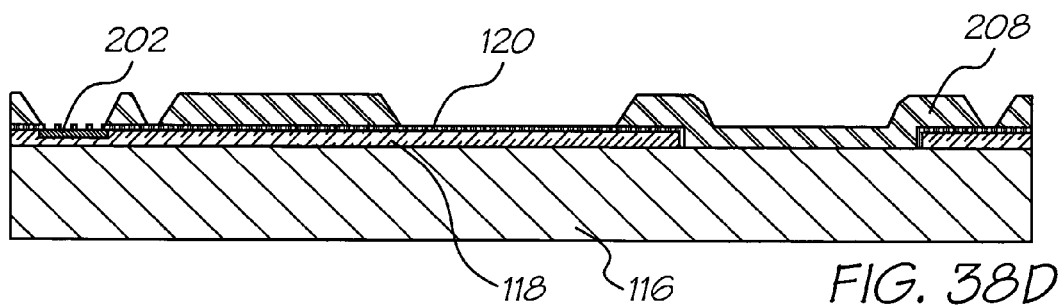
Figure 39D:
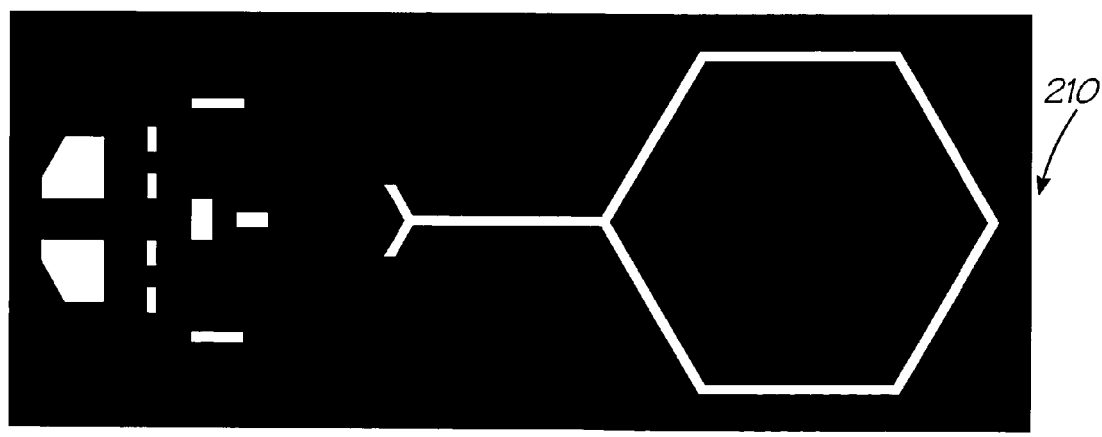
Figure 37E:
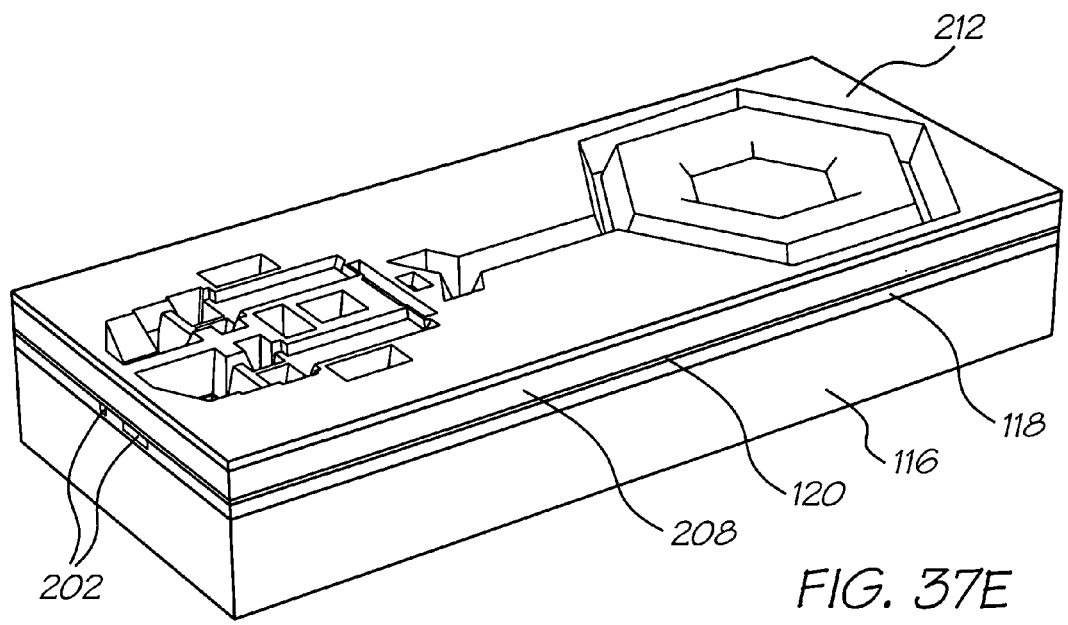
Figure 38E:
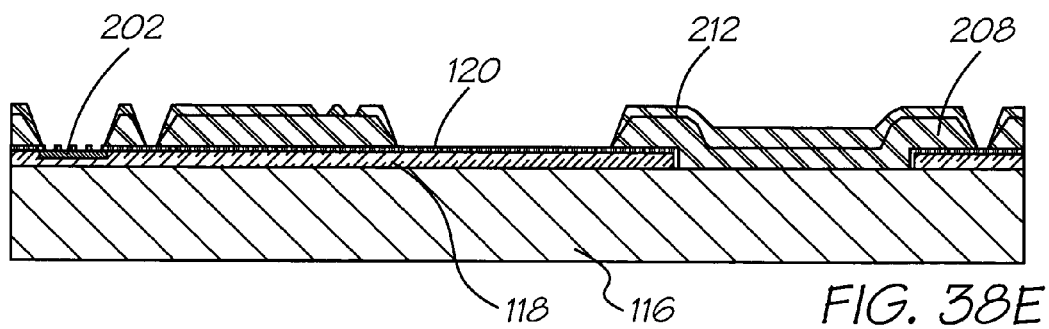
Figure 39E:
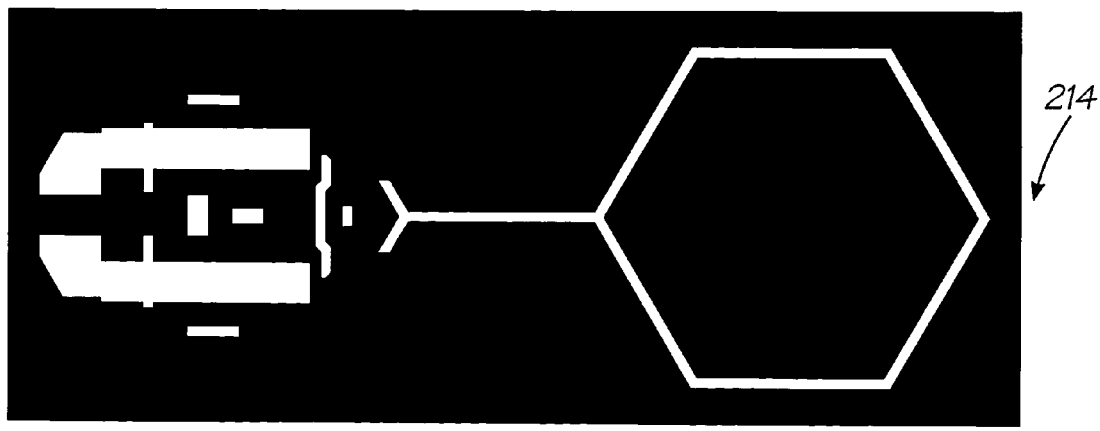
Figure 37F:
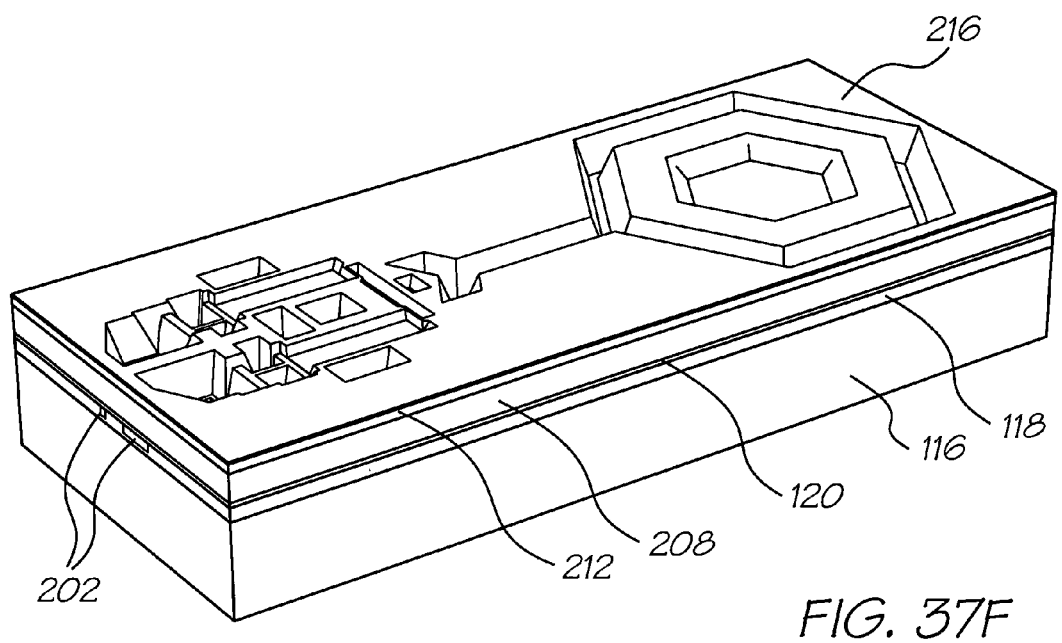
Figure 38F:
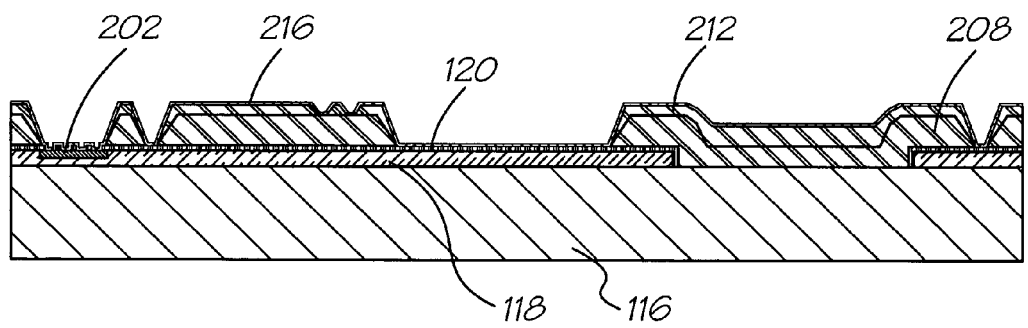
Figure 37G:
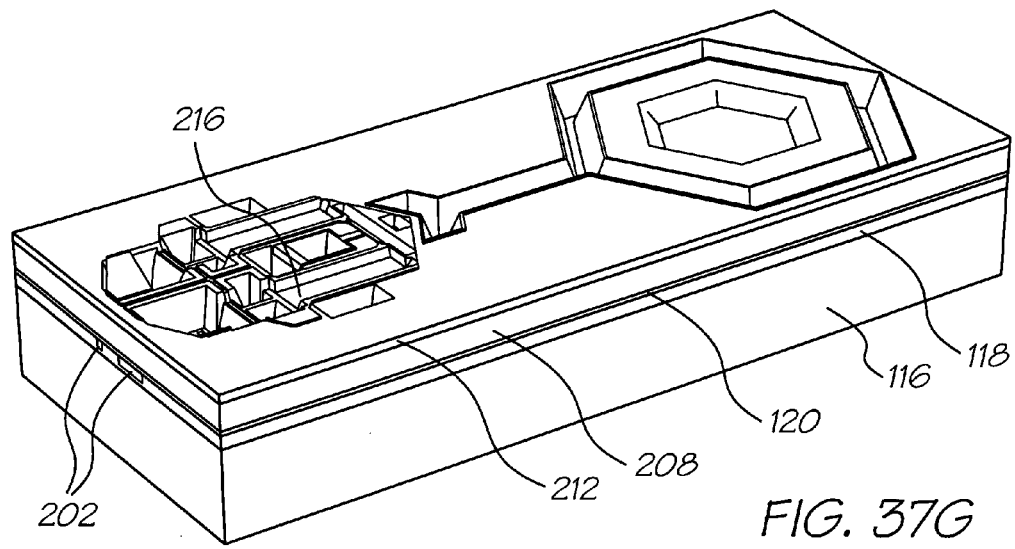
Figure 38G:
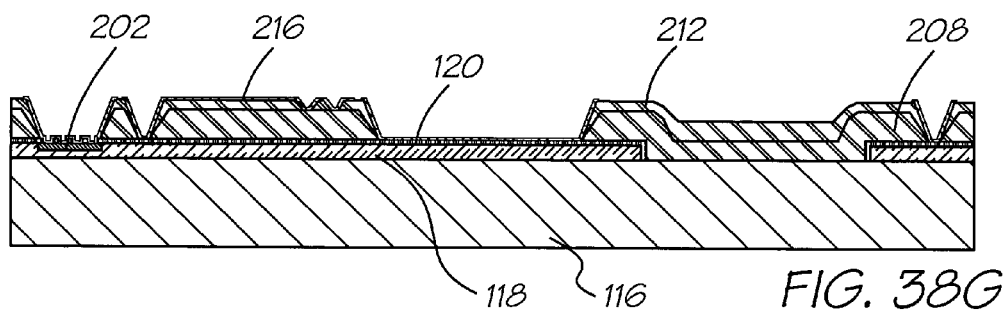
Figure 39F:
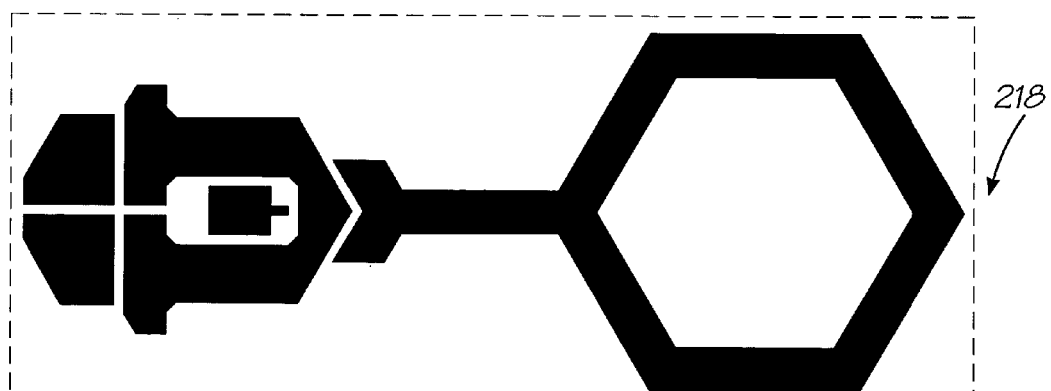
Figure 37H:
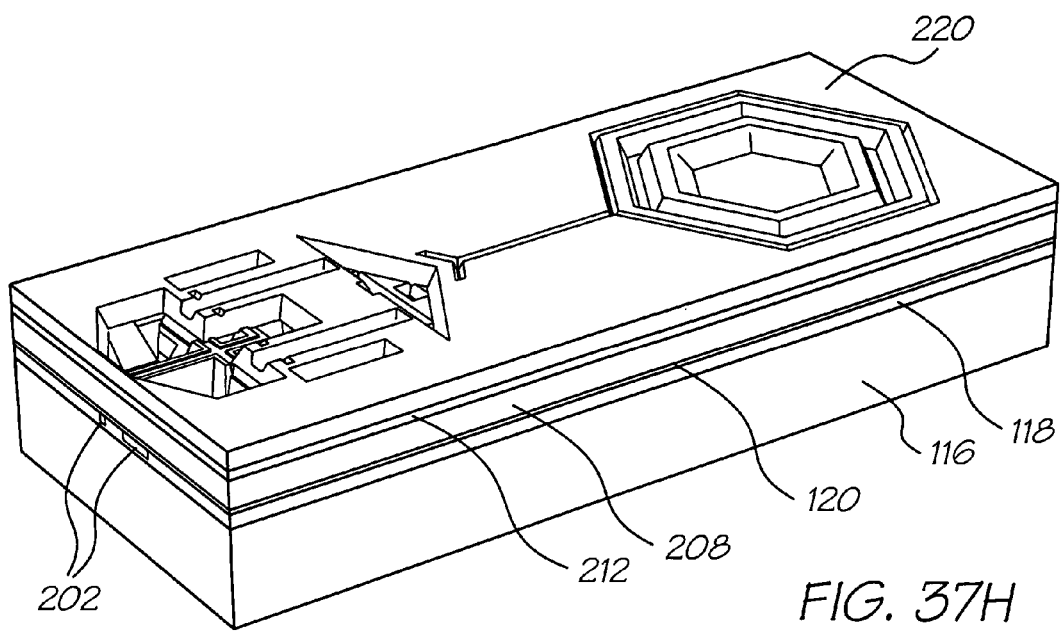
Figure 38H:
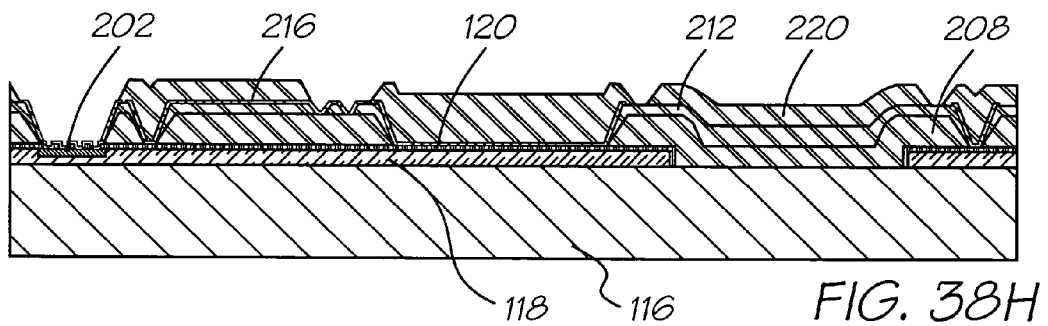
Figure 39G:
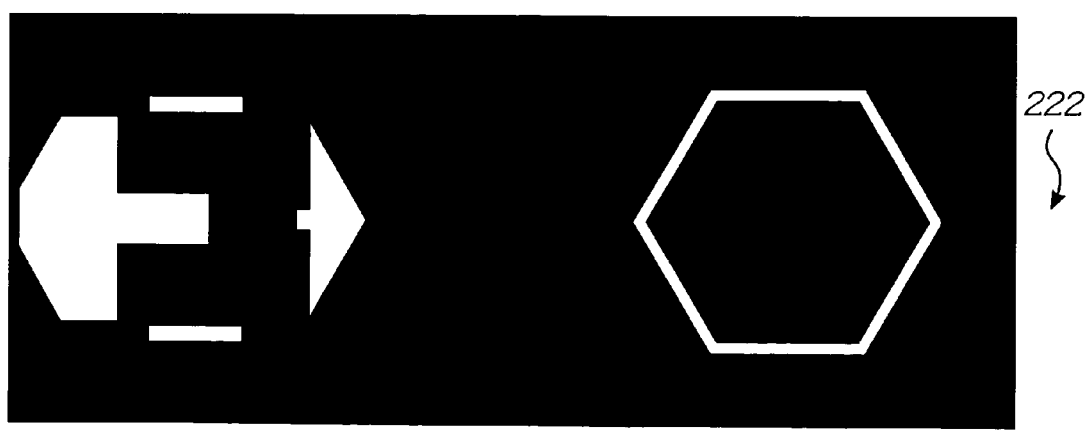
Figure 37I:
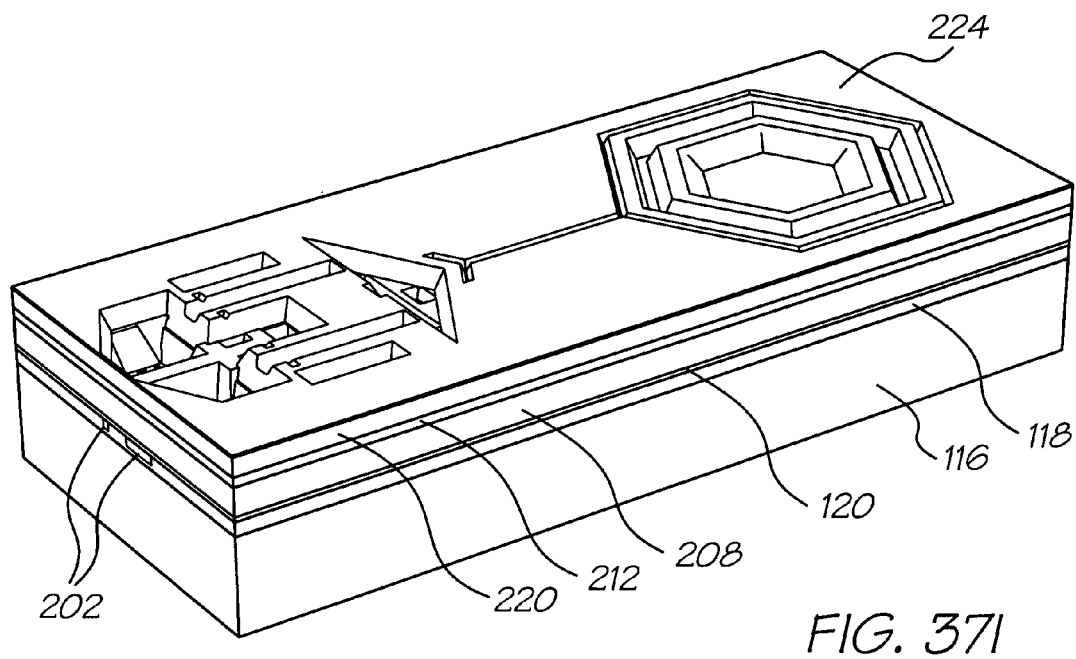
Figure 38I:
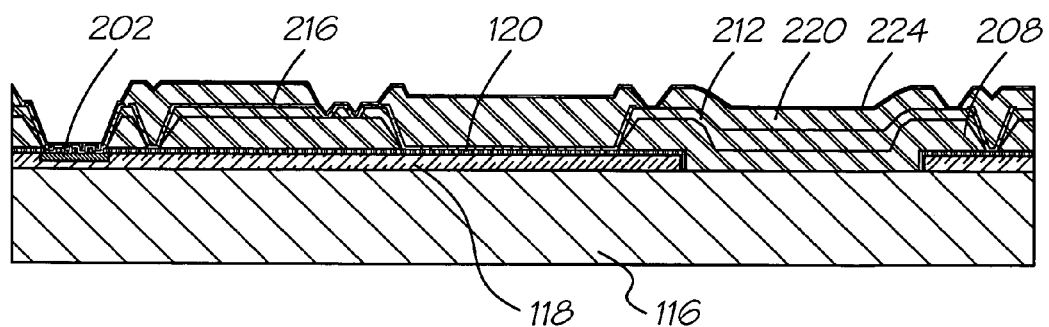
Figure 37J:
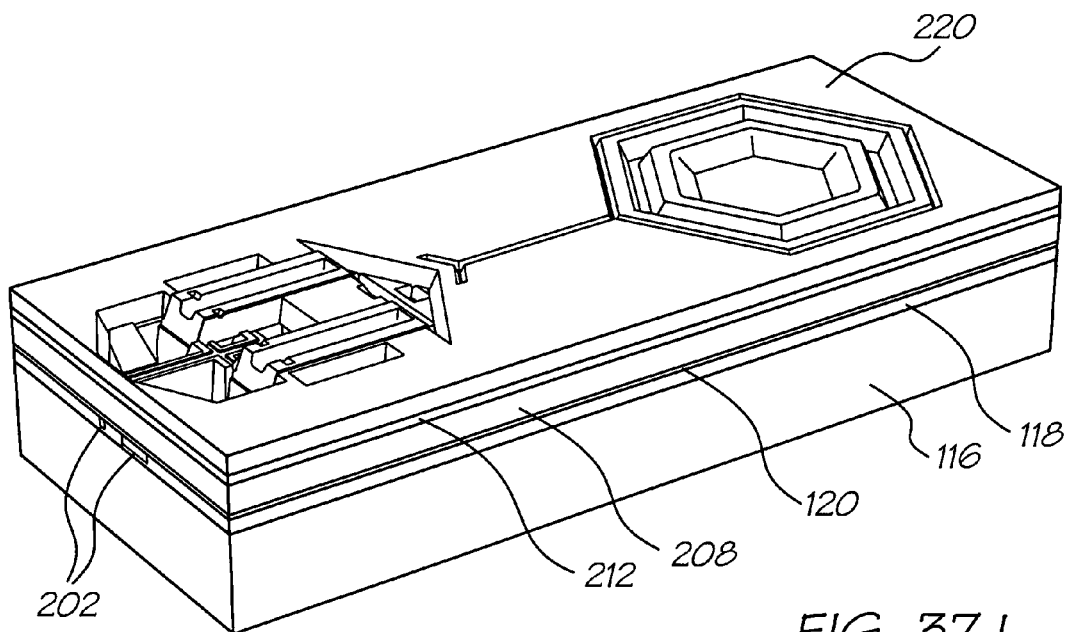
Figure 38J:
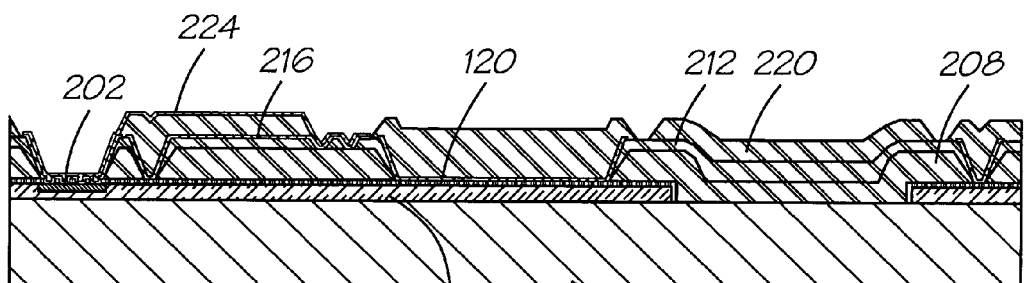
Figure 39H:
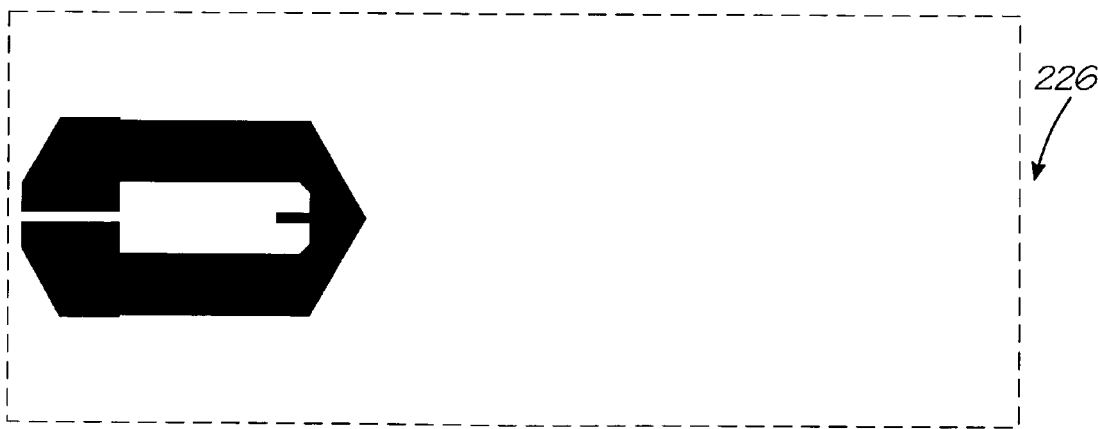
Figure 37K:
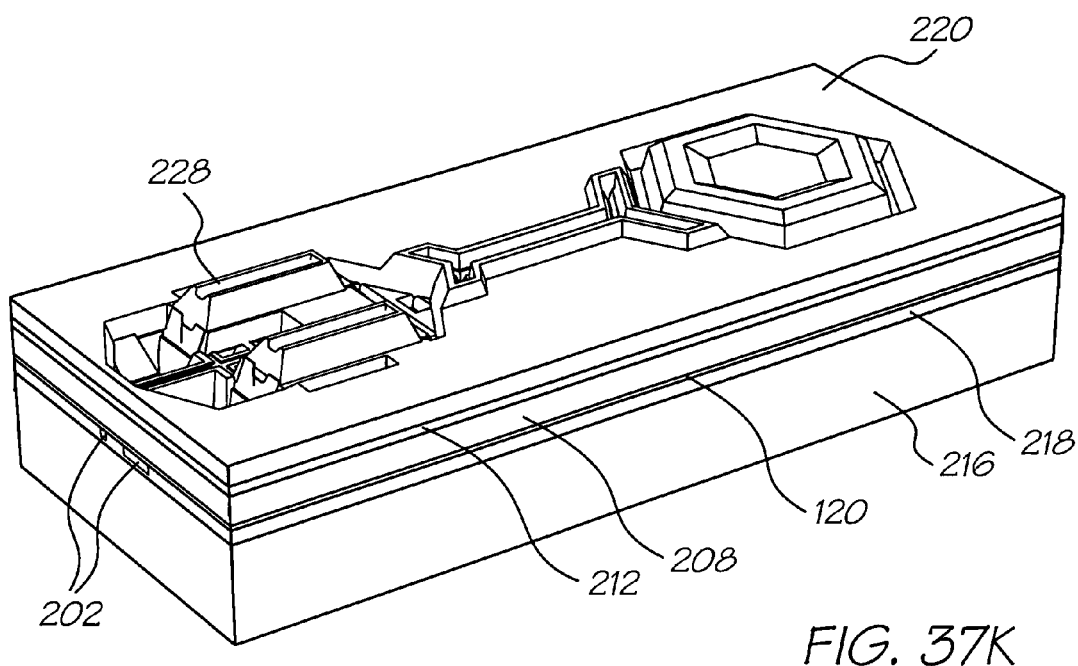
Figure 38K:
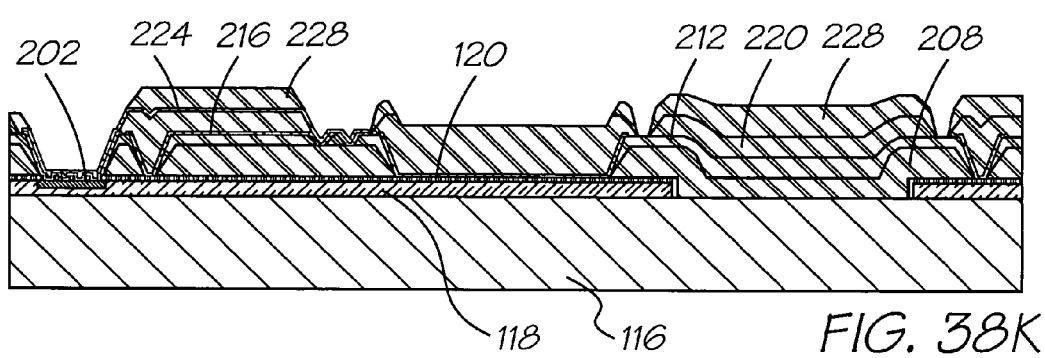
Figure 39I:
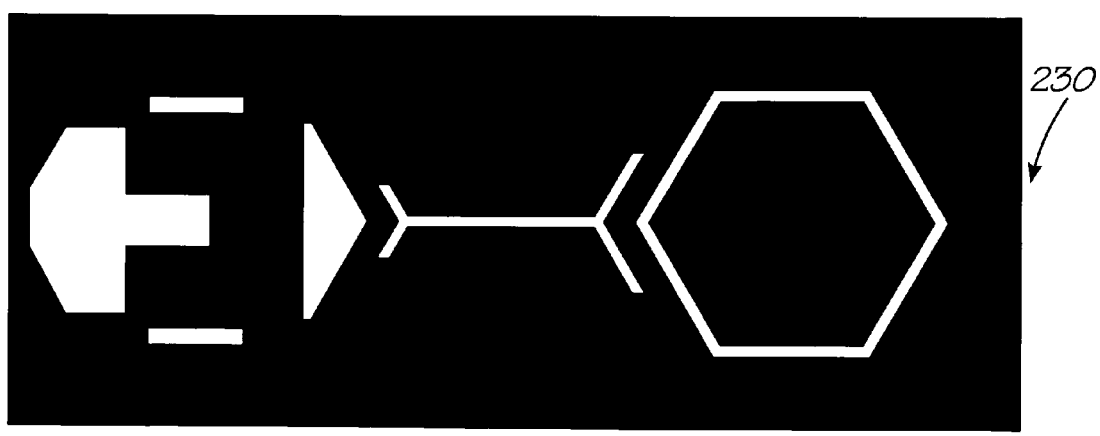
Figure 37L:
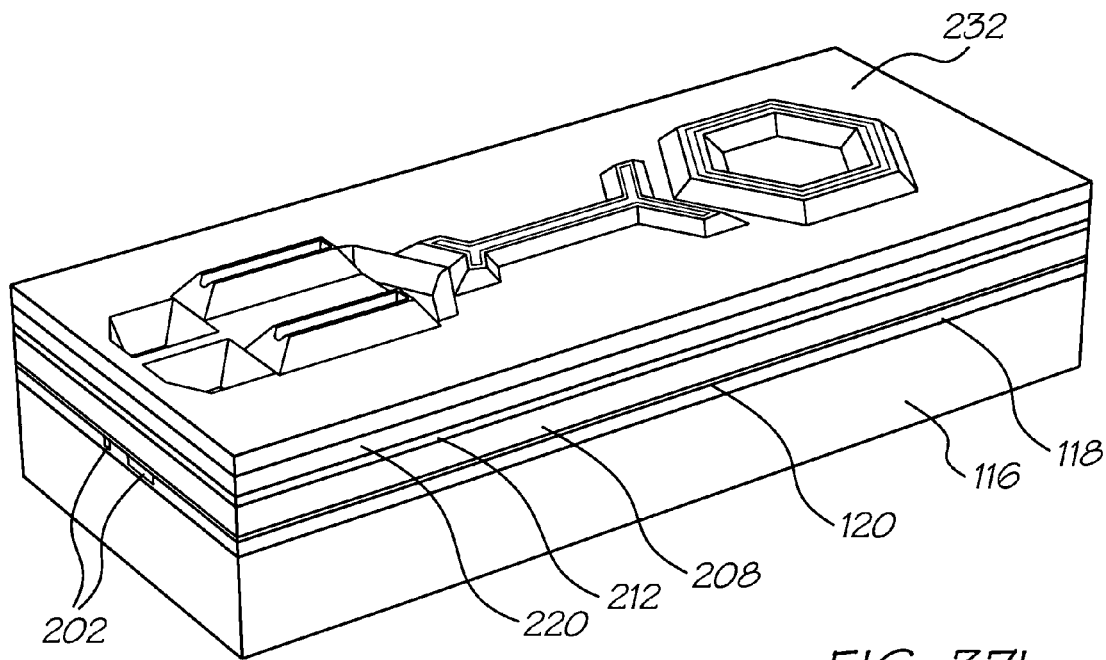
Figure 38L:
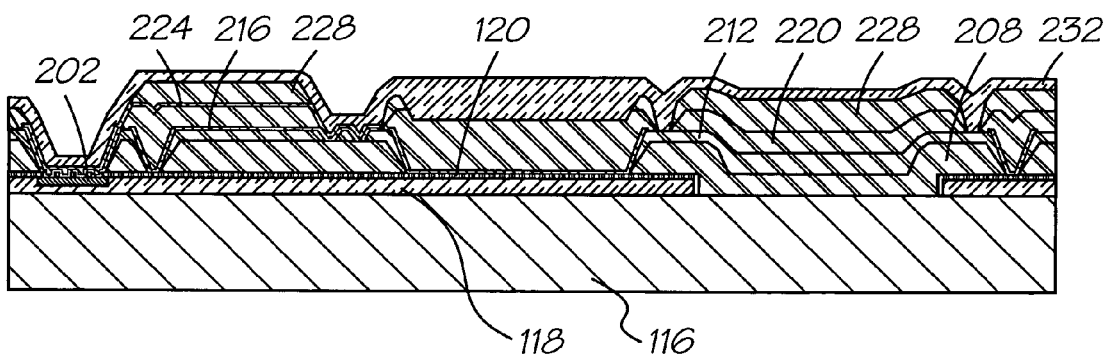
Figure 37M:
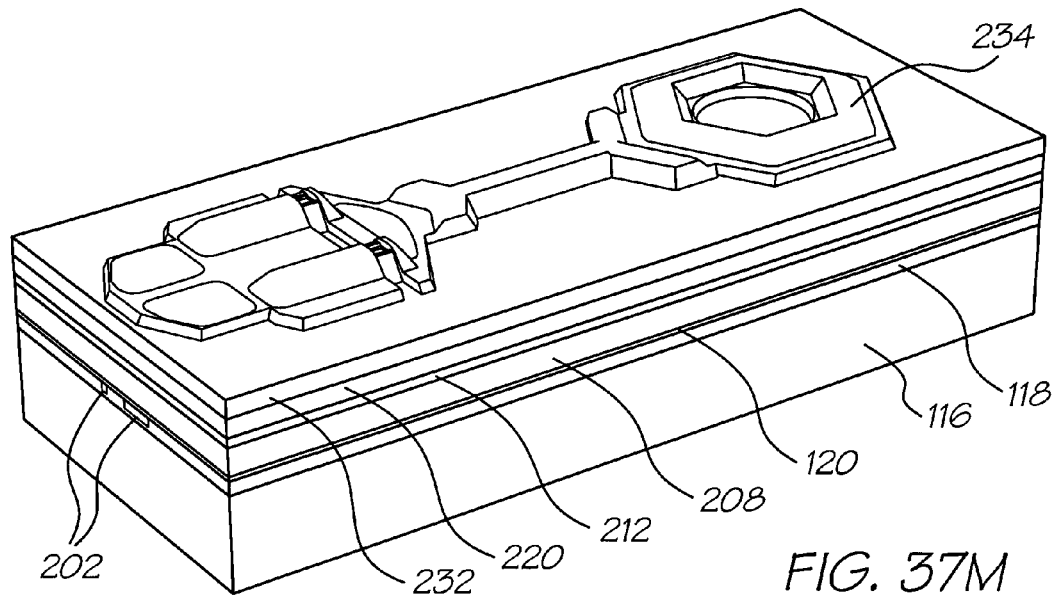
Figure 38M:
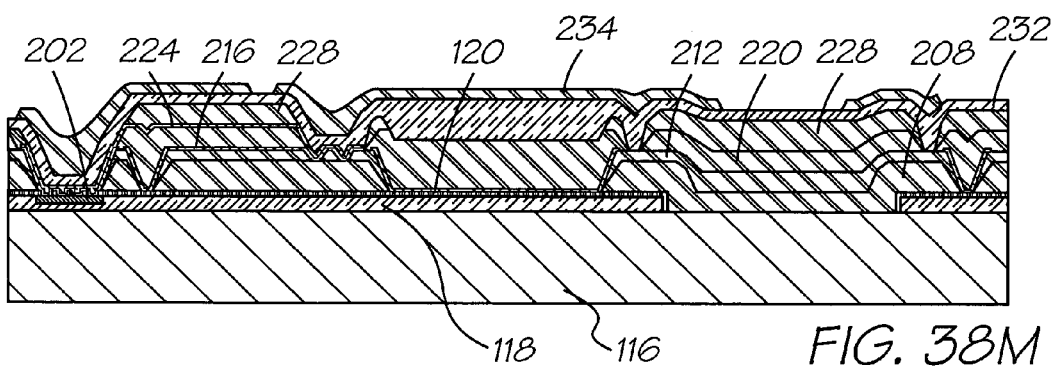
Figure 39J:
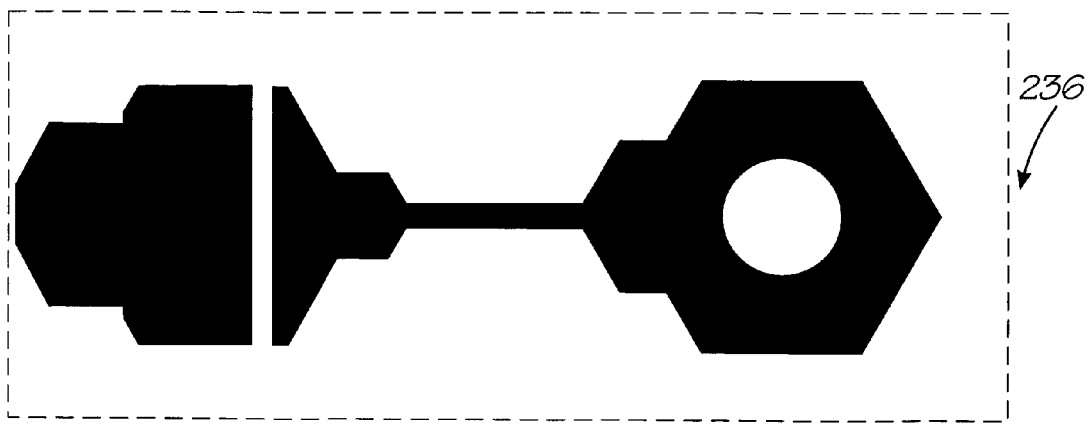
Figure 37N:
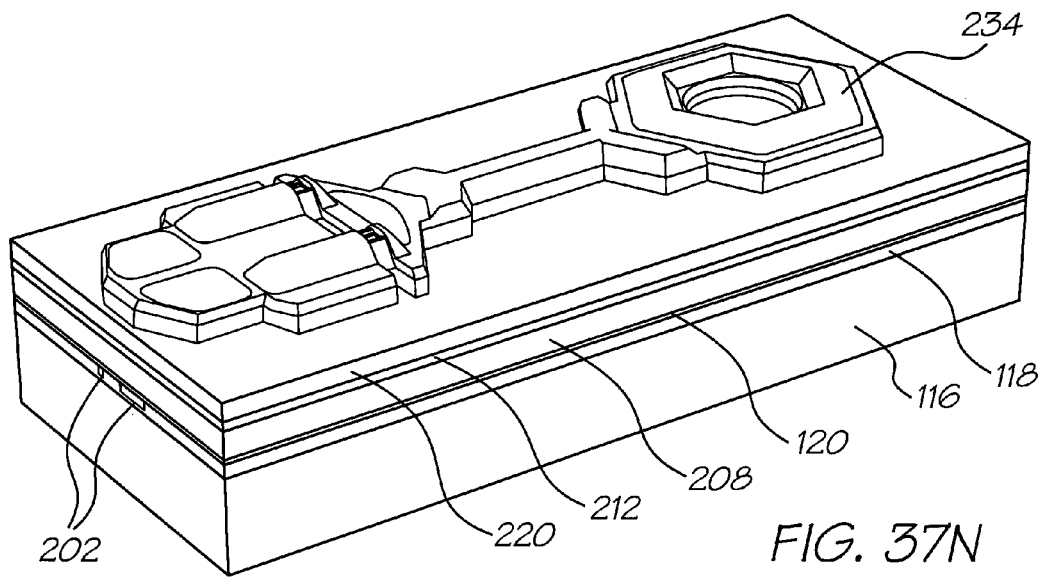
Figure 38N:
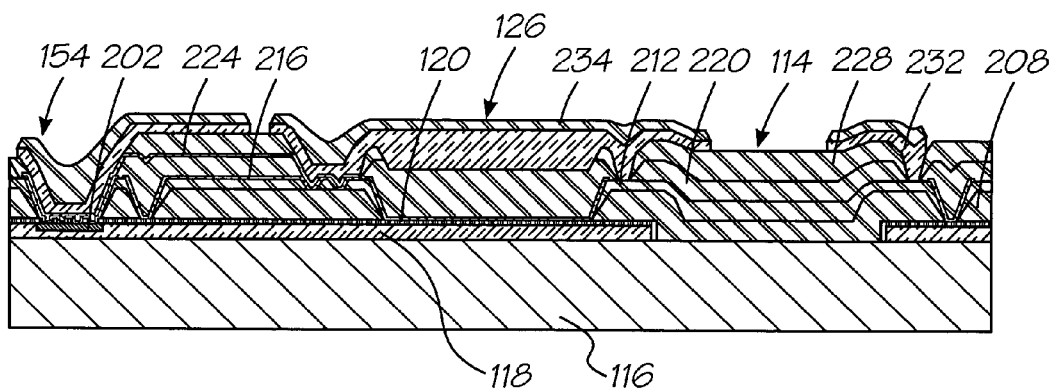
Figure 370:
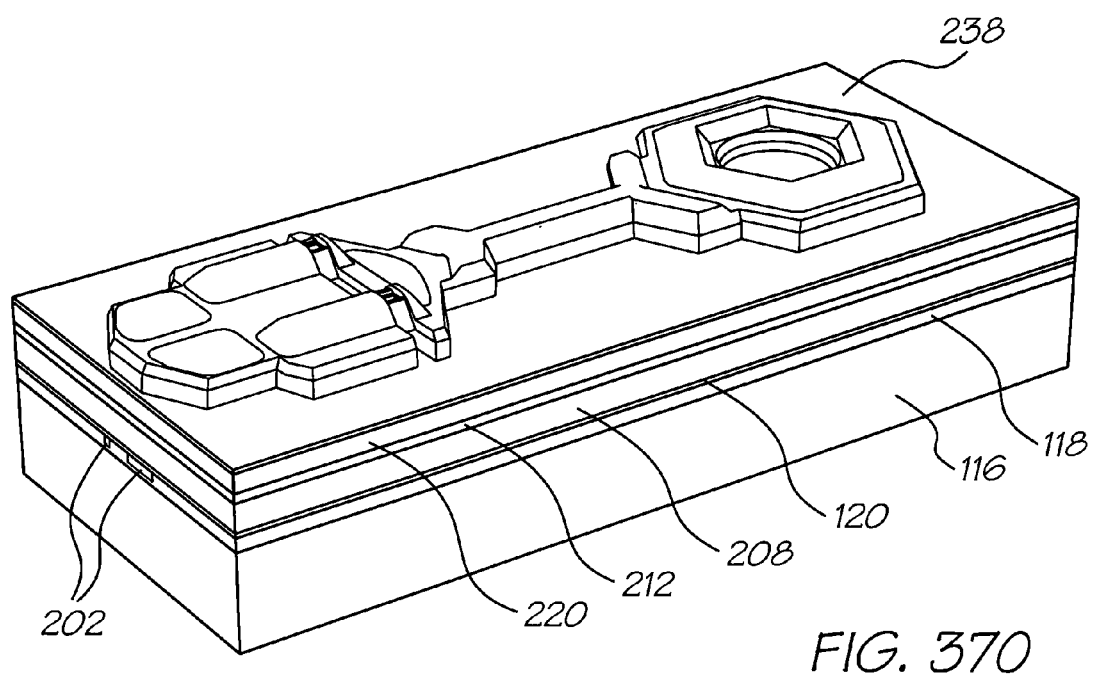
Figure 380:
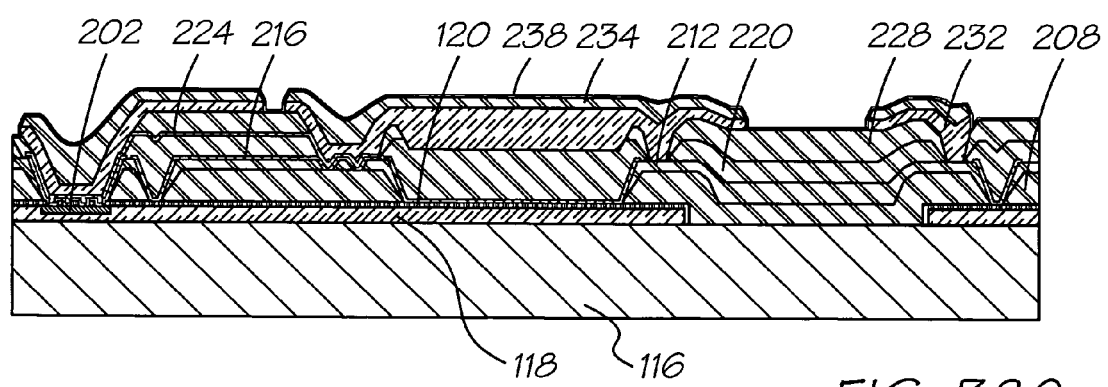
Figure 37P:
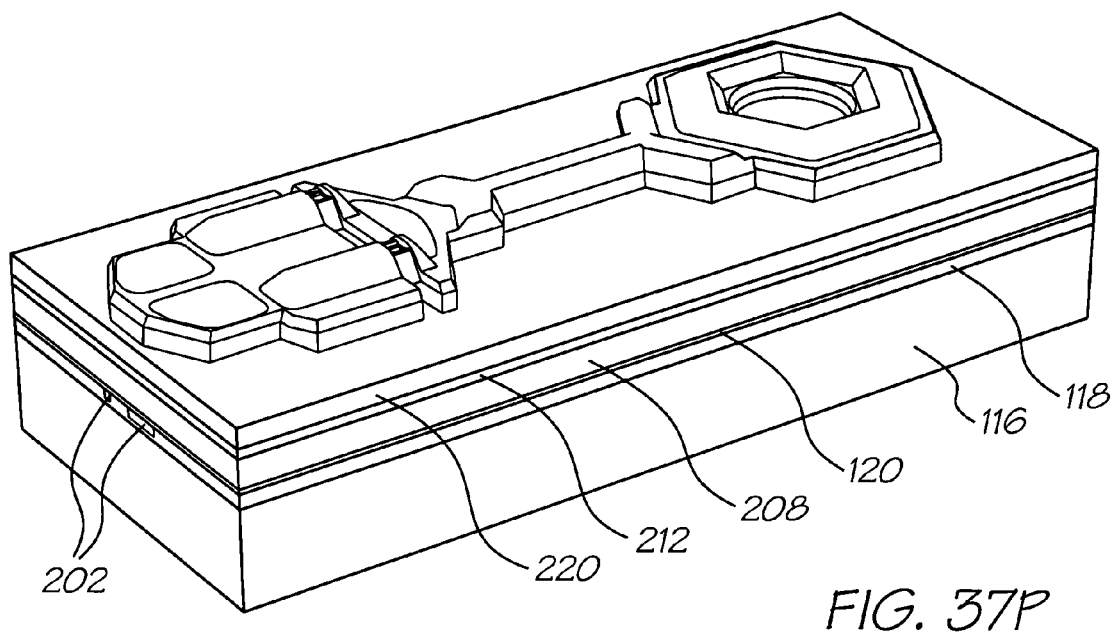
Figure 38P:
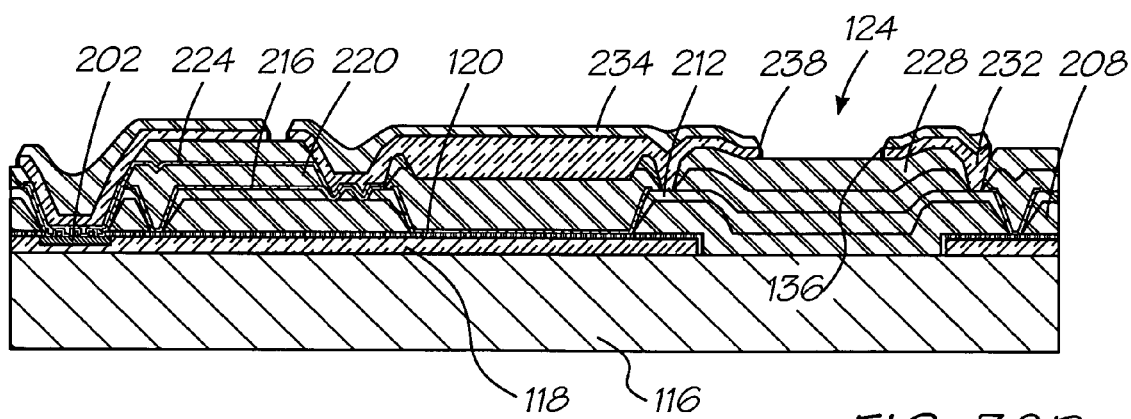
Figure 37R:
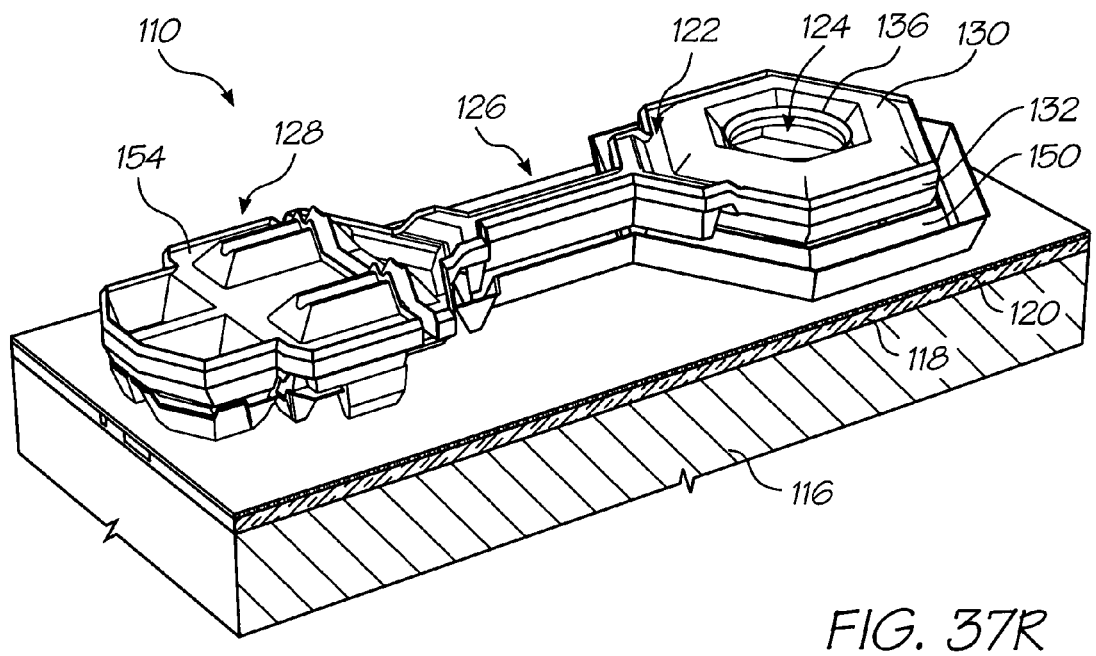

FIGS. 37a to 37r show three-dimensional views of steps in the fabrication of a nozzle arrangement of the ink jet printhead chip.

Figure 38A:
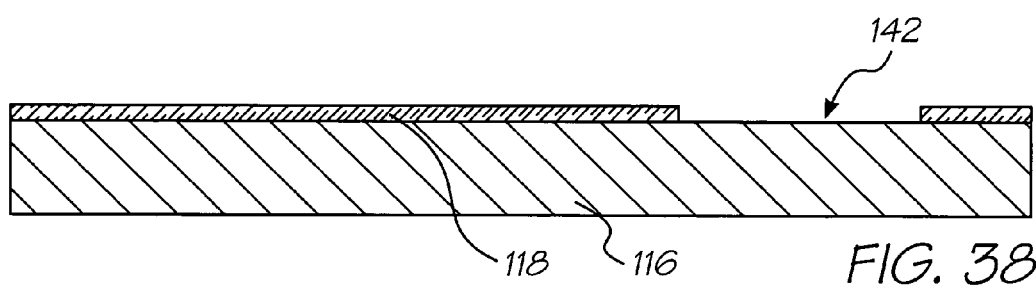
Figure 39A:
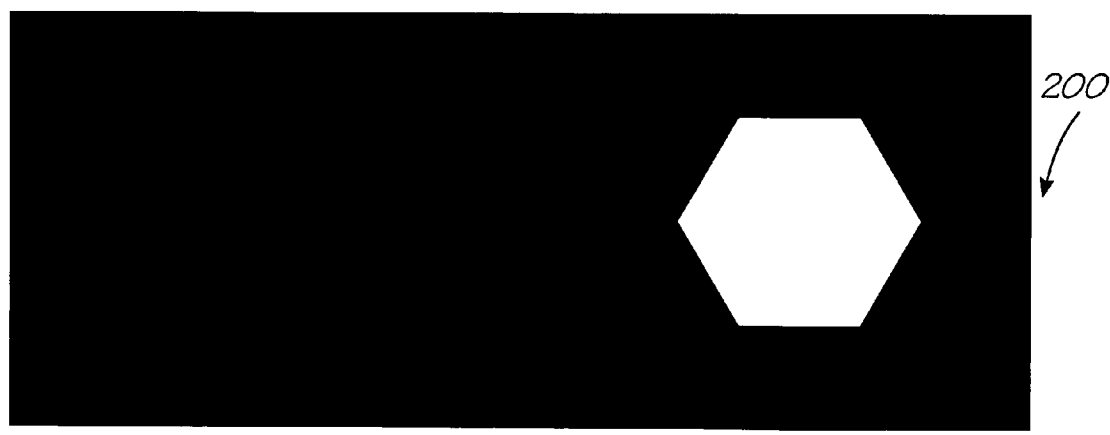
Figure 38R:
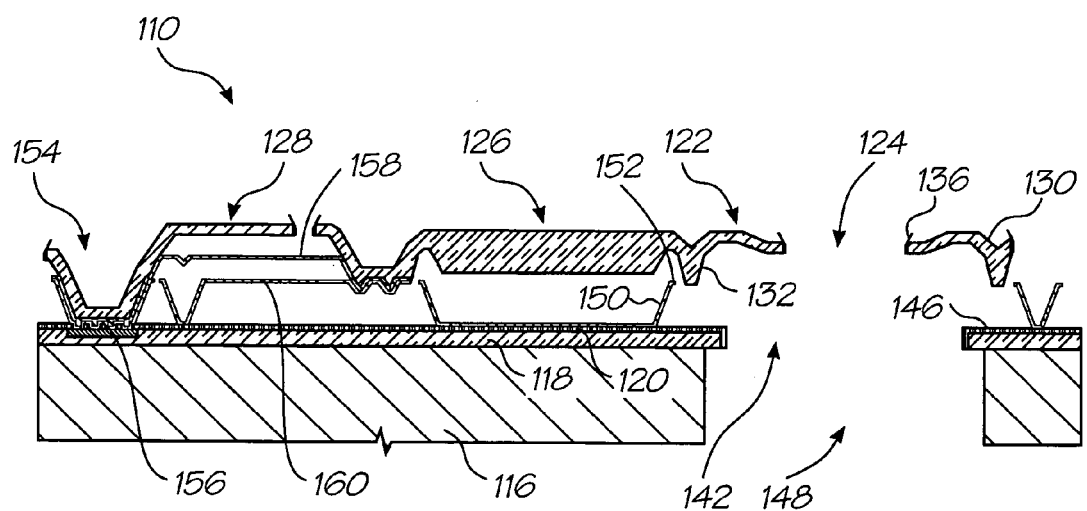
Figure 37Q:
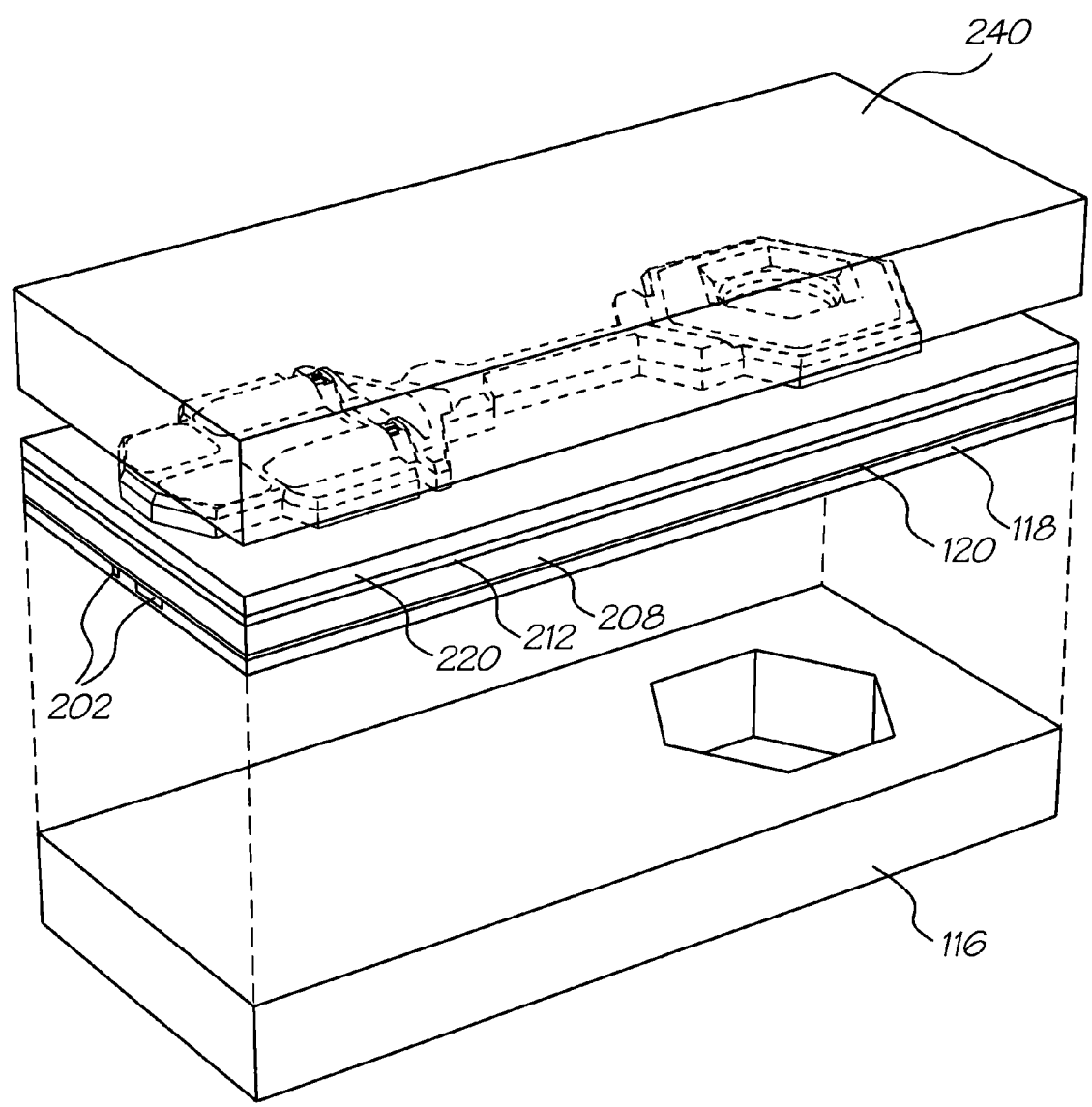
Figure 38Q:
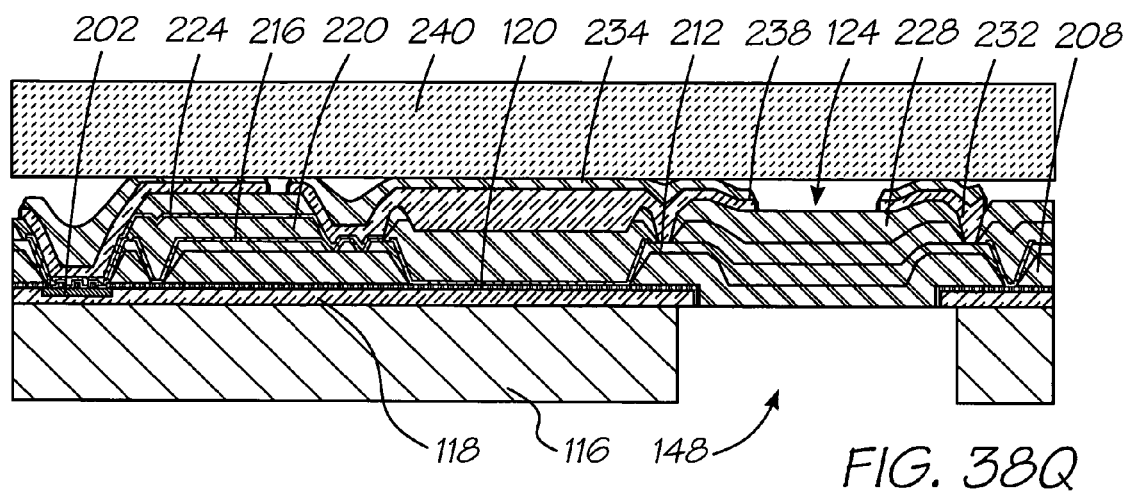
Figure 39K:
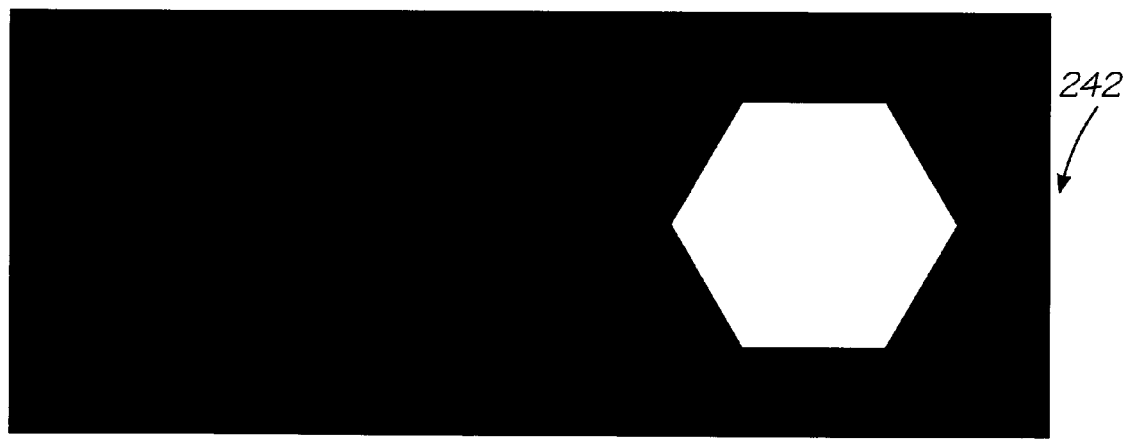

FIGS. 38a to 38r show sectional side views of the fabrication steps of FIGS. 37a to 37r.

FIGS. 39a to 39k show layouts of masks used in various steps in the fabrication process.

Figure 40A:
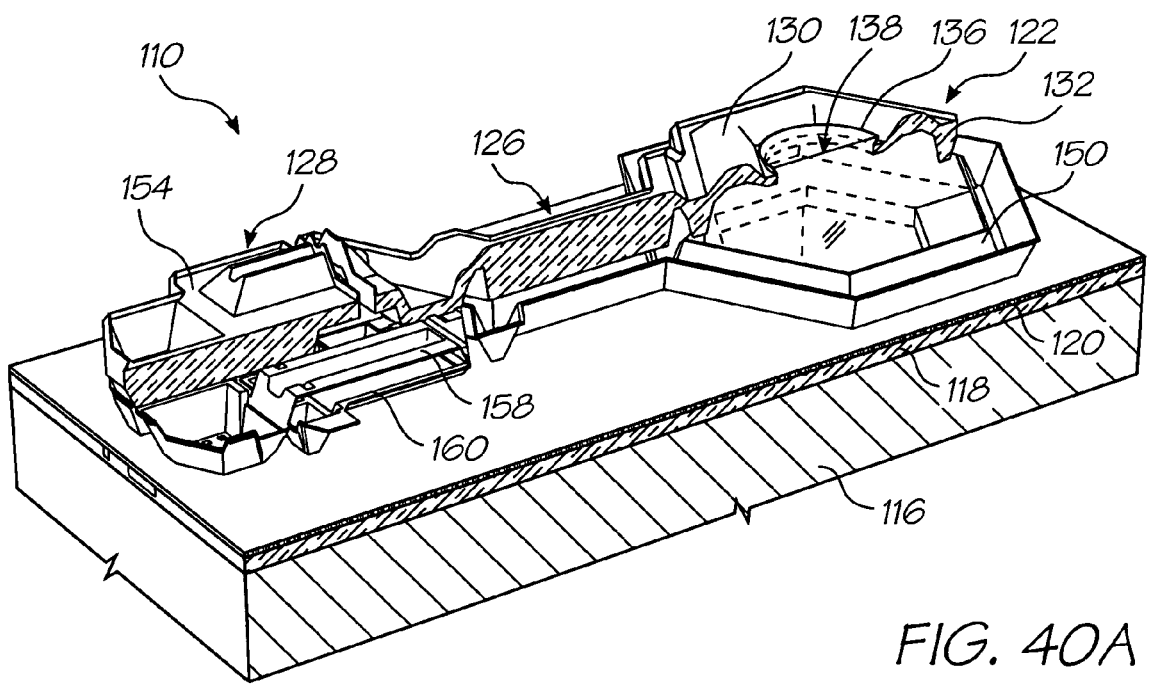
Figure 40B:
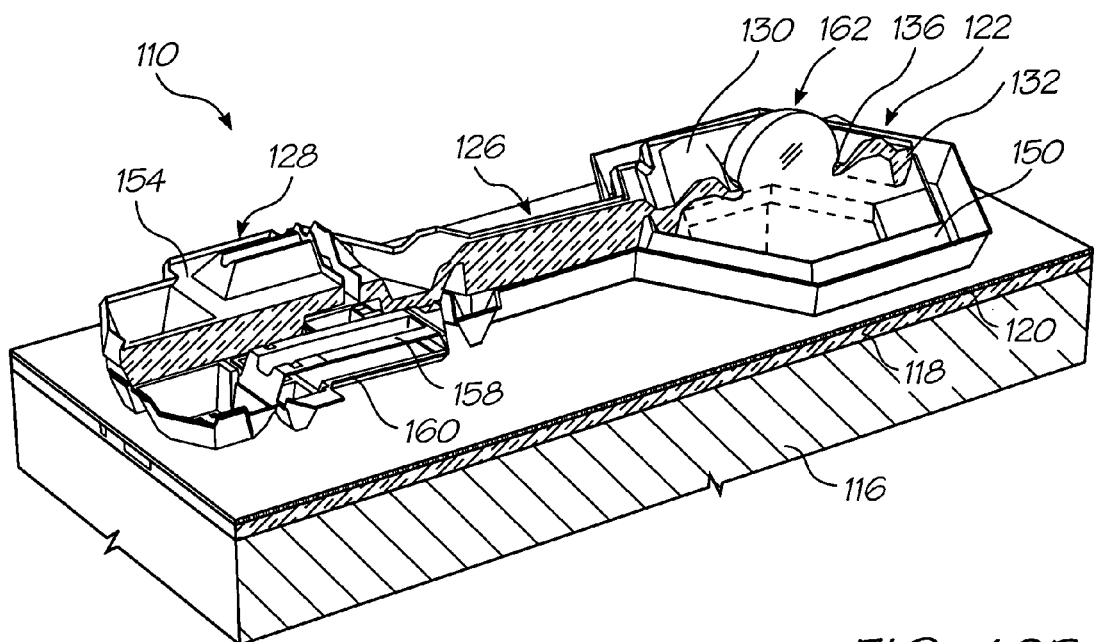
Figure 40C:
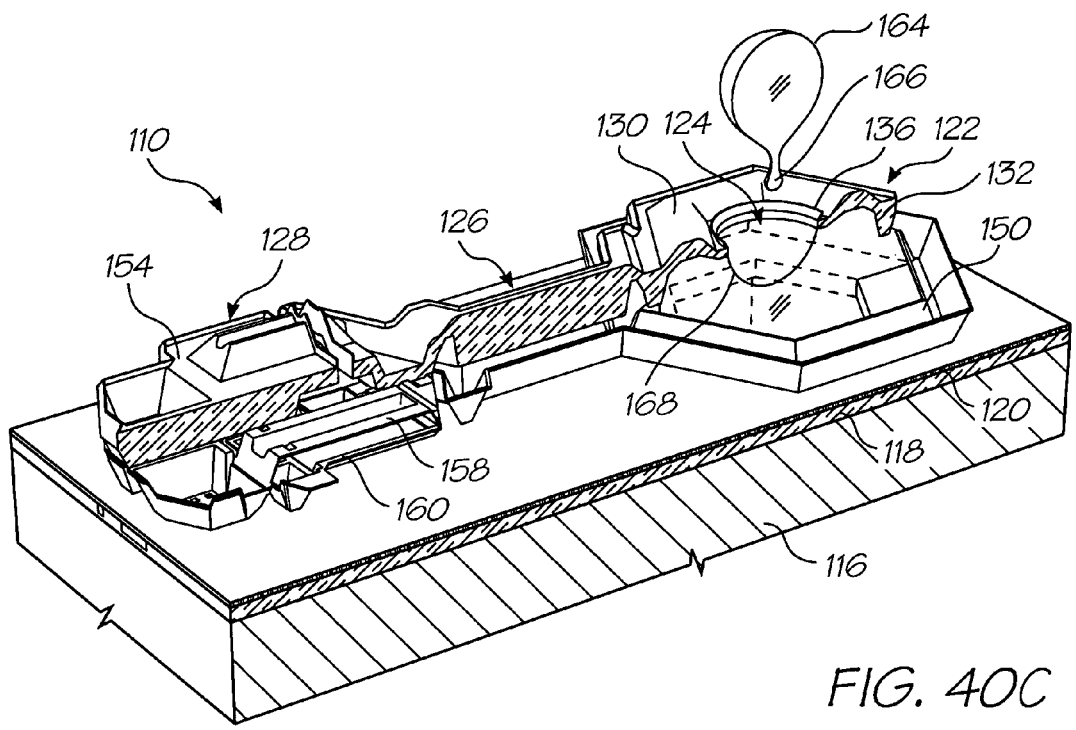

FIGS. 40a to 40c show three-dimensional views of an operation of the nozzle arrangement fabricated according to the method of FIGS. 37 and 38.

Figure 41A:
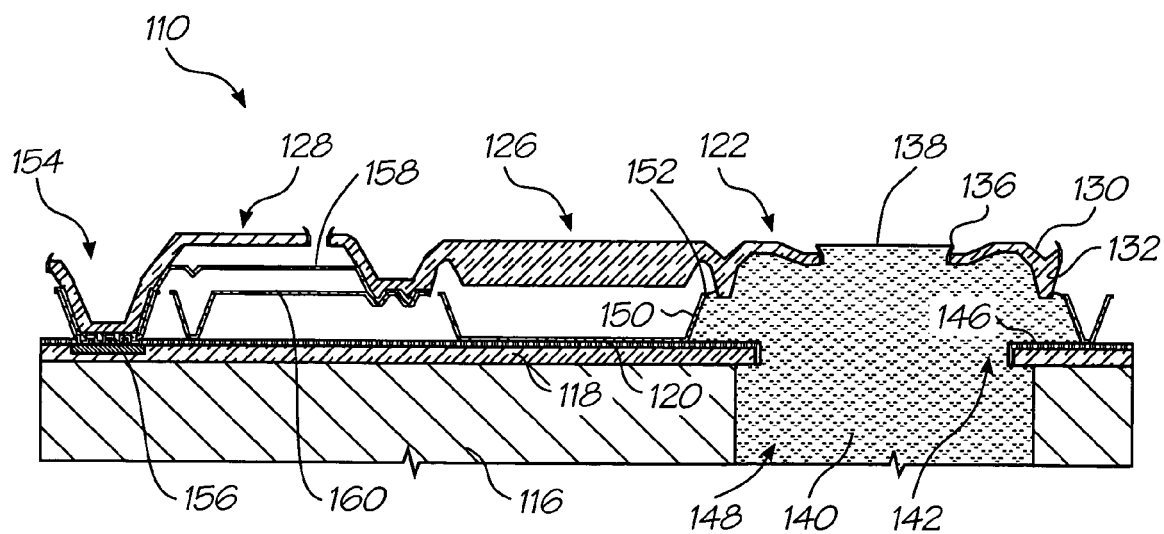
Figure 41B:
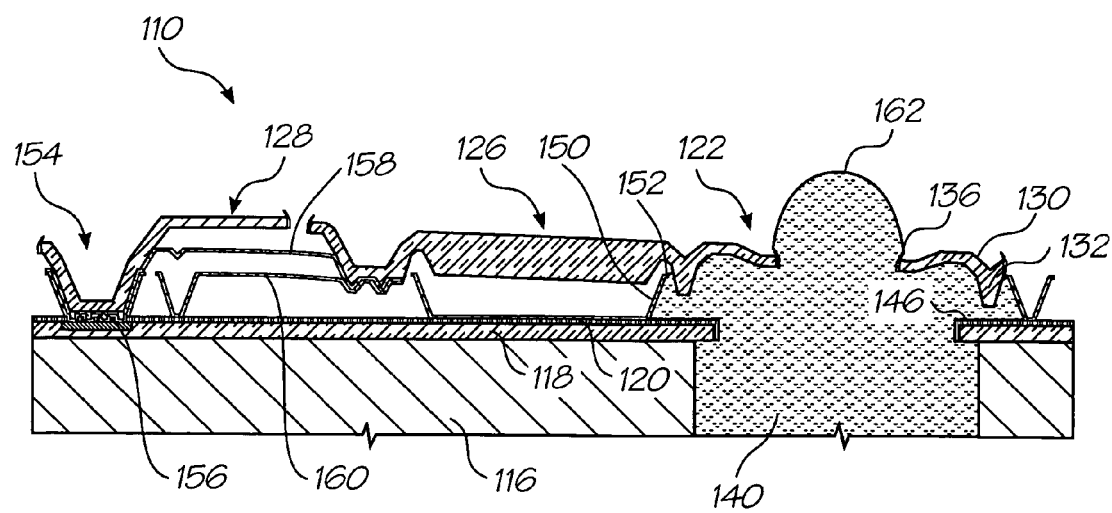
Figure 41C:
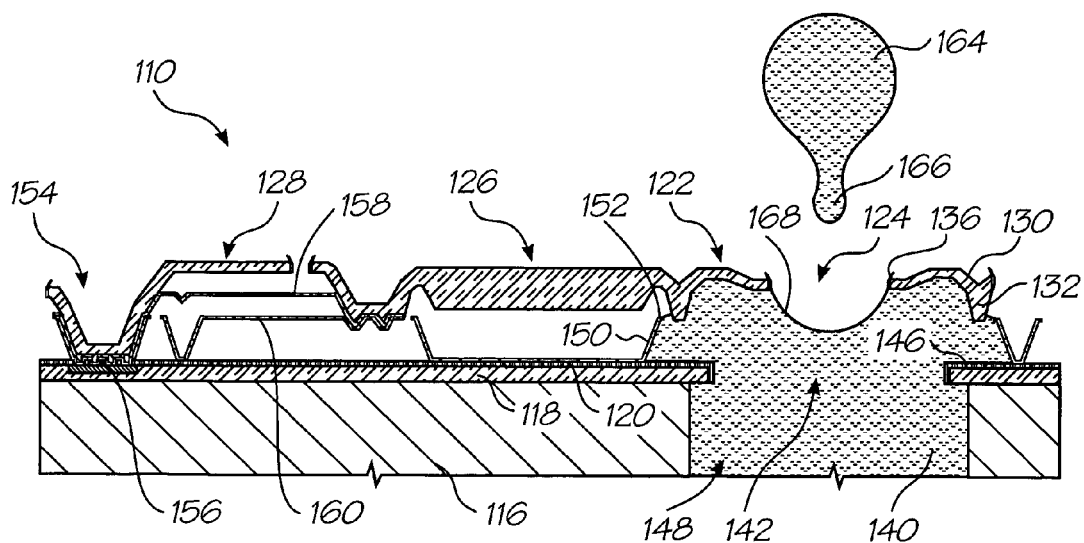

FIGS. 41a to 41c show sectional side views of an operation of the nozzle arrangement fabricated according to the method of FIGS. 37 and 38.

DESCRIPTION OF PREFERRED AND OTHER EMBODIMENTS

In the preferred embodiments of the invention, a drop on demand ink jet nozzle arrangement is provided which allows for the ejection of ink on demand by means of a thermal actuator which operates to eject the ink from a nozzle chamber. The nozzle chamber is formed directly over an ink supply channel thereby allowing for an extremely compact form of nozzle arrangement. The extremely compact form of nozzle arrangement allows for minimal area to be taken up by a printing mechanism thereby resulting in improved economics of fabrication.

Turning initially to FIGS. 1–3, the operation of the preferred embodiment of the nozzle arrangement is now described. In FIG. 1, there is illustrated a sectional view of two ink jet nozzle arrangements 10, 11 which are formed on a silicon wafer 12 which includes a series of through-wafer ink supply channels 13.

Located over a portion of the wafer 12 and over the ink supply channel 13 is a thermal actuator 14, which is actuated so as to eject ink from a corresponding nozzle chamber. The actuator 14 is placed substantially over the ink supply channel 13. In the quiescent position, the ink fills the nozzle chamber and an ink meniscus 15 forms across an ink ejection port 35 of the chamber.

The actuator 14 is spaced between 6 microns and 10 microns above the wafer 12.

When it is desired to eject a drop from the chamber, the thermal actuator 14 is activated by passing a current through the actuator 14. The actuation causes the actuator 14 to rapidly bend upwards as indicated in FIG. 2. The movement of the actuator 14 results in an increase in the ink pressure around an ejection port 35 (FIG. 4) of the chamber, which in turn causes, a significant bulging of the meniscus 15 and a flow of ink out of the nozzle chamber. The actuator 14 can be constructed so as to impart sufficient momentum to the ink to cause the direct ejection of a drop.

As indicated in FIG. 3, the activation of actuator 14 can be timed so as to turn the actuation current off at a predetermined point. This causes the return of the actuator 14 to its original position thereby resulting in a consequential backflow of ink in the direction of an arrow 17 into the chamber. A body of ink 18 necks and separates and continues towards output media, such as paper, for printing. The actuator 14 then returns to its quiescent position and surface tension effects result in a refilling of the nozzle chamber via the ink supply channel 13 as a consequence of surface tension effects on the meniscus 15. In time, the condition of the ink returns to that depicted in FIG. 1.

In FIGS. 4 and 5, there is illustrated the structure of a single nozzle arrangement 10 in more detail. FIG. 4 is a part sectional view while FIG. 5 shows a corresponding exploded perspective view.

Many ink jet nozzle arrangements are formed at a time, on a selected wafer base 12 utilizing standard semi-conductor processing techniques in addition to micro-machining and micro-fabrication process technology further details of this form of fabrication are set out in further detail further on in this specification.

A CMOS drive circuitry layer 20 is formed on the wafer 12. The CMOS layer 20 can, in accordance with standard techniques, include multi-level metal layers sandwiched between oxide layers and preferably at least a two level metal process is utilized. In order to reduce the number of necessary processing steps, the masks utilized include areas that provide for a build up of an aluminum barrier 21 which can be constructed from a first level 22 of aluminum and second level 23 of aluminum. Additionally, aluminum portions 24 are provided which define electrical contacts to a subsequent heater layer. The aluminum barrier 21 is important for providing an effective barrier to the possible subsequent etching of the oxide within the CMOS layer 20 when a sacrificial etchant is utilized in the construction of the nozzle arrangement 10 with the etchable material preferably being glass layers.

A nitride passivation layer 26 is formed on the CMOS layer 20 to protect the lower CMOS layers from sacrificial etchants and ink erosion. Above the nitride layer 26 there is formed a gap 28 in which an air bubble forms during operation. The gap 28 can be constructed by laying down a sacrificial layer and subsequently etching the gap 28 as will be explained hereinafter. The air gap 28 is between 6 microns and 10 microns thick.

On top of the air gap 28 is constructed a polytetrafluoroethylene (PTFE) layer 29 which comprises a gold serpentine heater layer 30 sandwiched between two PTFE layers. The gold heater layer 30 is constructed in a serpentine form to allow it to expand on heating. The heater layer 30 and PTFE layer 29 together comprise the thermal actuator 14 of FIG. 1.

The outer PTFE layer 29 has an extremely high coefficient of thermal expansion (approximately $770 \times 10^{-6}$, or around 380 times that of silicon). The PTFE layer 29 is also normally highly hydrophobic which results in an air bubble being formed under the actuator in the gap 28 due to out-gassing etc. The top PTFE surface layer is treated so as to make it hydrophilic in addition to those areas around the ink supply channel 13. This can be achieved with a plasma etch in an ammonia atmosphere. The heater layer 30 is also formed within the lower portion of the PTFE layer.

The heater layer 30 is connected at ends e.g. 31 to the lower CMOS drive layer 20 that contains the drive circuitry (not shown). For operation of the actuator 14, a current is passed through the gold heater element 30 that heats the bottom surface of the actuator 14. The bottom surface of actuator 14, in contact with the air bubble remains heated while any top surface heating is carried away by the exposure of the top surface of actuator 14 to the ink within a chamber 32. Hence, the bottom PTFE layer expands more rapidly resulting in a general rapid upward bending of actuator 14 (as illustrated in FIG. 2) that consequentially causes the ejection of ink from the ink ejection port 35.

Turning off the current to the heater layer 30 can deactivate the actuator 14. This will result in a return of the actuator 14 to its rest position.

On top of the actuator 14 are formed nitride side wall portions 33 and a top wall portion 34. The wall portions 33 and the top portions 34 can be formed via a dual damascene process utilizing a sacrificial layer. The top wall portion 34 is etched to define the ink ejection port 35 in addition to a series of etchant holes 36 which are of a relatively small diameter and allow for effective etching of lower sacrificial layers when utilizing a sacrificial etchant. The etchant holes 36 are made small enough such that surface tension effects restrict the possibilities of ink being ejected from the chamber 32 via the etchant holes 36 rather than the ejection port 35.

The various steps involved in the construction of an array of ink jet nozzle arrangements are explained in FIGS. 6 to 15.

Figure 8:
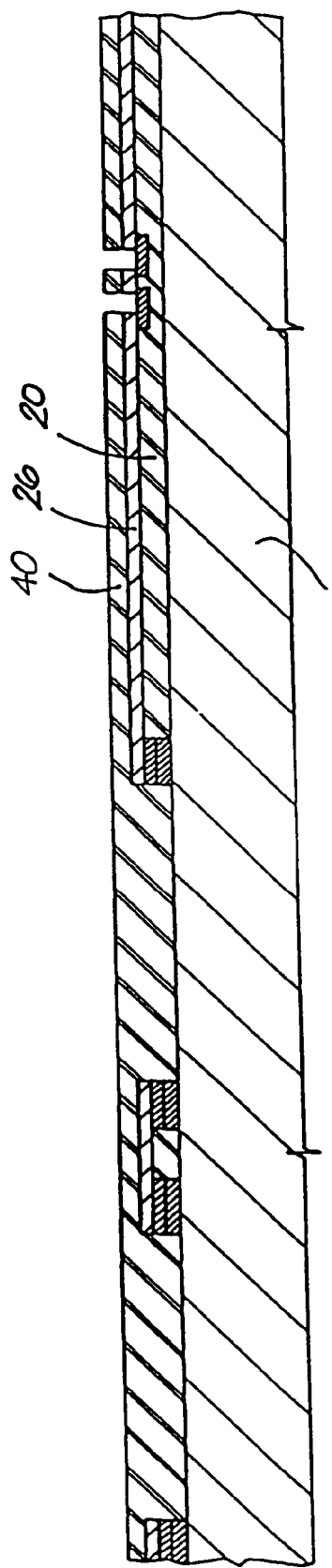
Figure 9:
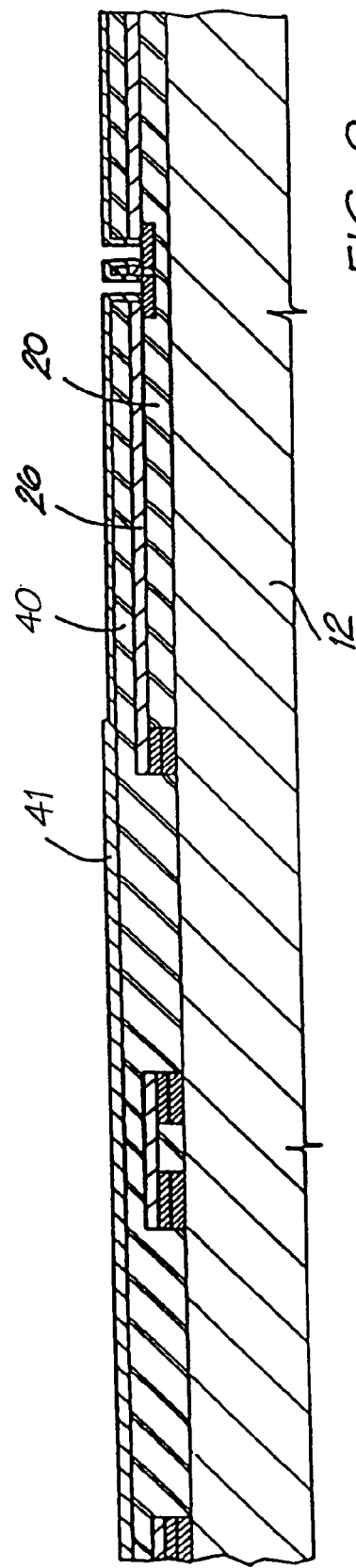
Figure 10:
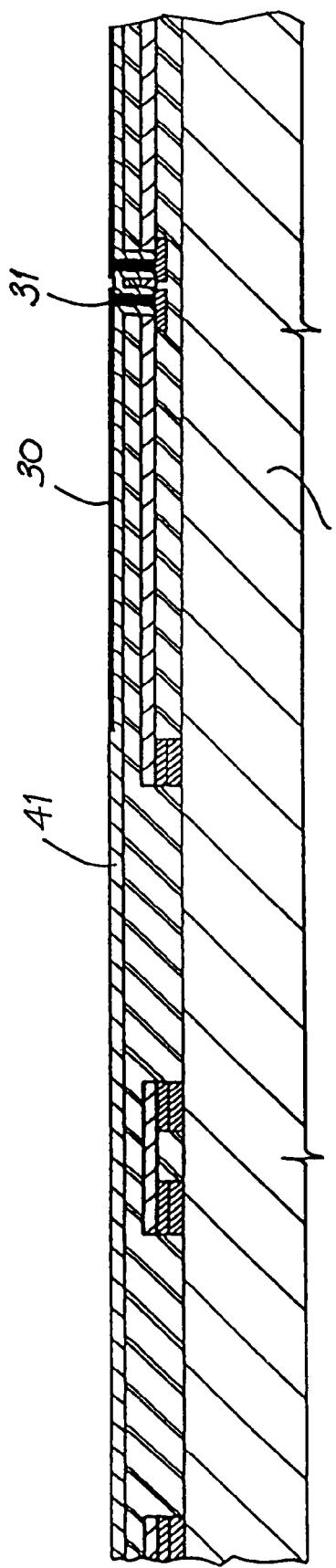
Figure 11:
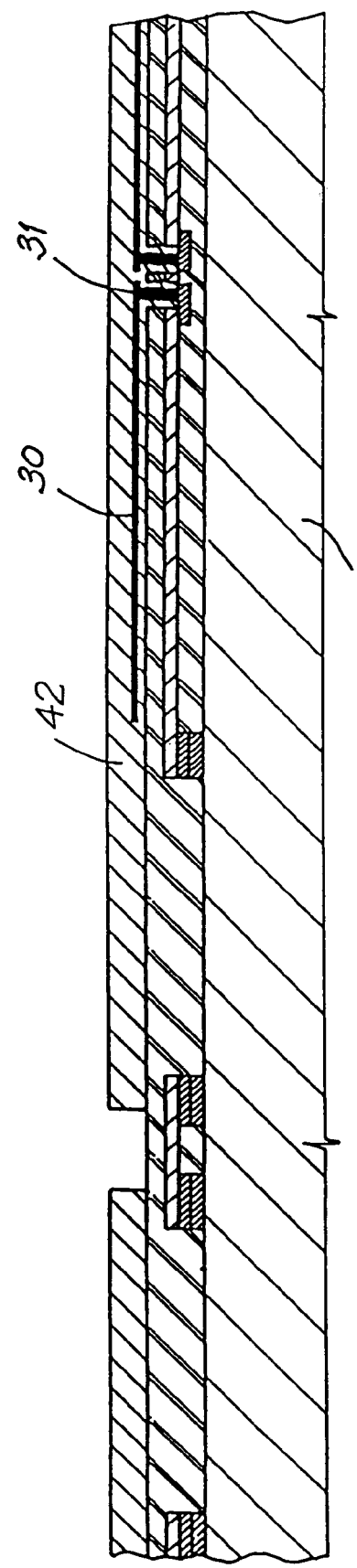

1. Turning initially to FIG. 6, the starting position comprises a silicon wafer 12 including a CMOS layer 20 which has nitride passivation layer 26 and which is surface finished with a chemical—mechanical planarization process.
2. The nitride layer is masked and etched as illustrated in FIG. 7 so as to define portions of the nozzle arrangement and areas for interconnection between any subsequent heater layer and a lower CMOS layer.
3. Next, a sacrificial oxide layer is deposited, masked and etched as indicated in FIG. 8 with the oxide layer being etched in those areas where a subsequent heater layer electronically contacts the lower layers.
4. As illustrated in FIG. 9, a 1 micron layer of PTFE is deposited and first masked and etched for the heater contacts to the lower CMOS layer and then masked and etched for the heater shape.
5. Next, as illustrated in FIG. 10, the gold heater layer 30, 31 is deposited. Due to the fact that it is difficult to etch gold, the layer can be conformally deposited and subsequently portions removed utilizing chemical mechanical planarization so as to leave those portions associated with the heater element. The processing steps 4 and 5 basically comprise a dual damascene process.
6. Next, a top PTFE layer is deposited and masked and etched down to the sacrificial layer as illustrated in FIG. 11 so as to define the heater shape. Subsequently, the surface of the PTFE layer is plasma processed so as to make it hydrophilic. Suitable processing can exclude plasma damage in an ammonia atmosphere. Alternatively, the surface could be coated with a hydrophilic material.
7. A further sacrificial layer is then deposited and etched as illustrated in FIG. 12 so as to form the structure for the nozzle chamber. The sacrificial layer is then masked and etched in order to define a deposition area for the nozzle chamber walls.
8. As illustrated in FIG. 13, the nozzle chamber is formed by conformally depositing three microns of nitride and etching a mask nozzle rim to a depth of one micron for the nozzle rim (the etched depth not being overly time critical). Subsequently, a mask is utilized to etch the ink ejection port 35 in addition to the sacrificial layer etchant holes 36.
9. As illustrated in FIG. 14, the backside of the wafer is masked for the ink channels and plasma etched through the wafer. A suitable plasma etching process can include a deep anisotropic trench etching system such as that available from SDS Systems Limited (See) "Advanced Silicon Etching Using High Density Plasmas" by J. K. Bhardwaj, H. Ashraf, page 224 of Volume 2639 of the SPIE Proceedings in Micro Machining and Micro Fabrication Process Technology).
10. As illustrated in FIG. 15, the sacrificial layers are etched away utilizing a sacrificial etchant such as hydrochloric acid. Subsequently, the portion underneath the actuator that is around the ink channel is plasma processed through the backside of the wafer to make the panel end hydrophilic.

Subsequently, the wafer can be separated into separate printheads and each printhead is bonded into an injection molded ink supply channel and the electrical signals to the chip can be tape automated bonded (TAB) to the printhead for subsequent testing. FIG. 16 illustrates a top view of nozzle arrangement constructed on a wafer so as to provide for pagewidth multicolor output.

Figure 18:
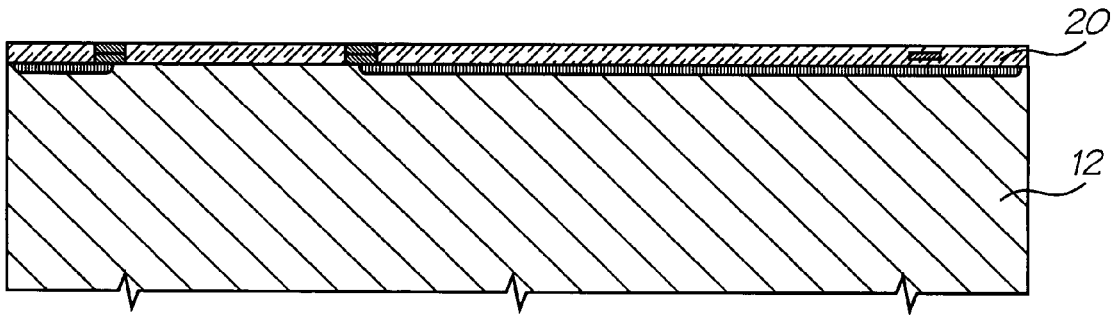
Figure 19:
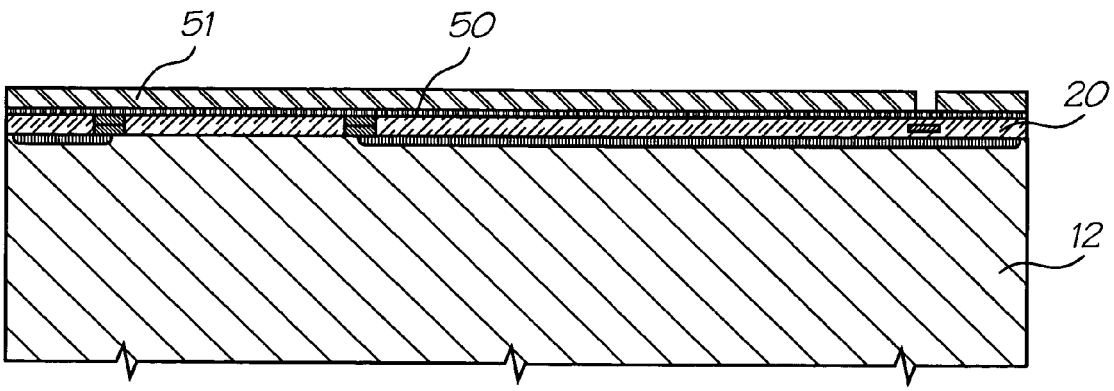
Figure 20:
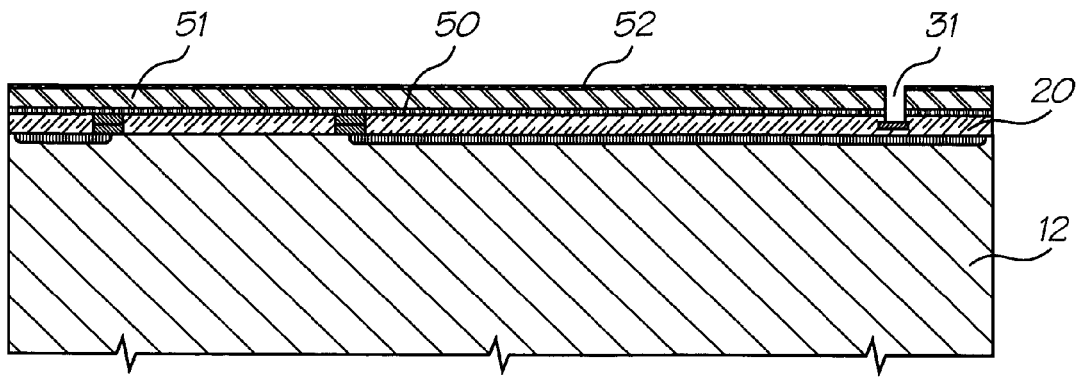
Figure 21:
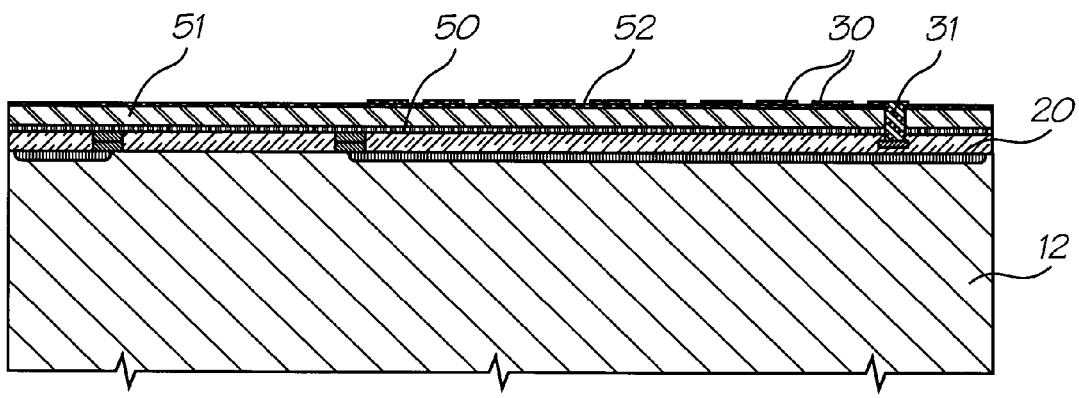
Figure 22:
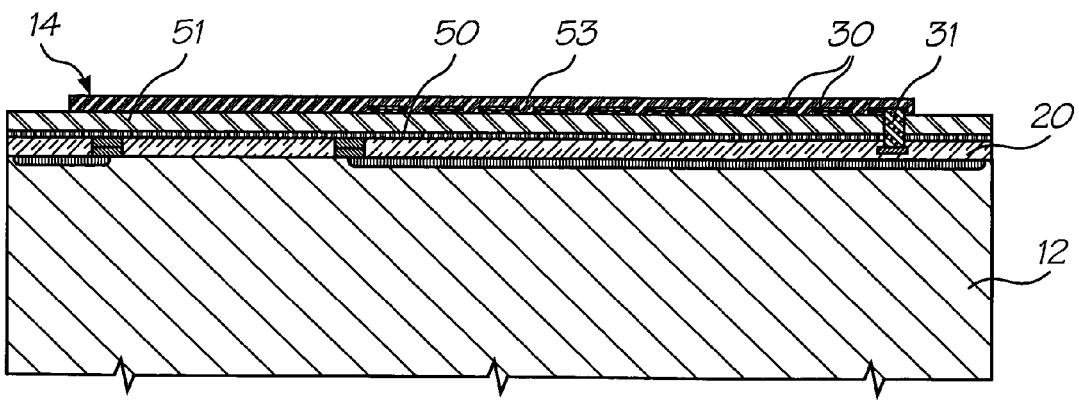
Figure 23:
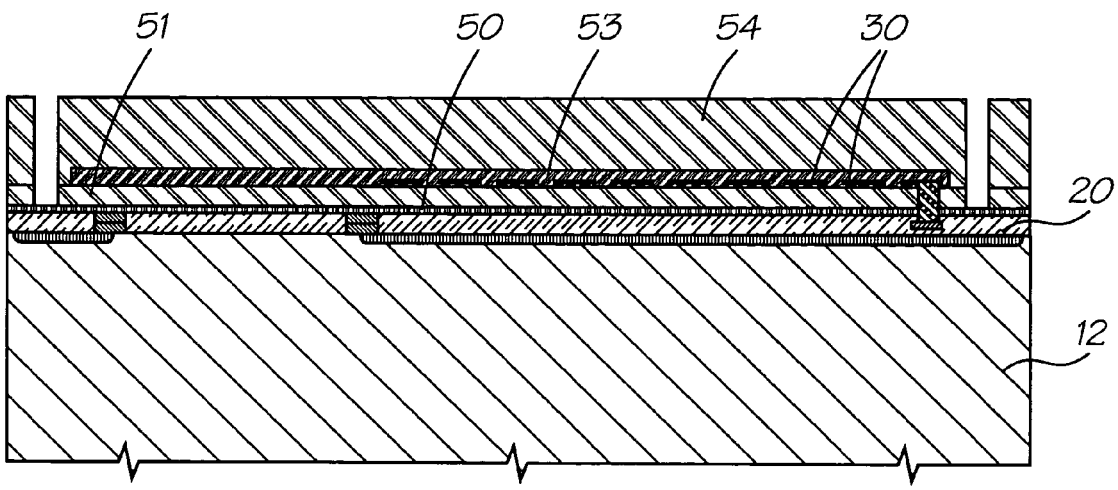
Figure 24:
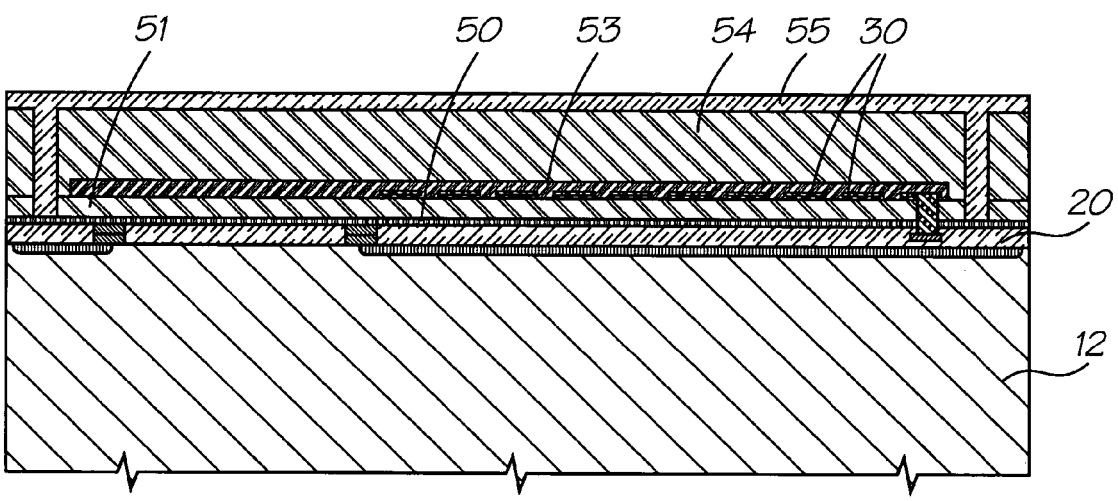
Figure 25:
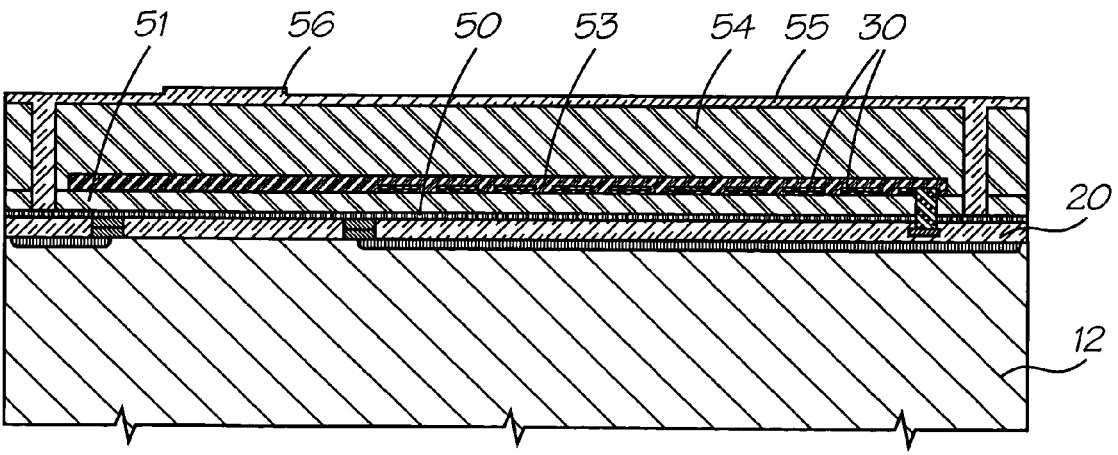
Figure 26:
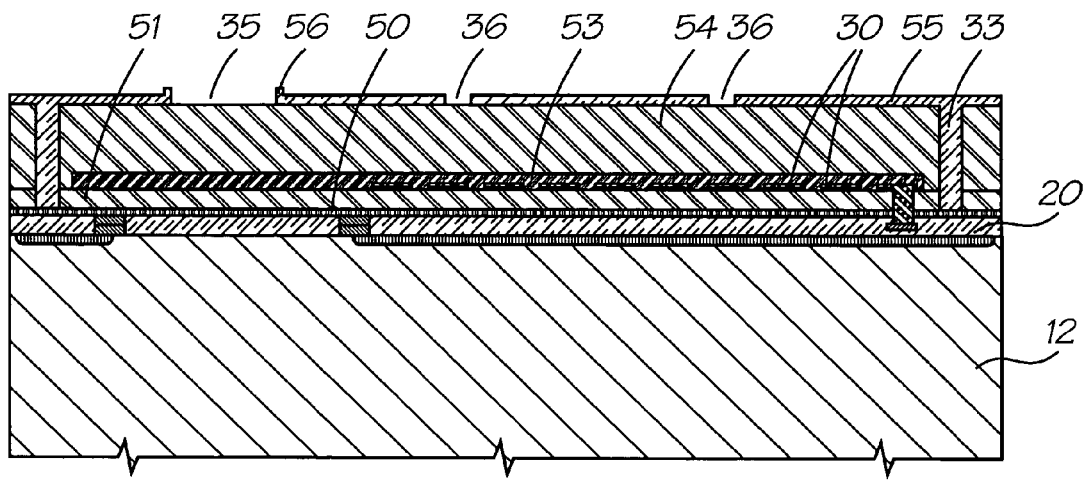
Figure 27:
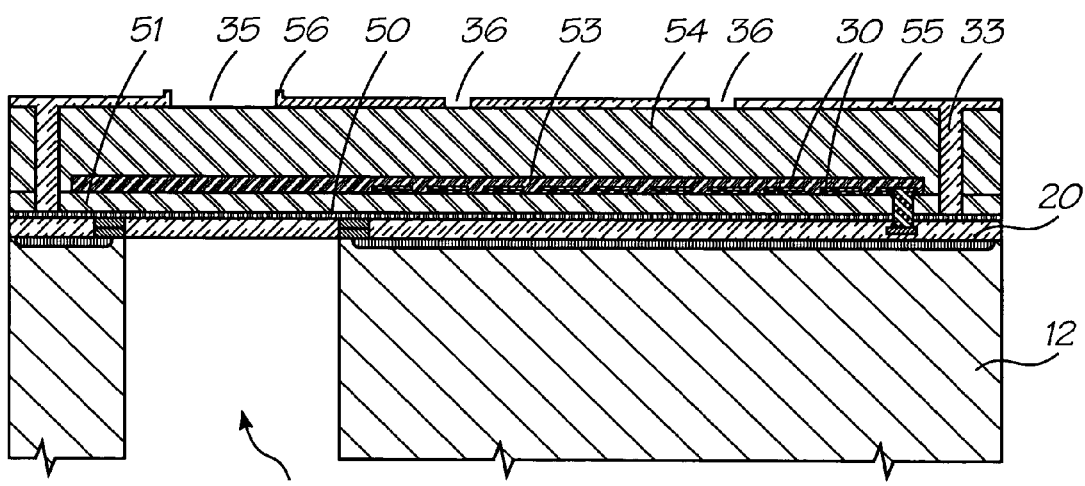

One form of detailed manufacturing process that can be used to fabricate monolithic ink jet printheads operating in accordance with the principles taught by the present embodiment can proceed utilizing the following steps:

1. Using a double sided polished wafer, Complete drive transistors, data distribution, and timing circuits using a 0.5 micron, one poly, 2 metal CMOS process. This step is shown in FIG. 18. For clarity, these diagrams may not be to scale, and may not represent a cross section though any single plane of the nozzle. FIG. 17 is a key to representations of various materials in these manufacturing diagrams, and those of other cross-referenced ink jet configurations.
2. Deposit 1 micron of low stress nitride. This acts as a barrier to prevent ink diffusion through the silicon dioxide of the chip surface.
3. Deposit 3 microns of sacrificial material (e.g. polyimide).
4. Etch the sacrificial layer using Mask 1. This mask defines the actuator anchor point. This step is shown in FIG. 19.
5. Deposit 0.5 microns of PTFE.
6. Etch the PTFE, nitride, and CMOS passivation down to second level metal using Mask 2. This mask defines the heater vias. This step is shown in FIG. 20.
7. Deposit and pattern resist using Mask 3. This mask defines the heater.
8. Deposit 0.5 microns of gold (or other heater material with a low Young's modulus) and strip the resist. Steps 7 and 8 form a lift-off process. This step is shown in FIG. 21.
9. Deposit 1.5 microns of PTFE.
10. Etch the PTFE down to the sacrificial layer using Mask 4. This mask defines the actuator and the bond pads. This step is shown in FIG. 22.
11. Wafer probe. All electrical connections are complete at this point, and the chips are not yet separated.
12. Plasma process the PTFE to make the top and side surfaces of the actuator hydrophilic. This allows the nozzle chamber to fill by capillarity.
13. Deposit 10 microns of sacrificial material.
14. Etch the sacrificial material down to nitride using Mask 5. This mask defines the nozzle chamber. This step is shown in FIG. 23.
15. Deposit 3 microns of PECVD glass. This step is shown in FIG. 24.
16. Etch to a depth of 1 micron using Mask 6. This mask defines a rim of the ejection port. This step is shown in FIG. 25.
17. Etch down to the sacrificial layer using Mask 7. This mask defines the ink ejection port and the sacrificial etch access holes. This step is shown in FIG. 26.
18. Back-etch completely through the silicon wafer (with, for example, an ASE Advanced Silicon Etcher from Surface Technology Systems) using Mask 8. This mask defines the ink inlets that are etched through the wafer. The wafer is also diced by this etch. This step is shown in FIG. 27.
19. Back-etch the CMOS oxide layers and subsequently deposited nitride layers and sacrificial layer through to PTFE using the back-etched silicon as a mask.
20. Plasma process the PTFE through the back-etched holes to make the top surface of the actuator hydrophilic. This allows the nozzle chamber to fill by capillarity, but maintains a hydrophobic surface underneath the actuator. This hydrophobic section causes an air bubble to be trapped under the actuator when the nozzle is filled with a water-based ink. This bubble serves two purposes: to increase the efficiency of the heater by decreasing thermal conduction away from the heated side of the PTFE, and to reduce the negative pressure on the back of the actuator.

Figure 28:
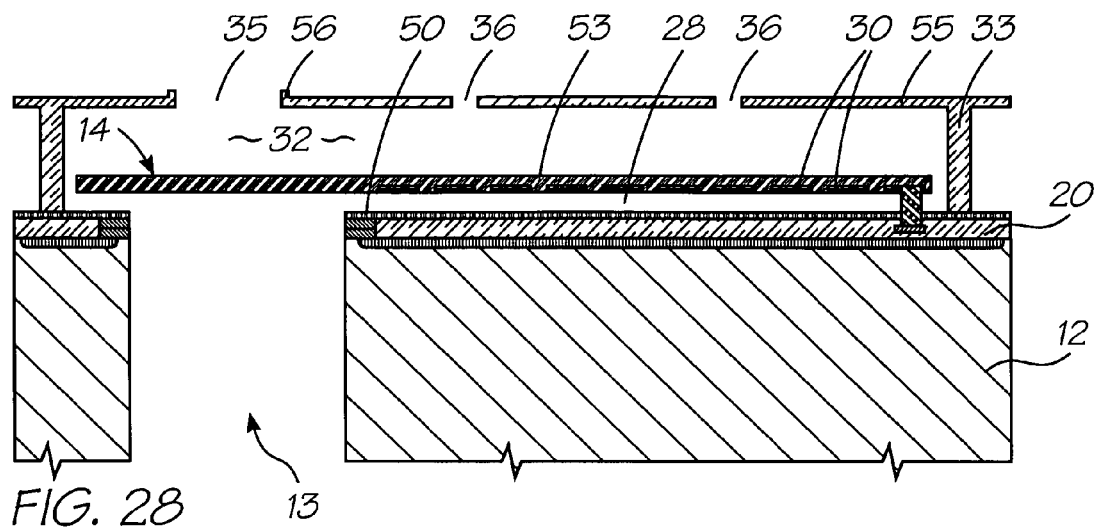
Figure 29:
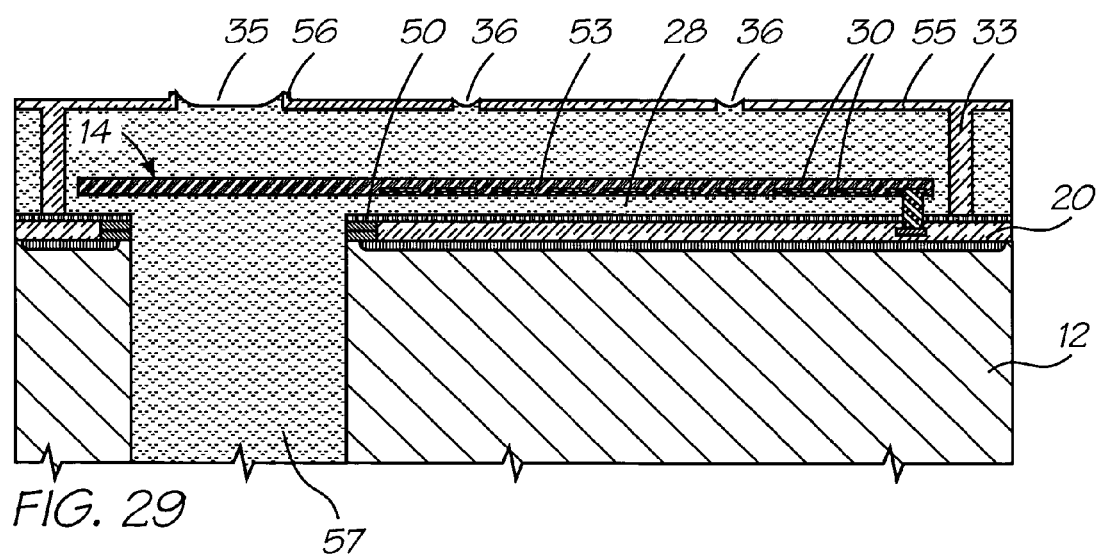

21. Etch the sacrificial material. The nozzle arrangements are cleared, the actuators freed, and the chips are separated by this etch. This step is shown in FIG. 28.
22. Mount the printheads in their packaging, which may be a molded plastic former incorporating ink channels that supply the appropriate color ink to the ink inlets at the back of the wafer.
23. Connect the printheads to their interconnect systems. For a low profile connection with minimum disruption of airflow, TAB may be used. Wire bonding may also be used if the printer is to be operated with sufficient clearance to the paper.
24. Hydrophobize the front surface of the printheads.
25. Fill the completed printheads with ink and test them. A filled nozzle is shown in FIG. 29.

In FIG. 30 of the drawings, a nozzle arrangement, in accordance with a further embodiment of the invention, is designated generally by the reference numeral 110. An ink jet printhead chip of the invention has a plurality of nozzle arrangements 110 arranged in an array 114 (FIGS. 34 and 35) on a silicon substrate 116. The array 114 will be described in greater detail below.

The arrangement 110 includes a silicon substrate or wafer 116 on which a dielectric layer 118 is deposited. A CMOS passivation layer 120 is deposited on the dielectric layer 118.

Each nozzle arrangement 110 includes a nozzle 122 defining a nozzle opening 124, a connecting member in the form of a lever arm 126 and an actuator 128. The lever arm 126 connects the actuator 128 to the nozzle 122.

As shown in greater detail in FIGS. 31 to 33 of the drawings, the nozzle 122 comprises a crown portion 130 with a skirt portion 132 depending from the crown portion 130. The skirt portion 132 forms part of a peripheral wall of a nozzle chamber 134 (FIGS. 31 to 33 of the drawings). The nozzle opening 124 is in fluid communication with the nozzle chamber 134. It is to be noted that the nozzle opening 124 is surrounded by a raised rim 136 that "pins" a meniscus 138 (FIG. 31) of a body of ink 140 in the nozzle chamber 134.

The skirt portion 132 is positioned between 6 microns and 10 microns above the CMOS passivation layer 120.

An ink inlet aperture 142 (shown most clearly in FIG. 35 of the drawing) is defined in a floor 146 of the nozzle chamber 134. The aperture 142 is in fluid communication with an ink inlet channel 148 defined through the substrate 116.

A wall portion 150 bounds the aperture 142 and extends upwardly from the floor portion 146. The skirt portion 132, as indicated above, of the nozzle 122 defines a first part of a peripheral wall of the nozzle chamber 134 and the wall portion 150 defines a second part of the peripheral wall of the nozzle chamber 134.

The wall 150 has an inwardly directed lip 152 at its free end that serves as a fluidic seal that inhibits the escape of ink when the nozzle 122 is displaced, as will be described in greater detail below. It will be appreciated that, due to the viscosity of the ink 140 and the small dimensions of the spacing between the lip 152 and the skirt portion 132, the inwardly directed lip 152 and surface tension function as a seal for inhibiting the escape of ink from the nozzle chamber 134.

The actuator 128 is a thermal bend actuator and is connected to an anchor 154 extending upwardly from the substrate 116 or, more particularly, from the CMOS passivation layer 120. The anchor 154 is mounted on conductive pads 156 which form an electrical connection with the actuator 128.

The actuator 128 comprises a first, active beam 158 arranged above a second, passive beam 160. In a preferred embodiment, both beams 158 and 160 are of, or include, a conductive ceramic material such as titanium nitride (TiN).

Both beams 158 and 160 have their first ends anchored to the anchor 154 and their opposed ends connected to the arm 126. When a current is caused to flow through the active beam 158 thermal expansion of the beam 158 results. As the passive beam 160, through which there is no current flow, does not expand at the same rate, a bending moment is created causing the arm 126 and, hence, the nozzle 122 to be displaced downwardly towards the substrate 116 as shown in FIG. 32 of the drawings. This causes an ejection of ink through the nozzle opening 124 as shown at 162 in FIG. 32 of the drawings. When the source of heat is removed from the active beam 158, i.e. by stopping current flow, the nozzle 122 returns to its quiescent position as shown in FIG. 33 of the drawings.

When the nozzle 122 returns to its quiescent position, an ink droplet 164 is formed as a result of the breaking of an ink droplet neck as illustrated at 166 in FIG. 33 of the drawings. The ink droplet 164 then travels on to the print media such as a sheet of paper. As a result of the formation of the ink droplet 164, a "negative" meniscus is formed as shown at 168 in FIG. 33 of the drawings. This "negative" meniscus 168 results in an inflow of ink 140 into the nozzle chamber 134 such that a new meniscus 138 (FIG. 31) is formed in readiness for the next ink drop ejection from the nozzle arrangement 110.

Referring now to FIGS. 34 and 35 of the drawings, the nozzle array 114 is described in greater detail. The array 114 is for a four-color printhead. Accordingly, the array 114 includes four groups 170 of nozzle arrangements, one for each color. Each group 170 has its nozzle arrangements 110 arranged in two rows 172 and 174. One of the groups 170 is shown in greater detail in FIG. 35 of the drawings.

To facilitate close packing of the nozzle arrangements 110 in the rows 172 and 174, the nozzle arrangements 110 in the row 174 are offset or staggered with respect to the nozzle arrangements 110 in the row 172. Also, the nozzle arrangements 110 in the row 172 are spaced apart sufficiently far from each other to enable the lever arms 126 of the nozzle arrangements 110 in the row 174 to pass between adjacent nozzles 122 of the arrangements 110 in the row 172. It is to be noted that each nozzle arrangement 110 is substantially dumbbell shaped so that the nozzles 122 in the row 172 nest between the nozzles 122 and the actuators 128 of adjacent nozzle arrangements 110 in the row 174.

Further, to facilitate close packing of the nozzles 122 in the rows 172 and 174, each nozzle 122 is substantially hexagonally shaped.

It will be appreciated by those skilled in the art that, when the nozzles 122 are displaced towards the substrate 116, in use, due to the nozzle opening 124 being at a slight angle with respect to the nozzle chamber 134 ink is ejected slightly off the perpendicular. It is an advantage of the arrangement shown in FIGS. 34 and 35 of the drawings that the actuators 128 of the nozzle arrangements 110 in the rows 172 and 174 extend in the same direction to one side of the rows 172 and 174. Hence, the ink droplets ejected from the nozzles 122 in the row 172 and the ink droplets ejected from the nozzles 122 in the row 174 are parallel to one another resulting in an improved print quality.

Also, as shown in FIG. 34 of the drawings, the substrate 116 has bond pads 176 arranged thereon which provide the electrical connections, via the pads 156, to the actuators 128 of the nozzle arrangements 110. These electrical connections are formed via the CMOS layer (not shown).

Referring to FIG. 36 of the drawings, a development of the invention is shown. With reference to the previous drawings, like reference numerals refer to like parts, unless otherwise specified.

In this development, a nozzle guard 180 is mounted on the substrate 116 of the array 114. The nozzle guard 180 includes a body member 182 having a plurality of passages 184 defined therethrough. The passages 184 are in register with the nozzle openings 124 of the nozzle arrangements 110 of the array 114 such that, when ink is ejected from any one of the nozzle openings 124, the ink passes through the associated passage 184 before striking the print media.

The body member 182 is mounted in spaced relationship relative to the nozzle arrangements 110 by limbs or struts 186. One of the struts 186 has air inlet openings 188 defined therein.

In use, when the array 114 is in operation, air is charged through the inlet openings 188 to be forced through the passages 184 together with ink travelling through the passages 184.

The ink is not entrained in the air as the air is charged through the passages 184 at a different velocity from that of the ink droplets 164. For example, the ink droplets 164 are ejected from the nozzles 122 at a velocity of approximately 3 m/s. The air is charged through the passages 184 at a velocity of approximately 1 m/s.

The purpose of the air is to maintain the passages 184 clear of foreign particles. A danger exists that these foreign particles, such as dust particles, could fall onto the nozzle arrangements 110 adversely affecting their operation. With the provision of the air inlet openings 88 in the nozzle guard 180 this problem is, to a large extent, obviated.

The nozzle arrangements 110 are configured to define a relatively flat topography for the printhead chip. This is emphasized by the fact that the skirt portion 132 of each nozzle arrangement is between 6 microns and 10 microns from the ink passivation layer 120. The problems associated with having deep topography are set out in the Background to the Invention above. It follows that a particular advantage of the configuration of the nozzle arrangements 110 is that these problems are addressed.

Referring now to FIGS. 37 to 39 of the drawings, a process for manufacturing the nozzle arrangements 110 is described.

Starting with the silicon substrate or wafer 116, the dielectric layer 118 is deposited on a surface of the wafer 116. The dielectric layer 118 is in the form of approximately 1.5 microns of CVD oxide. Resist is spun on to the layer 118 and the layer 118 is exposed to mask 200 and is subsequently developed.

After being developed, the layer 118 is plasma etched down to the silicon layer 116. The resist is then stripped and the layer 118 is cleaned. This step defines the ink inlet aperture 142.

In FIG. 37b of the drawings, approximately 0.8 microns of aluminum 202 is deposited on the layer 118. Resist is spun on and the aluminum 202 is exposed to mask 204 and developed. The aluminum 202 is plasma etched down to the oxide layer 118, the resist is stripped and the device is cleaned. This step provides the bond pads and interconnects to the ink jet actuator 128. This interconnect is to an NMOS drive transistor and a power plane with connections made in the CMOS layer (not shown).

Approximately 0.5 microns of PECVD nitride is deposited as the CMOS passivation layer 120. Resist is spun on and the layer 120 is exposed to mask 206 whereafter it is developed. After development, the nitride is plasma etched down to the aluminum layer 202 and the silicon layer 116 in the region of the inlet aperture 142. The resist is stripped and the device cleaned.

A layer 208 of a sacrificial material is spun on to the layer 120. The layer 208 is 6 microns of photosensitive polyimide or approximately 4 μm of high temperature resist. The layer 208 is softbaked and is then exposed to mask 210 whereafter it is developed. The layer 208 is then hardbaked at 400° C. for one hour where the layer 208 is comprised of polyimide or at greater than 300° C. where the layer 208 is high temperature resist. It is to be noted in the drawings that the pattern-dependent distortion of the polyimide layer 208 caused by shrinkage is taken into account in the design of the mask 210.

In the next step, shown in FIG. 37e of the drawings, a second sacrificial layer 212 is applied. The layer 212 is either 2 μm of photosensitive polyimide, which is spun on, or approximately 1.3 μm of high temperature resist. The layer 212 is softbaked and exposed to mask 214. After exposure to the mask 214, the layer 212 is developed. In the case of the layer 212 being polyimide, the layer 212 is hardbaked at 400° C. for approximately one hour. Where the layer 212 is resist, it is hardbaked at greater than 300° C. for approximately one hour.

A 0.2-micron multi-layer metal layer 216 is then deposited. Part of this layer 216 forms the passive beam 160 of the actuator 128.

It is to be noted that at this stage, there is between 5.3 microns and 8 microns of sacrificial material forming a deposit area for the passive beam 160 of the actuator 128.

The layer 216 is formed by sputtering 1,000 Å of titanium nitride (TiN) at around 300° C. followed by sputtering 50 Å of tantalum nitride (TaN). A further 1,000 Å of TiN is sputtered on followed by 50 Å of TaN and a further 1,000 Å of TiN.

Other materials that can be used instead of TiN are $TiB_2$, $MoSi_2$ or (Ti, Al)N.

The layer 216 is then exposed to mask 218, developed and plasma etched down to the layer 212 whereafter resist, applied for the layer 216, is wet stripped taking care not to remove the cured layers 208 or 212.

A third sacrificial layer 220 is applied by spinning on 4 μm of photosensitive polyimide or approximately 2.6 μm high temperature resist. The layer 220 is softbaked whereafter it is exposed to mask 222. The exposed layer is then developed followed by hardbaking. In the case of polyimide, the layer 220 is hardbaked at 400° C. for approximately one hour or at greater than 300° C. where the layer 220 comprises resist.

A second multi-layer metal layer 224 is applied to the layer 220. The constituents of the layer 224 are the same as the layer 216 and are applied in the same manner. It will be appreciated that both layers 216 and 224 are electrically conductive layers.

The layer 224 is exposed to mask 226 and is then developed. The layer 224 is plasma etched down to the polyimide or resist layer 220 whereafter resist applied for the layer 224 is wet stripped taking care not to remove the cured layers 208, 212 or 220. It will be noted that the remaining part of the layer 224 defines the active beam 158 of the actuator 128.

A fourth sacrificial layer 228 is applied by spinning on 4 µm of photosensitive polyimide or approximately 2.6 µm of high temperature resist. The layer 228 is softbaked, exposed to the mask 230 and is then developed to leave the island portions as shown in FIG. 9k of the drawings. The remaining portions of the layer 228 are hardbaked at 400° C. for approximately one hour in the case of polyimide or at greater than 300° C. for resist.

As shown in FIG. 37l of the drawing a high Young's modulus dielectric layer 232 is deposited. The layer 232 is constituted by approximately 1 µm of silicon nitride or aluminum oxide. The layer 232 is deposited at a temperature below the hardbaked temperature of the sacrificial layers 208, 212, 220, 228. The primary characteristics required for this dielectric layer 232 are a high elastic modulus, chemical inertness and good adhesion to TiN.

A fifth sacrificial layer 234 is applied by spinning on 2 µm of photosensitive polyimide or approximately 1.3 µm of high temperature resist. The layer 234 is softbaked, exposed to mask 236 and developed. The remaining portion of the layer 234 is then hardbaked at 400° C. for one hour in the case of the polyimide or at greater than 300° C. for the resist.

The dielectric layer 232 is plasma etched down to the sacrificial layer 228 taking care not to remove any of the sacrificial layer 234.

This step defines the nozzle opening 124, the lever arm 126 and the anchor 154 of the nozzle arrangement 110.

A high Young's modulus dielectric layer 238 is deposited. This layer 238 is formed by depositing 0.2 µm of silicon nitride or aluminum nitride at a temperature below the hardbaked temperature of the sacrificial layers 208, 212, 220 and 228.

Then, as shown in FIG. 37p of the drawings, the layer 238 is anisotropically plasma etched to a depth of 0.35 microns. This etch is intended to clear the dielectric from the entire surface except the side walls of the dielectric layer 232 and the sacrificial layer 234. This step creates the nozzle rim 136 around the nozzle opening 124, which "pins" the meniscus of ink, as described above.

An ultraviolet (UV) release tape 240 is applied. 4 µm of resist is spun on to a rear of the silicon wafer 116. The wafer 116 is exposed to mask 242 to back etch the wafer 116 to define the ink inlet channel 148. The resist is then stripped from the wafer 116.

A further UV release tape (not shown) is applied to a rear of the wafer 16 and the tape 240 is removed. The sacrificial layers 208, 212, 220, 228 and 234 are stripped in oxygen plasma to provide the final nozzle arrangement 110 as shown in FIGS. 37r and 38r of the drawings. For ease of reference, the reference numerals illustrated in these two drawings are the same as those in FIG. 30 of the drawings to indicate the relevant parts of the nozzle arrangement 110. FIGS. 40 and 41 show the operation of the nozzle arrangement 110, manufactured in accordance with the process described above with reference to FIGS. 37 and 38, and these figures correspond to FIGS. 31 to 33 of the drawings.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with inbuilt pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

We claim:

1. A method of fabricating a printhead chip for an inkjet printhead, the printhead chip including a wafer substrate that incorporates drive circuitry and defines a plurality of ink inlet channels, a plurality of nozzle arrangements positioned on the substrate, each nozzle arrangement including nozzle chamber walls that define a nozzle chamber and an ink ejection port in fluid communication with the nozzle chamber with an ink inlet channel opening into the nozzle chamber and an actuator that is positioned in the nozzle chamber, the actuator having an electrical circuit connected to the drive circuitry layer and positioned in thermal expansion material so that the expansion material experiences thermal expansion when the heating circuit receives an electrical signal from the drive circuitry layer and the actuator is displaced towards the ink ejection port to eject a drop of ink from the nozzle chamber, the method comprising the steps of:

forming a layer of sacrificial material on the substrate, such that the layer is between one and ten microns thick;

forming a first layer of the thermal expansion material on the sacrificial material;

forming the heater circuit on the first layer of thermal expansion material, the sacrificial material and the first layer of thermal expansion material being formed to permit the electrical circuit to make electrical contact with the drive circuitry;

forming a second layer of the thermal expansion material on the heater circuit wherein the expansion material is polytetrafluoroethylene (PTFE);

plasma processing the surface of the second layer of PTFE to render said surface hydrophilic; and removing the sacrificial material.

2. A method as claimed in claim 1, in which the layer of sacrificial material is formed to be between three and six microns thick.

3. A method as claimed in claim 1, in which the thermal expansion material and the heater circuit are formed so that each actuator overlies a respective ink inlet opening.

4. A method as claimed in claim 1, which includes the steps of forming a further layer of sacrificial material on the second layer of PTFE, forming the nozzle chamber walls on the second layer of sacrificial material such that the nozzle chamber walls define the nozzle chamber and the ink ejection port in fluid communication with the nozzle chamber and removing the second layer of sacrificial material.

5. A method as claimed in claim 1 which includes the step of forming the first and second layers of expansion material and the heater circuit such that the actuator is a laminated structure with the heater circuit sandwiched between the first and second layers of expansion material.

\* \* \* \* \*

UNITED STATES PATENT AND TRADEMARK OFFICE
CERTIFICATE OF CORRECTION

PATENT NO. : 7,022,250 B2
APPLICATION NO. : 10/882773
DATED : April 4, 2006
INVENTOR(S) : Kia Silverbrook It is certified that error appears in the above-identified patent and that said Letters Patent is hereby corrected as shown below:

On the title page: Foreign Application Priority Data should read:

--(30)  Foreign Application Priority Data

Jul. 15, 1997      (AU) ......................................PO7991
Mar. 25, 1998     (AU) ......................................PP2592--

Signed and Sealed this

Twenty-second Day of December, 2009

David J. Kappos
*Director of the United States Patent and Trademark Office*